United States Patent
Shimizu et al.

(10) Patent No.: US 12,174,539 B2
(45) Date of Patent: Dec. 24, 2024

(54) NEGATIVE PHOTOSENSITIVE RESIN COMPOSITION, PRODUCTION METHOD FOR POLYIMIDE, PRODUCTION METHOD FOR CURED RELIEF PATTERN, AND SEMICONDUCTOR DEVICE

(71) Applicant: ASAHI KASEI KABUSHIKI KAISHA, Tokyo (JP)

(72) Inventors: Takeki Shimizu, Tokyo (JP); Tatsuya Hirata, Tokyo (JP); Suzuka Matsumoto, Tokyo (JP)

(73) Assignee: ASAHI KASEI KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/630,387

(22) PCT Filed: Jul. 29, 2020

(86) PCT No.: PCT/JP2020/029122
§ 371 (c)(1),
(2) Date: Jan. 26, 2022

(87) PCT Pub. No.: WO2021/020463
PCT Pub. Date: Feb. 4, 2021

(65) Prior Publication Data
US 2022/0291585 A1      Sep. 15, 2022

(30) Foreign Application Priority Data

Jul. 29, 2019 (JP) .................. 2019-138776
Mar. 4, 2020 (JP) .................. 2020-036961

(51) Int. Cl.
| G03F 7/038 | (2006.01) |
| C08G 73/12 | (2006.01) |
| G03F 7/029 | (2006.01) |
| H01L 23/00 | (2006.01) |
| H01L 23/29 | (2006.01) |
| H01L 23/532 | (2006.01) |

(52) U.S. Cl.
CPC ......... *G03F 7/0387* (2013.01); *C08G 73/126* (2013.01); *G03F 7/029* (2013.01); *H01L 23/293* (2013.01); *H01L 23/5329* (2013.01); *H01L 24/19* (2013.01); *H01L 2224/19* (2013.01)

(58) Field of Classification Search
None
See application file for complete search history.

(56) References Cited

U.S. PATENT DOCUMENTS

| 6,162,580 A | 12/2000 | Matsuoka et al. |
| 7,435,525 B2 * | 10/2008 | Hattori .................. G03F 7/0233 430/326 |
| 2001/0048166 A1 | 12/2001 | Miyazaki |
| 2005/0124093 A1 | 6/2005 | Yang et al. |
| 2005/0244739 A1 * | 11/2005 | Kanatani .................. G03F 7/035 430/270.1 |
| 2018/0267405 A1 | 9/2018 | Kamemoto et al. |
| 2018/0356729 A1 | 12/2018 | Tanigaki et al. |
| 2019/0072850 A1 | 3/2019 | Yorisue et al. |
| 2019/0113845 A1 * | 4/2019 | Yorisue .................. G03F 7/0233 |
| 2019/0369496 A1 | 12/2019 | Kawabata et al. |
| 2020/0041900 A1 | 2/2020 | Saito et al. |
| 2020/0218150 A1 | 7/2020 | Arayama |

FOREIGN PATENT DOCUMENTS

| EP | 0 355 927 A2 | 2/1990 |
| JP | H06-342211 | 12/1994 |
| JP | 2001-330962 A | 11/2001 |
| JP | 2001-338947 A | 12/2001 |
| JP | 2003-345012 A | 12/2003 |
| JP | 2005-167191 A | 6/2005 |

(Continued)

OTHER PUBLICATIONS

Supplementary European Search Report issued in EP Patent Application No. 20846033.7, Oct. 26, 2022.

(Continued)

*Primary Examiner* — Sean M DeGuire
*Assistant Examiner* — Andrew Preston Traywick
(74) *Attorney, Agent, or Firm* — GREENBLUM & BERNSTEIN, P.L.C.

(57) ABSTRACT

To provide a negative photosensitive resin composition which exhibits satisfactory resolution even when shifts occur in focus depth, and which has satisfactory adhesion to a mold resin and exhibits a low dielectric constant; a method for producing a polyimide using the photosensitive resin composition; a method for producing a cured relief pattern; and a semiconductor device including the cured relief pattern.

Disclosed is a negative photosensitive resin composition including a polyimide precursor having a structure represented by general formula (A1), (B) a photopolymerization initiator, and (C) a solvent.

[Chemical Formula 1]

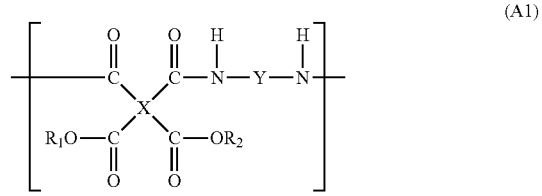

(A1)

31 Claims, No Drawings

(56) References Cited

FOREIGN PATENT DOCUMENTS

| | | |
|---|---|---|
| JP | 2010-009052 A | 1/2010 |
| JP | 2014-070139 A | 4/2014 |
| JP | 2019-109494 A | 7/2019 |
| KR | 2012-0119220 A | 10/2012 |
| KR | 10-2018-0063055 A | 6/2018 |
| TW | 2016-20990 A | 6/2016 |
| TW | 2019-28522 A | 7/2019 |
| WO | 2015-141618 A1 | 9/2015 |
| WO | 2017-033833 A1 | 3/2017 |
| WO | 2017-170600 A1 | 10/2017 |
| WO | 2018/151195 A1 | 8/2018 |
| WO | 2018-155547 A1 | 8/2018 |
| WO | 2018-179330 A1 | 10/2018 |
| WO | 2018-225676 A1 | 12/2018 |
| WO | 2019-058882 | 3/2019 |
| WO | 2020/080207 A1 | 4/2020 |
| WO | 2020/111178 A1 | 8/2020 |

OTHER PUBLICATIONS

ISR issued in International Patent Application No. PCT/JP2020/029122, Oct. 20, 2020, translation.
WO/ISA issued in International Patent Application No. PCT/JP2020/029122, Oct. 20, 2020, translation.
IPRP issued in International Patent Application No. PCT/JP2020/029122, Feb. 1, 2022, translation.

\* cited by examiner

NEGATIVE PHOTOSENSITIVE RESIN COMPOSITION, PRODUCTION METHOD FOR POLYIMIDE, PRODUCTION METHOD FOR CURED RELIEF PATTERN, AND SEMICONDUCTOR DEVICE

FIELD

The present invention relates to, for example, a negative photosensitive resin composition which is used for forming insulating materials for electronic components, and relief patterns such as passivation films, surface protective films and interlayer insulating films in semiconductor devices; a method for producing a polyimide using the same; a method for producing a cured relief pattern; and a semiconductor device.

BACKGROUND

First Background Art

Conventionally, polyimide resins having excellent heat resistance, electrical properties and mechanical properties have been used as insulating materials for electronic components, and passivation films, surface protective films, and interlayer insulating films of semiconductor devices. Of the polyimide resins, those provided in the form of a photosensitive polyimide precursor composition can be used to easily form a heat-resistant relief pattern film by thermal imidization treatment by applying, exposing, developing, and curing the composition. Such photosensitive polyimide precursor compositions are characterized in that significant process reduction can be achieved as compared with conventional non-photosensitive polyimide materials.

Semiconductor devices (hereinafter also referred to as "elements") are mounted on a printed substrate by various methods in accordance with application. Conventional elements have generally been produced by a wire bonding method in which thin wire is used to connect an external terminal (pad) of the element to a lead frame. However, in recent years, the speeds of elements have been increased, and the operating frequency has reached GHz levels, and thus the different wiring lengths of terminals in mounting affect the operation of the element. Therefore, in the mounting of elements for high-end applications, it is necessary to accurately control the length of the mounting wiring, and it becomes difficult to meet the demand by wire bonding.

Thus, there has been proposed flip-chip mounting in which a rewiring layer is formed on the surface of a semiconductor chip and bumps (electrodes) are formed thereon, and the chip is then flipped and mounted directly on a printed substrate. Since wiring distance can be accurately controlled, flip-chip mounting is used in high-end devices which handle high-speed signals or in mobile phones due to the small mounting size thereof, and demand therefor is rapidly expanding. More recently, there has been proposed a semiconductor chip mounting technology called a fan-out wafer level package (FOWLP) in which a pre-processed wafer is diced to produce individual chips and the individual chips are reconstructed on a support, sealed with a mold resin and, after peeling off the support, a rewiring layer is formed (for example, PTL 1). The fan-out wafer level package has advantages that the height of the package can be reduced and also high-speed transmission and cost reduction can be performed.

Second Background Art

Conventionally, polyimide resins, polybenzoxazole resins, phenol resins, or the like, which have excellent heat resistance, electrical properties, and mechanical properties, have been used as insulating materials for electronic components, and passivation films, surface protective films, and interlayer insulating films of semiconductor devices. Of these resins, those provided in the form of a photosensitive resin composition can be used to easily form a heat-resistant relief pattern film by thermal imidization treatment by applying, exposing, developing, and curing the composition. Such photosensitive resin compositions are characterized in that significant process reduction can be achieved as compared with conventional non-photosensitive materials.

Semiconductor devices (hereinafter also referred to as "elements") are mounted on a printed substrate by various methods in accordance with application. Conventional elements have generally been produced by a wire bonding method in which thin wire is used to connect an external terminal (pad) of the element to a lead frame. However, in recent years, the speeds of elements have been increased, and the operating frequency has reached GHz levels, and thus the different wiring lengths of terminals in mounting affect the operation of the element. Therefore, in the mounting of elements for high-end applications, it is necessary to accurately control the length of the mounting wiring, and it becomes difficult to meet the demand by wire bonding.

Thus, there has been proposed flip-chip mounting in which a rewiring layer is formed on the surface of a semiconductor chip and bumps (electrodes) are formed thereon, and the chip is then flipped and mounted directly on a printed substrate (see, for example, PTL 2). Since wiring distance can be accurately controlled, flip-chip mounting is used in high-end devices which handle high-speed signals or in mobile phones due to the small mounting size thereof, and demand therefor is rapidly expanding. When materials such as polyimide, polybenzoxazole, and phenol resins are used for flip-chip mounting, a metal wiring layer formation step is performed after forming the pattern of the resin layer. Usually, the metal wiring layer is formed by plasma-etching the surface of the resin layer to roughen the surface and a metal layer serving as a seed layer for plating is then formed by sputtering with a thickness of 1 μm or less, followed by electroplating using the metal layer as an electrode. At this time, titanium (Ti) is generally used as the metal serving as the seed layer, and copper (Cu) is used as the metal of the rewiring layer formed by electroplating.

In recent years, fan-out semiconductor packages have been attracting attention. In the fan-out semiconductor package, a chip sealing material larger than the chip size of the semiconductor chip is formed by covering the semiconductor chip with a sealing material (resin layer). Further, a rewiring layer extending to the region of the semiconductor chip and the sealing material is formed. The rewiring layer is formed with a thin film thickness. Since the rewiring layer can be formed up to the region of the sealing material, the number of external connection terminals can be increased.

It is necessary for such a metal rewiring layer to have high adhesion between the rewired metal layer and the resin layer after reliability test. Particularly in recent years, it has been required that the temperature at which the rewiring layer is heat-cured be a low temperature. Examples of the reliability test include a high temperature storage test of storage in air at a high temperature of 125° C. or higher for 100 hours or longer; a high temperature operation test to confirm an operation in air at a temperature of about 125° C. for 100 hours or longer while voltage is applied after wiring is arranged; a temperature cycle test in which a low-temperature state of about −65° C. to −40° C. and a high temperature state of about 125° C. to 150° C. is alternatingly cycled in air; a high temperature and high humidity storage test of storage at a temperature of 85° C. or higher and in a water vapor atmosphere with a humidity of 85% or higher; a high temperature and high humidity bias test in which the same test as the high temperature and high humidity storage test is performed while voltage is applied after wiring is arranged; and a solder reflow test in which the device is passed a plurality of times through a 260° C. solder reflow oven in an air or nitrogen atmosphere.

CITATION LIST

Patent Literature

[PTL 1] JP 2005-167191 A
[PTL 2] JP 2001-338947 A

SUMMARY

Technical Problem

First Problem

However, due to the diversification of the package mounting technology in recent years, types of supports have diversified and also the rewiring layer has become multilayered, so that there is a problem that shifts occur in focus depth, leading to significant deterioration of resolution, and the obtained resolution is remarkably different depending on the difference in the base material. In the case of the fan-out type package, the adhesion to a mold resin composed of an epoxy resin or the like is required. However, since a conventional negative photosensitive resin composition does not have sufficient adhesion, there was a problem that the yield decreases when the package is produced.

In recent years, there has been a demand for low dielectric constant materials, but there is still room for improvement in conventional materials.

It is an object of the present invention to provide a negative photosensitive resin composition which exhibits satisfactory resolution even when shifts occur in focus depth, and which has satisfactory adhesion to a mold resin and exhibits a low dielectric constant; a method for producing a polyimide using the photosensitive resin composition; a method for producing a cured relief pattern; and a semiconductor device comprising the cured relief pattern.

Second Problem

However, conventionally, of the above reliability tests, in the case of high temperature storage evaluation, there is a problem that voids are generated at the interface of the rewired Cu layer contacting the resin layer after evaluation. In particular, when the temperature for thermal curing is low, the generation of voids tends to be more remarkable. If voids are generated at the interface between the Cu layer and the resin layer, the adhesion between the two is reduced.

In addition to the void problem, chemical resistance is required of the rewired metal layer, and miniaturization requirements are also increasing. Thus, in particular, it is necessary that the photosensitive resin composition used for forming the rewiring layer of a semiconductor be capable of suppressing the generation of voids and exhibit high chemical resistance and resolution.

The present invention has been conceived of in light of such circumstances of the prior art, and an object thereof is to provide a negative photosensitive resin composition (hereinafter sometimes also referred to simply as "photosensitive resin composition" herein) with which high chemical resistance and resolution can be obtained, and the generation of voids can be suppressed at the interface of the Cu layer contacting the resin layer after high temperature storage test. One of the objects thereof is to provide a method for forming a cured relief pattern using the negative photosensitive resin composition of the present invention.

Solution to Problem

Solution to First Problem

The present inventors have found that by combining a specific polyimide precursor and a specific photopolymerization initiator, the above objects can be achieved, thus completing the present invention. The present invention is as follows.

[1]

A negative photosensitive resin composition including (A) a polyimide precursor having an unsaturated double bond in the side chain and (B) a photopolymerization initiator having an oxime structure, wherein
(absorption peak value near 1,380 cm$^{-1}$)/(absorption peak value near 1,500 cm$^{-1}$) of the IR spectrum when the (A) is heat-cured at 230° C. is 0.1 to 0.56, and
the amount of radicals generated when a 100 µM dimethyl sulfoxide solution of the (B) is irradiated at 100 mJ/cm$^2$ is 3.0 to 30.0 µM.

[2]

The negative photosensitive resin composition according to [1], wherein the (absorption peak value near 1,380 cm$^{-1}$)/(absorption peak value near 1,500 cm$^{-1}$) is 0.3 to 0.54.

[3]

The negative photosensitive resin composition according to [1] or [2], wherein the amount of radicals generated is 5.0 to 30.0 µM.

[4]

The negative photosensitive resin composition according to any one of [1] to [3], wherein the amount of radicals generated is 8.0 to 30.0 µM.

[5]

The negative photosensitive resin composition according to any one of [1] to [4], wherein the amount of radicals generated is 10.0 to 30.0 µM.

[6]

The negative photosensitive resin composition according to any one of [1] to [5], further comprising (C) a solvent.

[7]

The negative photosensitive resin composition according to any one of [1] to [6], wherein the polyimide precursor having an unsaturated double bond in the side chain (A) has a structure represented by the following general formula (A1):

[Chemical Formula 1]

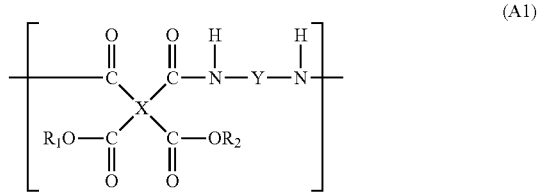

wherein X is a tetravalent organic group, Y is a divalent organic group, and $R_1$ and $R_2$ are each independently a hydrogen atom, a monovalent organic group represented by the following general formula (R1):

[Chemical Formula 2]

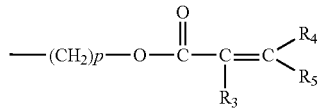

(R1)

{(where in the general formula (R1), $R_3$, $R_4$, and $R_5$ are each independently a hydrogen atom or an organic group having 1 to 3 carbon atoms, and p is an integer selected from 2 to 10), or a saturated aliphatic group having 1 to 4 carbon atoms, in which both $R_1$ and $R_2$ are not simultaneously hydrogen atoms}.

[8]

The negative photosensitive resin composition according to [7], wherein, in the general formula (A1), Y has a structure represented by the following general formula (Y1):

[Chemical Formula 3]

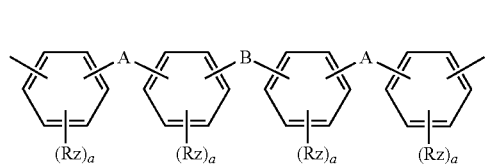

(Y1)

wherein Rz each independently represent a monovalent organic group having 1 to 10 carbon atoms which may have a halogen atom, a represents an integer of 0 to 4, A is each independently an oxygen atom or a sulfur atom, and B is at least one in the following formula:

[Chemical Formula 4]

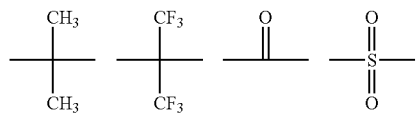

[9]

The negative photosensitive resin composition according to any one of [1] to [8], wherein the weight-average molecular weight (Mw) of the (A) is 15,000 to 38,000.

[10]

The negative photosensitive resin composition according to any one of [7] to [9], wherein, in the general formula (A1), Y is a structure represented by the following formula:

[Chemical Formula 5]

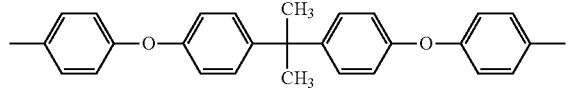

or the following formula:

[Chemical Formula 6]

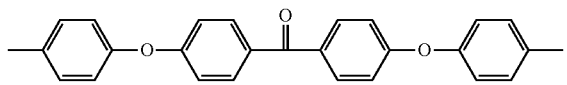

[11]

The negative photosensitive resin composition according to any one of [7] to [10], wherein X in the general formula (A1) has a structure represented by the following general formula (X1):

[Chemical Formula 7]

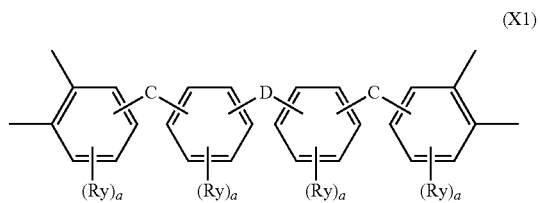

(X1)

wherein Ry each independently represent a monovalent organic group having 1 to 10 carbon atoms which may have a halogen atom, a represents an integer of 0 to 4, C is at least one selected from the group consisting of a single bond, an ester bond, an oxygen atom, and a sulfur atom, and D is a single bond, or one in the following formula:

[Chemical Formula 8]

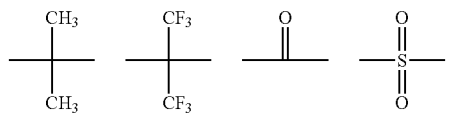

[12]

The negative photosensitive resin composition according to [11], wherein, in the general formula (X1), C is an oxygen atom or a sulfur atom, and D includes at least one in the following formula:

[Chemical Formula 9]

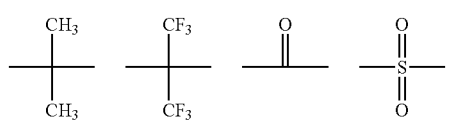

[13]

The negative photosensitive resin composition according to any one of [7] to [12], wherein X is a structure represented by the following formula:

[Chemical Formula 10]

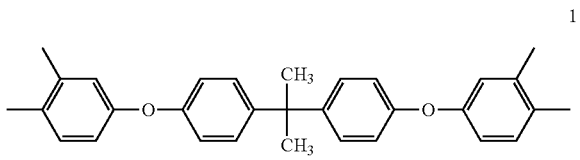

or the following formula:

[Chemical Formula 11]

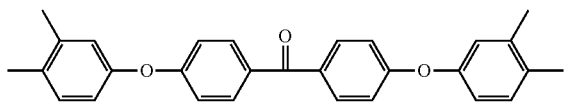

[14]

The negative photosensitive resin composition according to any one of [7] to [13], wherein p in the general formula (R1) is 3 to 10.

[15]

The negative photosensitive resin composition according to any one of [7] to [14], wherein the weight loss ratio of the cured film heat-cured at 230° C. for 2 hours when heated at 350° C. is 0.5 to 3.0%, and the proportion derived from $R_1$ and $R_2$ in the general formula (A1) in the weight loss component is 60 to 80%.

[16]

A negative photosensitive resin composition comprising (A) a polyimide precursor having a structure represented by the following general formula (A1):

[Chemical Formula 12]

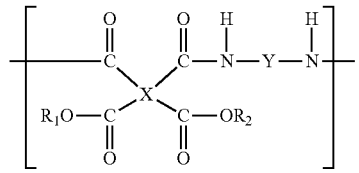 (A1)

wherein X is a tetravalent organic group, Y is a divalent organic group, and $R_1$ and $R_2$ are each independently a hydrogen atom, a monovalent organic group represented by the following general formula (R1):

[Chemical Formula 13]

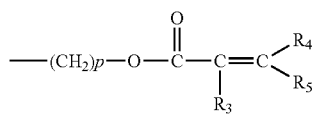 (R1)

{(where in the general formula (R1), $R_3$, $R_4$, and $R_5$ are each independently a hydrogen atom or an organic group having 1 to 3 carbon atoms, and p is an integer selected from 2 to 10), or a saturated aliphatic group having 1 to 4 carbon atoms, in which both $R_1$ and $R_2$ are not simultaneously hydrogen atoms}, and Y has a structure represented by the following general formula (Y1):

[Chemical Formula 14]

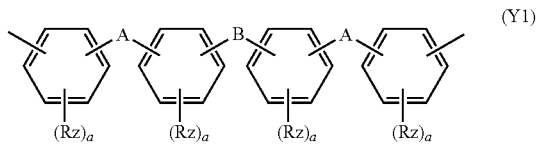 (Y1)

wherein Rz each independently represent a monovalent organic group having 1 to 10 carbon atoms which may have a halogen atom, a represents an integer of 0 to 4, A is an oxygen atom or a sulfur atom, and B is one in the following formula:

[Chemical Formula 15]

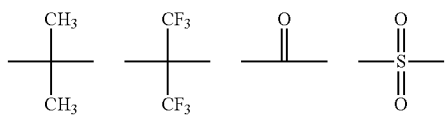

(B) a photopolymerization initiator having an oxime structure, and (C) a solvent.

[17]

The negative photosensitive resin composition according to [16], wherein the weight-average molecular weight (Mw) of the (A) is 15,000 to 38,000.

[18]

The negative photosensitive resin composition according to [16] or [17], wherein, in the general formula (A1), Y is a structure represented by the following formula:

[Chemical Formula 16]

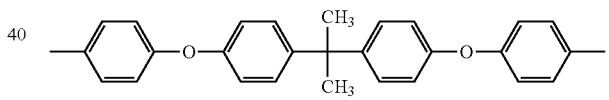

or the following formula:

[Chemical Formula 17]

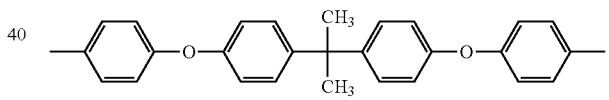

[19]

The negative photosensitive resin composition according to any one of [16] to [18], wherein (absorption peak value near 1,380 cm$^{-1}$)/(absorption peak value near 1,500 cm$^{-1}$) of the IR spectrum when the (A) is heat-cured at 230° C. is 0.1 to 0.56, and the amount of radicals generated when a 100 μM dimethyl sulfoxide solution of the (B) is irradiated at 100 mJ/cm$^2$ is 3.0 to 30.0 μM.

[20]

A negative photosensitive resin composition including a polyimide precursor having a structure represented by the following general formula (A1):

[Chemical Formula 18]

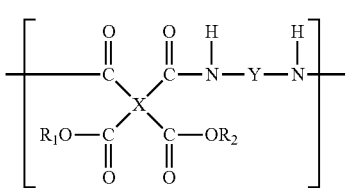
(A1)

wherein X is a tetravalent organic group, Y is a divalent organic group, and $R_1$ and $R_2$ are each independently a hydrogen atom, a monovalent organic group represented by the following general formula (R1):

[Chemical Formula 19]

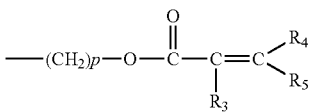
(R1)

{(where in the general formula (R1), $R_3$, $R_4$, and $R_5$ are each independently a hydrogen atom or an organic group having 1 to 3 carbon atoms, and p is an integer selected from 2 to 10), or a saturated aliphatic group having 1 to 4 carbon atoms, in which both $R_1$ and $R_2$ are not simultaneously hydrogen atoms}, and X has a structure represented by the following general formula (X1):

[Chemical Formula 20]

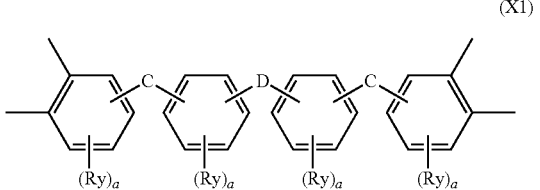
(X1)

wherein Ry each independently represent a monovalent organic group having 1 to 10 carbon atoms which may have a halogen atom, a represents an integer of 0 to 4, C is at least one selected from the group consisting of a single bond, an ester bond, an oxygen atom, and a sulfur atom, and D is a single bond, or one in the following formula:

[Chemical Formula 21]

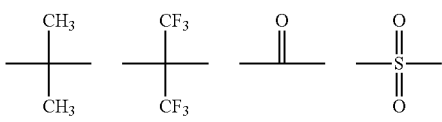

(B) a photopolymerization initiator having an oxime structure, and (C) a solvent.

[21]
The negative photosensitive resin composition according to [20], wherein, in the general formula (X1), C is an oxygen atom or a sulfur atom, and D is one in the following formula:

[Chemical Formula 22]

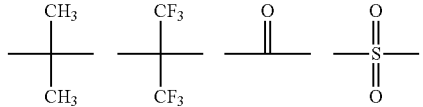

[22]
The negative photosensitive resin composition according to [20] or [21], wherein X is a structure represented by the following formula:

[Chemical Formula 23]

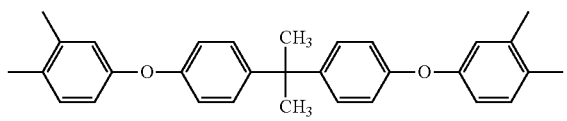

or the following formula:

[Chemical Formula 24]

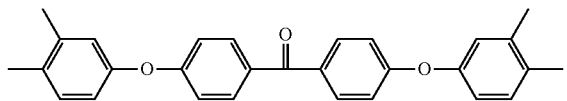

[23]
The negative photosensitive resin composition according to any one of [20] to [22], wherein (absorption peak value near 1,380 $cm^{-1}$)/(absorption peak value near 1,500 $cm^{-1}$) of the IR spectrum when the (A) is heat-cured at 230° C. is 0.1 to 0.56, and
the amount of radicals generated when a 100 μM dimethyl sulfoxide solution of the (B) is irradiated at 100 $mJ/cm^2$ is 3.0 to 30.0 μM.

[24]
The negative photosensitive resin composition according to any one of [1] to [23], wherein the photopolymerization initiator having an oxime structure (B) has a structure represented by the following general formula (B):

[Chemical Formula 25]

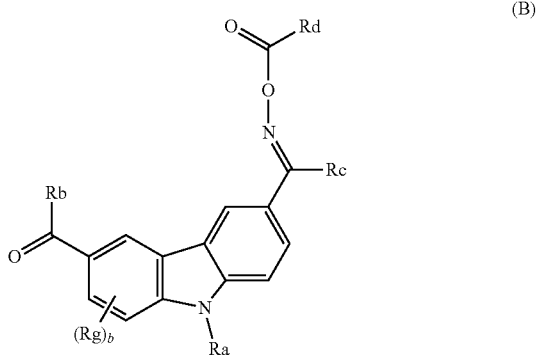
(B)

wherein Ra represents a monovalent organic group having 1 to 10 carbon atoms, Rb represents an organic group having 1 to 20 carbon atoms, Rc represents an organic group having 1 to 10 carbon atoms, Rd represents an organic group having 1 to 10 carbon atoms, b is an integer of 0 to 2, Rg represents an organic group having 1 to 4 carbon atoms, and a plurality of Rg may form a ring,
or the general formula (B1):

[Chemical Formula 26]

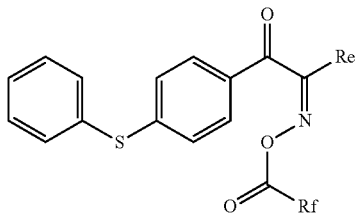

(B1)

wherein Re represents a monovalent organic group having 1 to 20 carbon atoms, and Rf represents an organic group having 1 to 10 carbon atoms.

[25]

The negative photosensitive resin composition according to any one of [6] to [24], wherein the solvent (C) is at least one selected from the group consisting of γ-butyrolactone, dimethyl sulfoxide, tetrahydrofurfuryl alcohol, ethyl acetoacetate, dimethyl succinate, dimethyl malonate, N,N-dimethylacetoacetamide, ε-caprolactone, 1,3-dimethyl-2-imidazolidinone, 3-methoxy-N,N-dimethylpropanamide, and 3-butoxy-N,N-dimethylpropanamide.

[26]

The negative photosensitive resin composition according to any one of [6] to [25], wherein the solvent (C) is at least two selected from the group consisting of γ-butyrolactone, dimethyl sulfoxide, tetrahydrofurfuryl alcohol, ethyl acetoacetate, dimethyl succinate, dimethyl malonate, N,N-dimethylacetoacetamide, ε-caprolactone, 1,3-dimethyl-2-imidazolidinone, 3-methoxy-N,N-dimethylpropanamide, and 3-butoxy-N,N-dimethylpropanamide.

[27]

The negative photosensitive resin composition according to any one of [1] to [26], further including (D) a polymerization inhibitor.

[28]

A method for producing a polyimide, which includes curing the negative photosensitive resin composition according to any one of [1] to [27].

[29]

A method for producing a cured relief pattern, which includes the following steps:

(1) an applying step of applying the negative photosensitive resin composition according to any one of [1] to [27] onto a substrate to form a photosensitive resin layer on the substrate, (2) an exposing step of exposing the photosensitive resin layer, (3) a developing step of developing the exposed photosensitive resin layer to form a relief pattern, and (4) a heating step of heat-treating the relief pattern to form a cured relief pattern.

[30]

A semiconductor device including a cured relief pattern obtained by the method according to [29].

[31]

A cured film obtained by curing a polyimide precursor having a structure represented by the following general formula (A1):

[Chemical Formula 27]

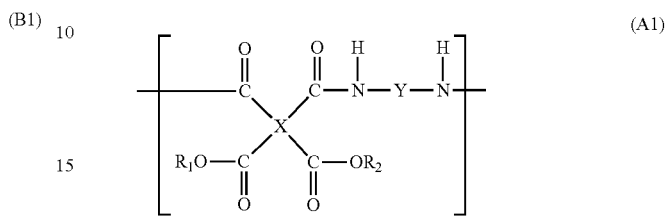

(A1)

wherein X is a tetravalent organic group, Y is a divalent organic group, and $R_1$ and $R_2$ are each independently a hydrogen atom, a monovalent organic group represented by the following general formula (R1):

[Chemical Formula 28]

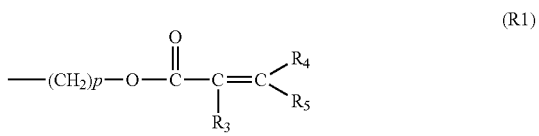

(R1)

{where in the general formula (R1), $R_3$, $R_4$, and $R_5$ are each independently a hydrogen atom or an organic group having 1 to 3 carbon atoms, and p is an integer selected from 2 to 10}, or a saturated aliphatic group having 1 to 4 carbon atoms, in which both $R_1$ and $R_2$ are not simultaneously hydrogen atoms, wherein the weight loss ratio of the cured film when heated at 350° C. is 0.5 to 3.0%, and the proportion derived from $R_1$ and $R_2$ in the general formula (A1) in the weight loss component is 60 to 80%.

[32]

A cured film obtained by curing a polyimide precursor having a structure represented by the following general formula (A1);

[Chemical Formula 29]

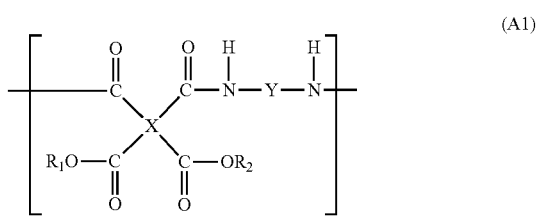

(A1)

wherein X is a tetravalent organic group, Y is a divalent organic group, and $R_1$ and $R_2$ are each independently a hydrogen atom, a monovalent organic group represented by the following general formula ($R_1$):

[Chemical Formula 30]

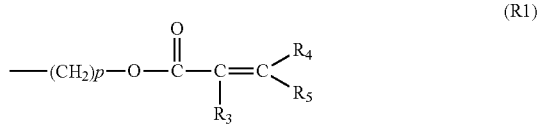

(R1)

{where in the general formula (R1), R$_3$, R$_4$, and R$_5$ are each independently a hydrogen atom or an organic group having 1 to 3 carbon atoms, and p is an integer selected from 2 to 10}, or a saturated aliphatic group having 1 to 4 carbon atoms, in which both R$_1$ and R$_2$ are not simultaneously hydrogen atoms, wherein
the imide group concentration of a polyimide in the cured film is 12.0% to 25.0%, and the weight loss ratio when the cured film is heated at 350° C. is 0.5 to 3.0%.
[33]
The cured film according to [31], wherein (absorption peak value near 1,380 cm$^{-1}$)/(absorption peak value near 1,500 cm$^{-1}$) of the IR spectrum is 0.3 to 0.54.
[34]
The cured film according to any one of [31] to [33], wherein the dielectric loss tangent at 10 GHz is 0.001 to 0.009.
[35]
A method for producing a cured film obtained by curing a polyimide precursor having a structure represented by the following general formula (A1);

[Chemical Formula 31]

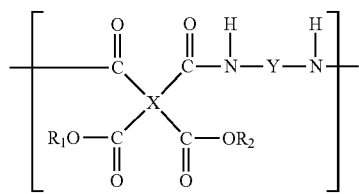

(A1)

wherein X is a tetravalent organic group, Y is a divalent organic group, and R$_1$ and R$_2$ are each independently a hydrogen atom, a monovalent organic group represented by the following general formula (R1):

[Chemical Formula 32]

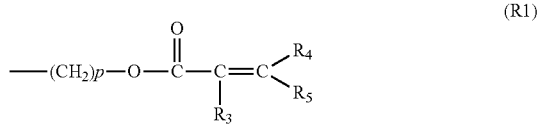

(R1)

{where in the general formula (R$_1$), R$_3$, R$_4$, and R$_5$ are each independently a hydrogen atom or an organic group having 1 to 3 carbon atoms, and p is an integer selected from 2 to 10}, or a saturated aliphatic group having 1 to 4 carbon atoms, in which both R$_1$ and R$_2$ are not simultaneously hydrogen atoms, wherein
the imide group concentration of a polyimide in the cured film is 12.0% to 25.0%, and the weight loss ratio when the cured film is heated at 350° C. is 0.5 to 3.0%, the method including:

at least a coating film step of forming a composition containing a photosensitive polyimide precursor into a film, and
a curing step of polyimidizing the film containing the polyimide precursor,
the curing step including a heating step at 150 to 250° C.

Solution to Second Problem

The present inventors have found that by combining a specific polyimide precursor, a silane coupling agent having a specific structure, and a specific organic solvent, the above problems can be solved, thus completing the present invention. The present invention is as follows.
[1]
A negative photosensitive resin composition including the following components:
(A) a polyimide precursor;
(B) a photopolymerization initiator;
(C) a silane coupling agent represented by the following general formula (1):

[Chemical Formula 33]

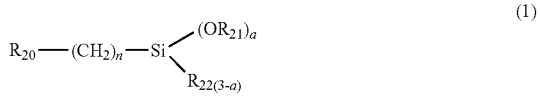

(1)

wherein a is an integer of 1 to 3, n is an integer of 1 to 6, R$_{21}$ is each independently an alkyl group having 1 to 4 carbon atoms, R$_{22}$ is a hydroxyl group or an alkyl group having 1 to 4 carbon atoms, and R$_{20}$ is at least one selected from the group consisting of substituents including an epoxy group, a phenylamino group, a ureide group and an isocyanate group; and
(D) an organic solvent including at least one selected from the group consisting of γ-butyrolactone, dimethyl sulfoxide, tetrahydrofurfuryl alcohol, ethyl acetoacetate, dimethyl succinate, dimethyl malonate, and ε-caprolactone.
[2]
The negative photosensitive resin composition according to [1], wherein, in the general formula (1), R$_{20}$ is at least one selected from the group consisting of substituents including a phenylamino group and a ureide group.
[3]
The negative photosensitive resin composition according to [1] or [2], wherein, in the general formula (1), R$_{20}$ is a substituent including a phenylamino group.
[4]
The negative photosensitive resin composition according to any one of [1] to [3], further including (E) a thermal base generator.
[5]
The negative photosensitive resin composition according to any one of [1] to [4], wherein the organic solvent (D) includes at least two selected from the group consisting of γ-butyrolactone, dimethyl sulfoxide, tetrahydrofurfuryl alcohol, ethyl acetoacetate, dimethyl succinate, dimethyl malonate, and ε-caprolactone.
[6]
The negative photosensitive resin composition according to any one of [1] to [5], wherein the polyimide precursor (A) includes a structural unit represented by the following general formula (2):

[Chemical Formula 34]

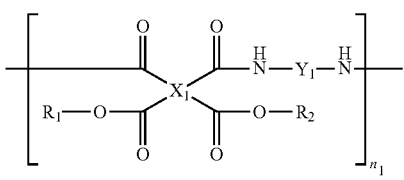
(2)

wherein $X_1$ is a tetravalent organic group, $Y_1$ is a divalent organic group, $n_1$ is an integer of 2 to 150, and $R_1$ and $R_2$ are each independently a hydrogen atom or a monovalent organic group, and at least one of $R_1$ and $R_2$ is a monovalent organic group.

[7]

The negative photosensitive resin composition according to [6], wherein, in the general formula (2), at least one of $R_1$ and $R_2$ is a monovalent organic group represented by the following general formula (3):

[Chemical Formula 35]

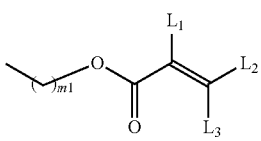
(3)

wherein $L_1$, $L_2$, and $L_3$ are each independently a hydrogen atom or an organic group having 1 to 3 carbon atoms, and $m_1$ is an integer of 2 to 10.

[8]

The negative photosensitive resin composition according to [6] or [7], wherein, in the general formula (2), $X_1$ has a structure represented by the following general formula (20a):

[Chemical Formula 36]

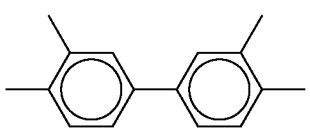
(20a)

[9]

The negative photosensitive resin composition according to [6] or [7], wherein, in the general formula (2), $X_1$ has a structure represented by the following general formula (20b):

[Chemical Formula 37]

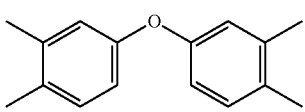
(20b)

[10]

The negative photosensitive resin composition according to [6] or [7], wherein, in the general formula (2), $X_1$ has a structure represented by the following general formula (20c):

[Chemical Formula 38]

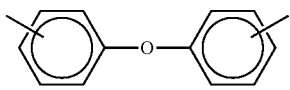
(20c)

[11]

The negative photosensitive resin composition according to any one of [6] to [10], wherein, in the general formula (2), $Y_1$ has a structure represented by the following general formula (21b):

[Chemical Formula 39]

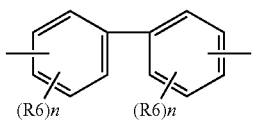
(21b)

[12]

The negative photosensitive resin composition according to any one of [6] to [10], wherein, in the general formula (2), $Y_1$ has a structure represented by the following general formula (21c):

[Chemical Formula 40]

(21c)

wherein $R_6$ is a monovalent group selected from the group consisting of a hydrogen atom, a fluorine atom, a hydrocarbon group having 1 to 10 carbon atoms and a fluorine-containing hydrocarbon group having 1 to 10 carbon atoms, and n is an integer selected from 0 to 4.

[13]

The negative photosensitive resin composition according to [6] or [7], wherein the polyimide precursor (A) includes a structural unit represented by the following general formula (4):

[Chemical Formula 41]

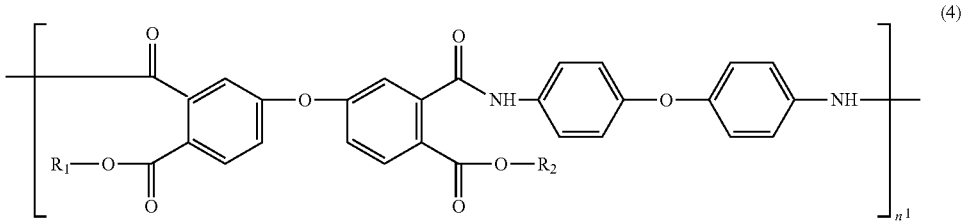

wherein $R_1$ and $R_2$ are each independently a hydrogen atom or a monovalent organic group, at least one of $R_1$ and $R_2$ is a monovalent organic group, and $n_1$ is an integer of 2 to 150.

[14] The negative photosensitive resin composition according to [6] or [7], wherein the polyimide precursor (A) includes a structural unit represented by the following general formula (5):

[Chemical Formula 42]

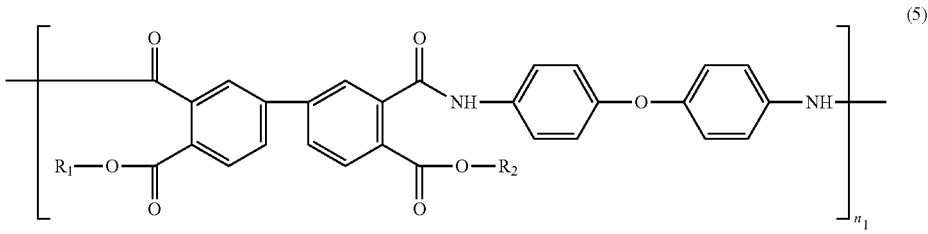

wherein $R_1$ and $R_2$ are each independently a hydrogen atom or a monovalent organic group, at least one of $R_1$ and $R_2$ is a monovalent organic group, and $n_1$ is an integer of 2 to 150.

[15] The negative photosensitive resin composition according to [6] or [7], wherein the polyimide precursor (A) simultaneously includes a structural unit represented by the following general formula (4):

[Chemical Formula 43]

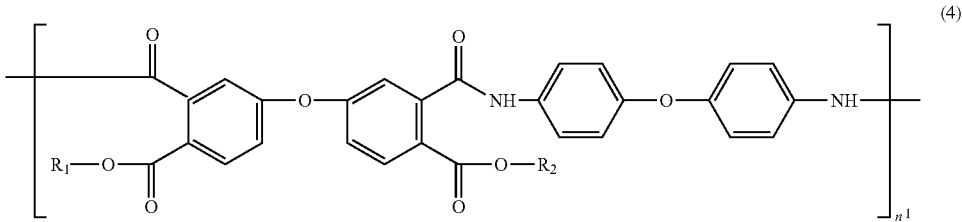

wherein $R_1$ and $R_2$ are each independently a hydrogen atom or monovalent organic group, at least one of $R_1$ and $R_2$ is a monovalent organic group, and $n_1$ is an integer of 2 to 150, and a structural unit represented by the following general formula (5):

[Chemical Formula 44]

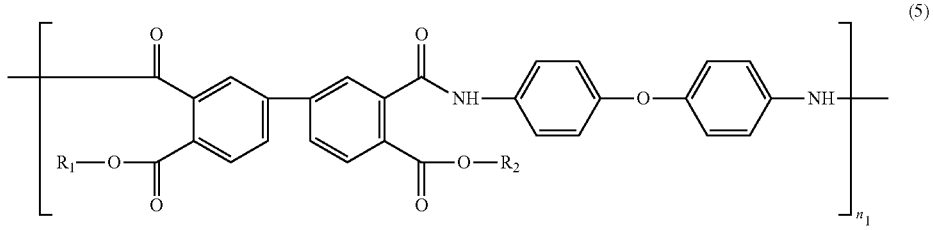

wherein $R_1$ and $R_2$ are each independently a hydrogen atom or a monovalent organic group, at least one of $R_1$ and $R_2$ is a monovalent organic group, and $n_1$ is an integer of 2 to 150, and these may be the same as or different from $R_1$, $R_2$, and $n_1$ in the general formula (4).

[16]

The negative photosensitive resin composition according to [15], wherein the polyimide precursor (A) is a copolymer of structural units represented by the general formulas (4) and (5).

[17]

The negative photosensitive resin composition according to [6] or [7], wherein the polyimide precursor (A) includes a structural unit represented by the following general formula (6):

[Chemical Formula 45]

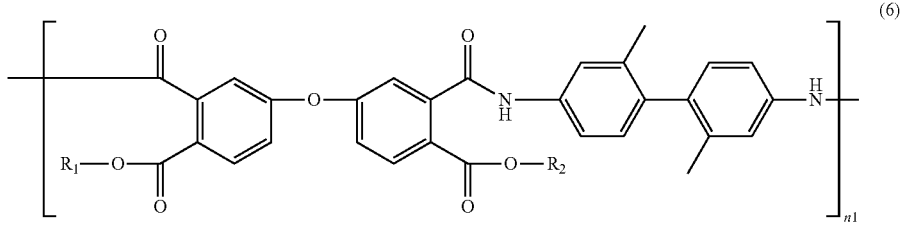

wherein $R_1$ and $R_2$ are each independently a hydrogen atom or a monovalent organic group, at least one of $R_1$ and $R_2$ is a monovalent organic group, and $n_1$ is an integer of 2 to 150.

[18]

The negative photosensitive resin composition according to any one of [1] to [17], comprising:
100 parts by mass of the polyimide precursor (A),
0.1 to 20 parts by mass of the photopolymerization initiator (B) based on 100 parts by mass of the polyimide precursor (A), and
0.1 to 20 parts by mass of the silane coupling agent © based on 100 parts by mass of the polyimide precursor (A).

[19]

A method for producing a polyimide, which includes a step of converting the negative photosensitive resin composition according to any one of [1] to [18] into a polyimide.

[20]

A method for producing a cured relief pattern, which includes the following steps:
(1) a step of applying the negative photosensitive resin composition according to any one of [1] to [18] onto a substrate to form a photosensitive resin layer on the substrate;
(2) a step of exposing the photosensitive resin layer;
(3) a step of developing the exposed photosensitive resin layer to form a relief pattern, and
(4) a step of heat-treating the relief pattern to form a cured relief pattern.

Advantageous Effects of Invention

First Advantageous Effects of Invention

According to the present invention, it is possible to provide a negative photosensitive resin composition which exhibits satisfactory resolution even when shifts occur in focus depth, and which has satisfactory adhesion to a mold resin and exhibits a low dielectric constant; a method for producing a polyimide using the photosensitive resin composition; a method for producing a cured relief pattern; and a semiconductor device comprising the cured relief pattern.

Second Advantageous Effects of Invention

According to the present invention, it is possible to provide a negative photosensitive resin composition with which high chemical resistance and resolution can be obtained, and the generation of voids can be suppressed at the interface of the Cu layer contacting the resin layer after high temperature storage test; a method for producing a polyimide; and a method for forming a cured relief pattern using the negative photosensitive resin composition.

DESCRIPTION OF EMBODIMENTS

Mode for Carrying Out First Invention

The present embodiment will be specifically described below. Throughout the present description, when a plurality of structures represented by the same reference numerals in the general formula are present in the molecule, they may be the same or different from each other.

<Photosensitive Resin Composition>

The photosensitive resin composition according to the present embodiment includes (A) a polyimide precursor having a specific structure, (B) a photopolymerization initiator having a specific structure, and (C) a solvent.

It is preferable that the photosensitive resin composition of the present invention further includes, in addition to the above components, (D) a polymerization inhibitor.

According to such a photosensitive resin composition, it is possible to obtain a cured relief pattern which has satisfactory focus margin and resolution and satisfactory adhesion to a mold resin, and exhibits a low dielectric constant.

[(A) Polyimide Precursor]

The polyimide precursor (A) according to the present embodiment will be described.

The polyimide precursor (A) according to the present embodiment is not limited as long as it has an unsaturated double bond in the side chain, and (absorption peak value near 1,380 cm$^{-1}$)/(absorption peak value near 1,500 cm$^{-1}$) is 0.1 to 0.56 in the IR spectrum of the cured film heat-cured at 230° C. By forming such a polyimide precursor, it is possible to obtain a negative photosensitive resin composition which has satisfactory resolution and excellent adhesion to a mold resin, and exhibit a low dielectric constant.

The IR spectrum was measured under the measurement conditions using the method in the Examples mentioned later, and the peak value is set at the peak value having the largest peak value within a range of ±10 cm$^{-1}$ of each wave number.

Of these, from the viewpoint of exhibiting a low dielectric constant, 0.54 or less is more preferable, and 0.50 or less is particularly preferable. From the viewpoint of developability, 0.2 or more is preferable, and 0.3 or more is more preferable.

The polyimide precursor (A) according to the present embodiment preferably has a structure represented by the following general formula (A1):

[Chemical Formula 46]

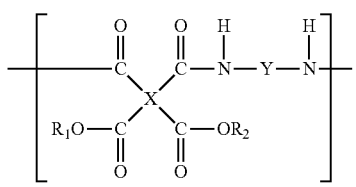

(A1)

wherein X is a tetravalent organic group, Y is a divalent organic group, $R_1$ and $R_2$ are each independently a hydrogen atom, a monovalent organic group represented by the following general formula (R1):

[Chemical Formula 47]

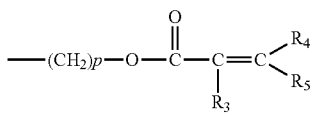

(R1)

{(where in the general formula (R1), $R_3$, $R_4$, and $R_5$ are each independently a hydrogen atom or an organic group having 1 to 3 carbon atoms, and p is an integer selected from 2 to 10), or a saturated aliphatic group having 1 to 4 carbon atoms, in which both $R_1$ and $R_2$ are not simultaneously hydrogen atoms}.

Y is not limited as long as it is a divalent organic group, and is preferably an organic group having 6 to 60 carbon atoms, more preferably containing an aromatic ring having 18 to 60 carbon atoms, and still more preferably having a structure represented by the following general formula (Y1):

[Chemical Formula 48]

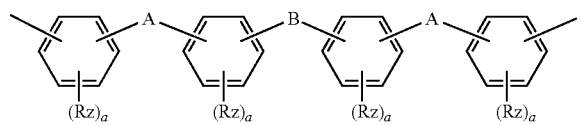

(Y1)

wherein Rz each independently represent a monovalent organic group having 1 to 10 carbon atoms which may have a halogen atom, a represents an integer of 0 to 4, A is each independently an oxygen atom or a sulfur atom, and B is one in the following formula:

[Chemical Formula 49]

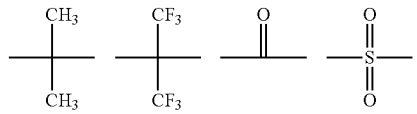

or a structure represented by the following general formula (Y2):

[Chemical Formula 50]

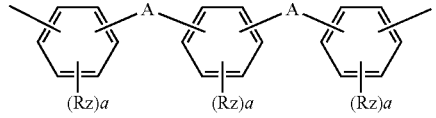

(Y2)

wherein Rz each independently represent a monovalent organic group having 1 to 10 carbon atoms which may have a halogen atom, a represents an integer of 0 to 4, and A is each independently an oxygen atom or a sulfur atom.

From the viewpoint of exhibiting a low dielectric constant, Y is preferably a structure represented by the general formula (Y1), and from the viewpoints of focus margin and adhesion to a mold resin, Y is preferably any one of the following structures.

[Chemical Formula 51]

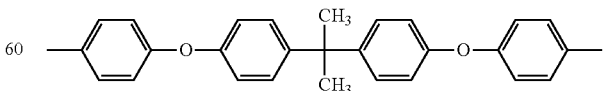

[Chemical Formula 52]

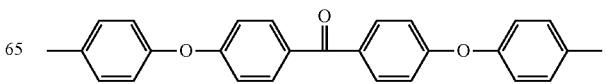

[Chemical Formula 53]

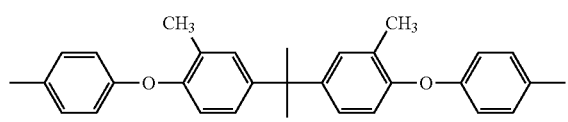

Examples of the structure represented by the general formula (Y2) include the following structures.

[Chemical Formula 54]

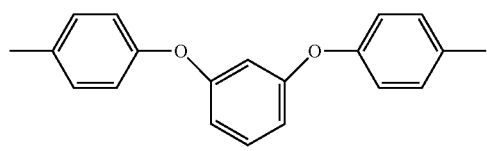

[Chemical Formula 55]

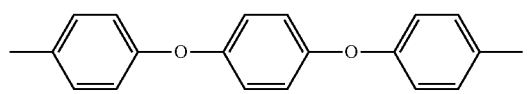

[Chemical Formula 56]

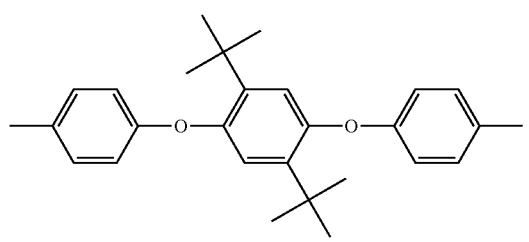

[Chemical Formula 57]

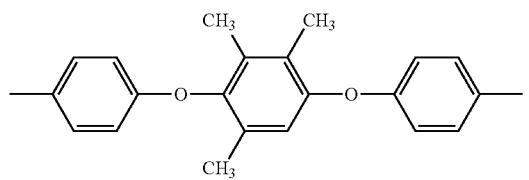

It is also possible to include, in the above general formula (Y1), the following structures:

[Chemical Formula 58]

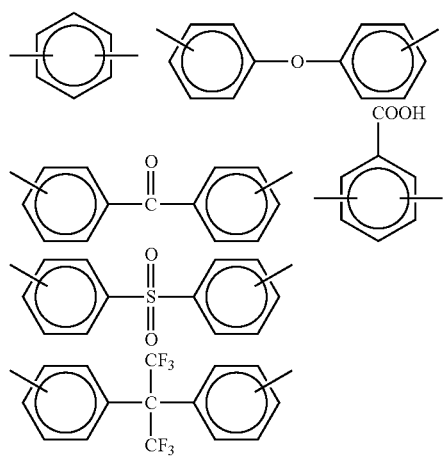

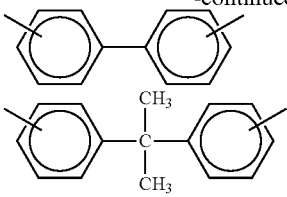
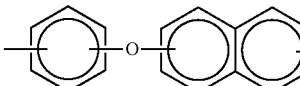
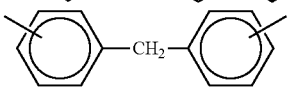
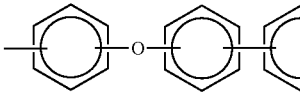
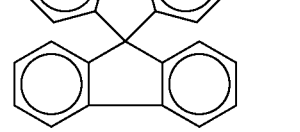

[Chemical Formula 59]

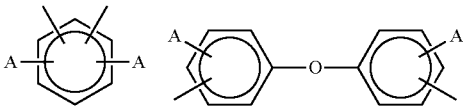
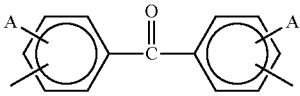
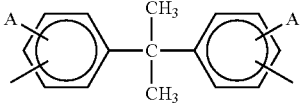
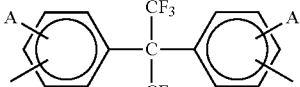
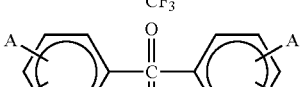
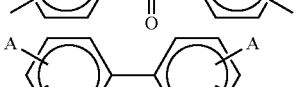
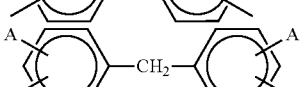
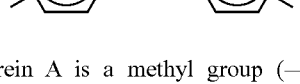

wherein A is a methyl group ($-CH_3$), an ethyl group ($-C_2H_5$), a propyl group ($-C_3H_7$) or a butyl group ($-C_4H_9$).

$R_3$ in the general formula (R1) is preferably a hydrogen atom or a methyl group, and $R_4$ and $R_5$ are each preferably a hydrogen atom from the viewpoint of photosensitivity. From the viewpoint of photosensitivity, p is preferably an integer of 2 or more and 10 or less, and more preferably an integer of 2 or more and 4 or less.

In the general formula (A1), the tetravalent organic group represented by X is preferably an organic group having 6 to 40 carbon atoms, and more preferably, one of a —COOR₁ group and a —CONH— group is a tetravalent aromatic group or an alicyclic aliphatic group which is bonded to the same aromatic ring, both groups being in the ortho-position with each other. In the former case, the aromatic ring to which a —COOR₁ group is bonded and the aromatic ring to which a —COOR₂ group is bonded may be the same aromatic ring or different aromatic rings. The aromatic ring in this context is preferably a benzene ring.

More preferably, examples of the tetravalent organic group represented by X include, but are not limited to, structures represented by the following formulas:

[Chemical Formula 60]

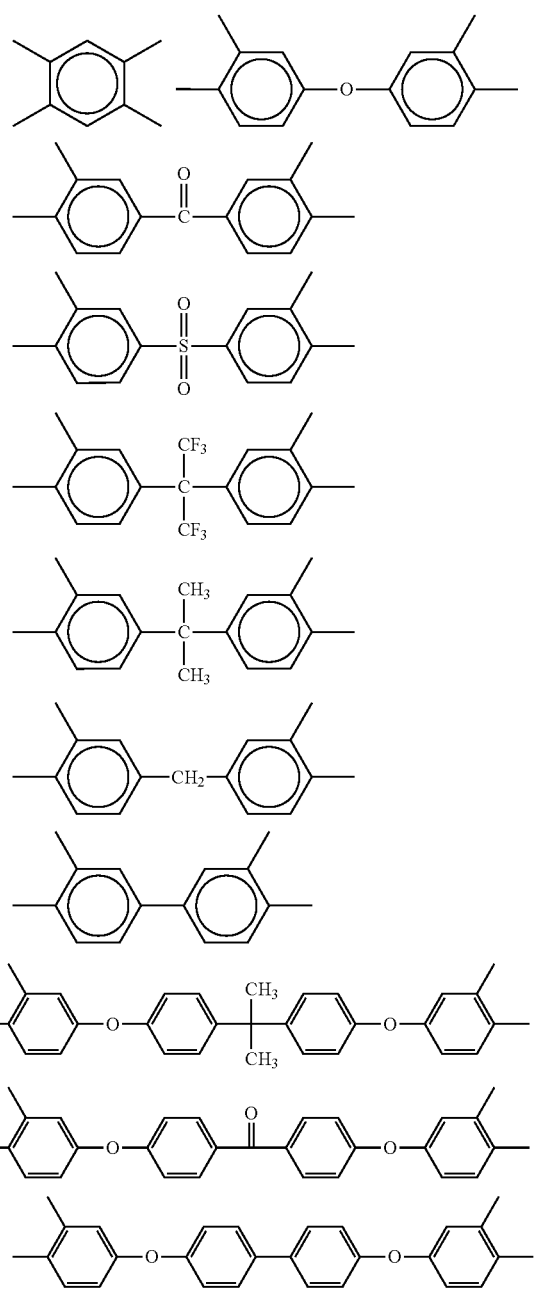

[Chemical Formula 61]

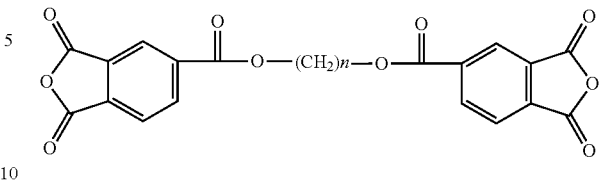

wherein n represents an integer of 5 or more and 20 or less. The structure of X may be one or a combination of two or more thereof.

Particularly, in the photosensitive resin composition of the present invention, in the general formula (A1), it is particularly preferable to include, as the tetravalent organic group represented by X, the following structure:

[Chemical Formula 62]

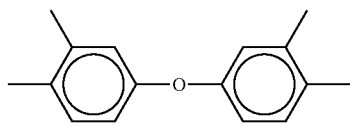

or the following structure.

[Chemical Formula 63]

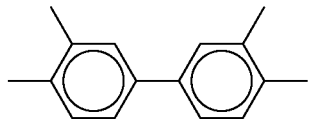

When the polyimide precursor (A) has such a structure, the heat resistance and photosensitivity of the negative photosensitive resin composition are improved, thus making it possible to improve the focus margin and chemical resistance in the obtained cured relief pattern.

Regarding the polyimide precursor (A), in the general formula (Y1), X is more preferably the following general formula (X1):

[Chemical Formula 64]

(X1)

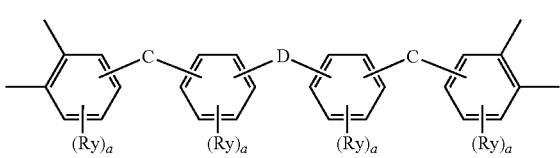

wherein Ry each independently represent a monovalent organic group having 1 to 10 carbon atoms which may have a halogen atom, a represents an integer of 0 to 4, C is at least one selected from the group consisting of a single bond, an ester bond, an oxygen atom, and a sulfur atom, and D is a single bond, or one in the following formulas:

[Chemical Formula 65]

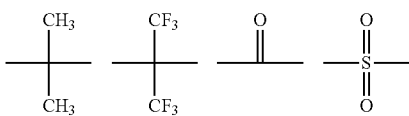

Particularly, in the general formula (X1), it is still more preferable that C is an oxygen atom or a sulfur atom, and D is one in the following formulas:

[Chemical Formula 66]

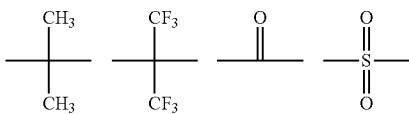

In the negative photosensitive resin composition of the present invention, in the general formula (A1), it is most preferable that X has the following structure:

[Chemical Formula 67]

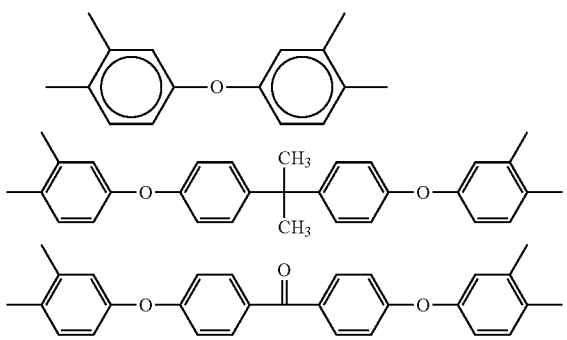

and
Y has the following structure:

[Chemical Formula 68]

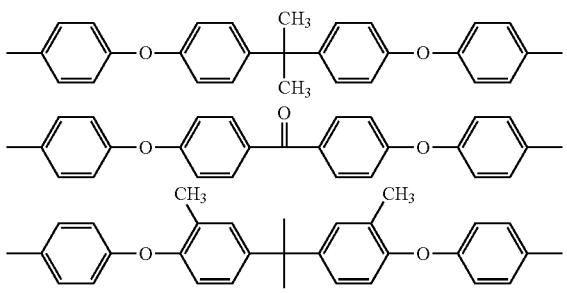

When the polyimide precursor (A) has such a structure, the heat resistance and photosensitivity of the negative photosensitive resin composition are further improved, and thus the focus margin is improved, leading to a low dielectric constant in the obtained cured relief pattern.

Particularly, in the present invention, in the polyimide precursor (A), when Y, which is a skeleton component derived from diamine, has a structure represented by the general formula (Y1) as mentioned above, i.e., a structure in which four phenyl rings are bonded, it is possible to realize a low dielectric loss tangent (Df) of the obtained cured relief pattern.

In the cured relief pattern thus obtained, the dielectric loss tangent (Df) is preferably less than 0.009, more preferably less than 0.0085, and still more preferably less than 0.008 at 10 GHz.

[Method for Preparing Polyimide Precursor (A)]

The ester bond-type polyimide precursor (A) is obtained by first reacting a tetracarboxylic dianhydride having a desired tetravalent organic group X with alcohols having a photopolymerizable group (e.g., unsaturated double bond) to prepare a partially esterified tetracarboxylic acid (hereinafter also referred to as acid/ester body), and then subjecting this acid/ester body to amide polycondensation with diamines having a divalent organic group Y. Saturated aliphatic alcohols may be optionally used in combination with the alcohols having a photopolymerizable group.

(Preparation of Acid/Ester Body)

In the present invention, examples of the tetracarboxylic dianhydride having a tetravalent organic group X which is preferably used for preparing the ester bond-type polyimide precursor include, but are not limited to, pyromellitic anhydride, diphenyl ether-3,3',4,4'-tetracarboxylic dianhydride, benzophenone-3,3',4,4'-tetracarboxylic dianhydride, biphenyl-3,3',4,4'-tetracarboxylic dianhydride, diphenylsulfone-3,3',4,4'-tetracarboxylic dianhydride, diphenylmethane-3,3',4,4'-tetracarboxylic dianhydride, 2,2-bis(3,4-phthalic anhydride)propane, 2,2-bis(3,4-phthalic anhydride)-1,1,1,3,3,3-hexafluoropropane, 4,4'-(4,4'-isopropylidenediphenoxy)diphthalic anhydride, and 4,4'-bis(3,4-dicarboxyphenoxy)benzophenone diacid anhydride. These may be used alone, or a mixture of two or more thereof may be used.

In the present invention, examples of the alcohols having a photopolymerizable group, which are preferably used for preparing the ester bond-type polyimide precursor, include 2-acryloyloxyethyl alcohol, 1-acryloyloxy-3-propyl alcohol, 2-acrylamideethyl alcohol, methylol vinyl ketone, 2-hydroxyethyl vinyl ketone, 2-hydroxy-3-methoxypropyl acrylate, 2-hydroxy-3-butoxypropyl acrylate, 2-hydroxy-3-phenoxypropyl acrylate, 2-hydroxy-3-butoxypropyl acrylate, 2-hydroxy-3-t-butoxypropyl acrylate, 2-hydroxy-3-cyclohexyloxypropyl acrylate, 2-methacryloyloxyethyl alcohol, 1-methacryloyloxy-3-propyl alcohol, 2-methacrylamide ethyl alcohol, 2-hydroxy-3-methoxypropyl methacrylate, 2-hydroxy-3-butoxypropyl methacrylate, 2-hydroxy-3-phenoxypropyl methacrylate, 2-hydroxy-3-butoxypropyl methacrylate, 2-hydroxy-3-t-butoxypropyl methacrylate, and 2-hydroxy-3-cyclohexyloxypropyl methacrylate.

The saturated aliphatic alcohols, which can be optionally used together with the alcohols having a photopolymerizable group, are preferably saturated aliphatic alcohols having 1 to 4 carbon atoms. Specific examples thereof include methanol, ethanol, n-propanol, isopropanol, n-butanol, and tert-butanol.

By stirring and mixing the above-mentioned tetracarboxylic dianhydride and alcohols, which are preferable for the present invention, preferably in an appropriate solvent at a temperature of 20 to 50° C. for 4 to 10 hours in the presence of preferably a basic catalyst such as pyridine, an esterification reaction of the acid anhydride proceeds, thus making it possible to obtain a desired acid/ester body.

The reaction solvent is preferably one which completely dissolves tetracarboxylic dianhydride and alcohols as raw materials, and the acid/ester body as a product. The reaction solvent is more preferably a solvent which also completely dissolves a polyimide precursor which is an amide polycondensation product of the acid/ester body and diamine. Examples thereof include N-methyl-2-pyrrolidone, N,N-dimethylacetamide, N,N-dimethylformamide, dimethyl sulfoxide, tetramethylurea, ketones, esters, lactones, ethers, halogenated hydrocarbons, and hydrocarbons. Specific examples thereof include ketones such as acetone, methyl ethyl ketone, methyl isobutyl ketone, and cyclohexanone; esters such as methyl acetate, ethyl acetate, butyl acetate, and diethyl oxalate;

lactones such as γ-butyrolactone;

ethers such as ethylene glycol dimethyl ether, diethylene glycol dimethyl ether, and tetrahydrofuran;

halogenated hydrocarbons such as dichloromethane, 1,2-dichloroethane, 1,4-dichlorobutane, chlorobenzene, and o-dichlorobenzene; and hydrocarbons such as hexane, heptane, benzene, toluene, and xylene. These may be used alone or in combination of two or more thereof, if necessary.

(Preparation of Polyimide Precursor)

An appropriate dehydration-condensation agent is mixed in the acid/ester body (typically in a solution state of being dissolved in the above reaction solvent) preferably under ice cooling, thereby converting the acid/ester body into a polyacid anhydride. To this, those obtained by separately dissolving or dispersing diamines having a divalent organic group Y to be preferably used in the present invention in a solvent are added dropwise, and then amide polycondensation of the mixture is performed, thus making it possible to obtain a target polyimide precursor. Diaminosiloxanes may be used in combination with the diamines having a divalent organic group Y.

Examples of the dehydration-condensation agent include dicyclohexylcarbodiimide, 1-ethoxycarbonyl-2-ethoxy-1,2-dihydroquinoline, 1,1-carbonyldioxy-di-1,2,3-benzotriazole, and N,N'-disuccinimidyl carbonate.

In this manner, a polyacid anhydride is obtained as an intermediate.

In the present invention, examples of diamines having a divalent organic group Y, which are preferably used for a reaction with the polyacid anhydride obtained as mentioned above, include 2,2-bis{4-(4-aminophenoxy)phenyl}propane, 2,2-bis{4-(4-aminophenoxy)phenyl}hexafluoropropane, bis{4-(4-aminophenoxy)phenyl}sulfone, bis{4-(3-aminophenoxy)phenyl}sulfone, bis{4-(4-aminophenoxy)phenyl}ketone, and 2,2-bis[4-{4-amino-2-(trifluoromethyl)phenoxy}phenyl]hexafluoropropane.

In addition to the above, the following diamines can be used as long as they do not adversely affect, and examples thereof include:

p-phenylenediamine, m-phenylenediamine, 4,4-diaminodiphenyl ether, 3,4'-diaminodiphenyl ether, 3,3'-diaminodiphenyl ether, 4,4'-diaminodiphenyl sulfide, 3,4'-diaminodiphenyl sulfide, 3,3'-diaminodiphenyl sulfide, 4,4'-diaminodiphenylsulfone, 3,4'-diaminodiphenylsulfone, 3,3'-diaminodiphenylsulfone, 4,4'-diaminobiphenyl, 3,4'-diaminobiphenyl, 3,3'-diaminobiphenyl, 4,4'-diaminobenzophenone, 3,4'-diaminobenzophenone, 3,3'-diaminobenzophenone, 4,4'-diaminodiphenylmethane, 3,4'-diaminodiphenylmethane, 3,3'-diaminodiphenylmethane, 1,4-bis(4-aminophenoxy)benzene, 1,3-bis(4-aminophenoxy)benzene, 1,3-bis(3-aminophenoxy)benzene, bis[4-(4-aminophenoxy)phenyl]sulfone, bis[4-(3-aminophenoxy)phenyl]sulfone, 4,4-bis(4-aminophenoxy)biphenyl, 4,4-bis(3-aminophenoxy)biphenyl, bis[4-(4-aminophenoxy)phenyl]ether, bis[4-(3-aminophenoxy)phenyl]ether, 1,4-bis(4-aminophenyl)benzene, 1,3-bis(4-aminophenyl)benzene, 9,10-bis(4-aminophenyl)anthracene, 2,2-bis(4-aminophenyl)propane, 1,4-bis(3-aminopropyldimethylsilyl)benzene, ortho-tolidine sulfone, and 9,9-bis(4-aminophenyl)fluorene; and those in which hydrogen atoms on the benzene ring are partially substituted with a methyl group, an ethyl group, a hydroxymethyl group, a hydroxyethyl group, a halogen atom or the like;

and mixtures thereof.

Diaminosiloxanes are used in combination with the diamines having a divalent organic group Y in the preparation of the photosensitive polyimide precursor (A) for the purpose of improving the adhesion between a coating film formed from the photosensitive resin composition of the present invention and various substrates. Specific examples of such diaminosiloxanes include 1,3-bis(3-aminopropyl)tetramethyldisiloxane and 1,3-bis(3-aminopropyl)tetraphenyldisiloxane.

After completion of the amide polycondensation reaction, water absorption by-products of the dehydration-condensation agent coexisting in the reaction solution are optionally removed by filtration, and then a poor solvent, for example, water, an aliphatic lower alcohol or a mixed solution thereof is charged into a solution containing a polymer component, thereby precipitating the polymer component and, after purifying the polymer by optionally repeating an operation such as redissolution or reprecipitation process, vacuum drying is performed to isolate the target polyimide precursor. To improve the degree of purification, a solution of this polymer may be passed through a column filled with anion and/or cation exchange resins swollen with an appropriate organic solvent to remove ionic impurities.

The weight-average molecular weight of the ester bond-type polyimide precursor is preferably 1,000 or more, and more preferably 5,000 or more, as a polystyrene-equivalent value by gel permeation chromatography from the viewpoints of heat resistance and mechanical properties of the film obtained after a heat treatment. The upper limit is preferably 100,000 or less. From the viewpoint of solubility in a developer, the weight-average molecular weight is more preferably 50,000 or less. The weight-average molecular weight (Mw) of the polyimide precursor (A) is more preferably 15,000 to 38,000. Tetrahydrofuran or N-methyl-2-pyrrolidone is recommended as the developing solvent for gel permeation chromatography. The molecular weight is determined from a calibration curve obtained using standard monodisperse polystyrene. As the standard monodisperse polystyrene, it is recommended to select from an organic solvent-based standard sample STANDARD SM-105 manufactured by Showa Denko K.K.

[(B) Photopolymerization Initiator]

Regarding the photopolymerization initiator (B) according to the present embodiment, the amount of radicals generated, when a 100 μM solution of dimethyl sulfoxide (DMSO) is irradiated at 100 mJ/cm² using a UV lamp having a wavelength of 365 nm, is 3.0 to 30.0 μM. The amount of radicals generated according to this embodiment can be calculated by the method in the Examples mentioned later.

The photopolymerization initiator (B) according to the present embodiment is not limited as long as the amount of radicals generated is 3.0 to 30.0 μM. Within this range, there is no deterioration of the mold resin, and the adhesion between the mold resin and the cured relief pattern is excellent. From the viewpoint of focus margin, the amount of radicals generated is preferably 5.0 to 30.0 μM, more preferably 8.0 to 30.0 μM, and still more preferably 10.0 to 30.0 μM.

In the present embodiment, it is not clear why the amount of radicals generated within the above range leads to satisfactory adhesion between the mold resin and the cured relief pattern, but the present inventors infer as follows.

The present embodiment is directed to a negative photosensitive resin composition including a polyimide precursor having an unsaturated double bond in the side chain and a photopolymerization initiator having an oxime structure, and radicals generated from the initiator cause a reaction of the double bond in the side chain to exhibit the developability, followed by conversion into a polyimide due to thermal curing.

It is estimated that when the reaction of the double bond in the side chain occurs, the conversion into a polyimide tends not to be completed at low temperatures such as 230° C., and the side chain partially remains to form a reaction such as ester exchange with hydroxyl groups generated by partial ring opening of the epoxy group of the mold resin, leading to an improvement in adhesion. Particularly, when the amount of radicals generated is 5 μM or more, the reaction of the double bond in the side chain sufficiently occurs, leading to an improvement in adhesion It is estimated that, when the amount of radicals generated is more than 30 μM, the recombination of the initiator occurs due to a large amount of radicals generated, so that cross-linking of the side chain does not proceed, and the recombined molecules of the generated initiator become a fragile layer at the interface between the mold resin and the polyimide, leading to deterioration of the adhesion.

In the present embodiment, the photopolymerization initiator whose amount of radicals generated can fall within the above range can be achieved by appropriately selecting the structure of the compound.

It is believed that the photopolymerization initiator generally absorbs irradiated light (wavelength of 365 nm in the present embodiment), and after reaching an excited state, the compound itself is cleaved to generate radicals, or extracts hydrogen from other molecules to generate radicals.

Therefore, in order to set the amount of radicals generated within the above range, for example, when it is desired to increase the amount of radicals generated, the amount of light absorption at 365 nm is increased by increasing the molar absorption coefficient at 365 nm, thus making it possible to adjust the amount of radicals generated to a large extent. It is possible to exemplify a technique in which the absorption maximum is shifted to the long wavelength side by forming a structure containing a heteroatom as the chemical structure, leading to an increase in molar absorption coefficient. It is particularly effective to form a heterocyclic compound containing a heteroatom.

When it is desired to reduce the amount of radicals generated, the amount of light absorption at 365 nm is reduced by decreasing the molar absorption coefficient at 365 nm, leading to a decrease in amount of radicals generated. It is effective to remove the substituent containing heteroatoms included in the chemical structure.

In the present embodiment, the photopolymerization initiator (B) preferably has an oxime structure and further contains a heteroatom, and specifically, it is more preferable to have a structure represented by the following general formula (B) or (B1):

[Chemical Formula 69]

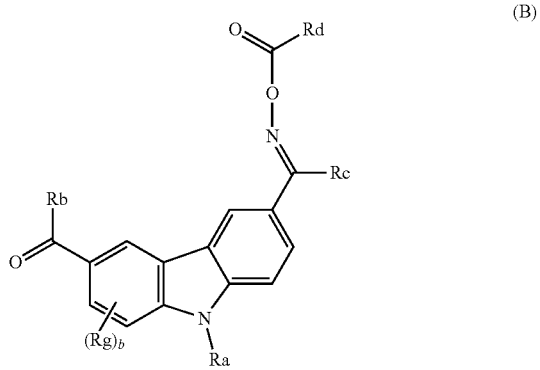

(B)

wherein Ra represents a monovalent organic group having 1 to 10 carbon atoms, Rb represents an organic group having 1 to 20 carbon atoms, Rc represents an organic group having 1 to 10 carbon atoms, Rd represents an organic group having 1 to 10 carbon atoms, b is an integer of 0 to 2, Rg represents an organic group having 1 to 4 carbon atoms, and a plurality of Rg may form a ring: or

[Chemical Formula 70]

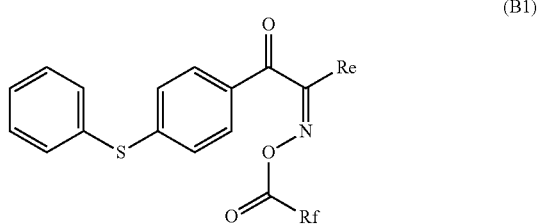

(B1)

wherein Re represents a monovalent organic group having 1 to 20 carbon atoms, and Rf represents a monovalent organic group having 1 to 10 carbon atoms.

In the general formula (B), Ra is not limited as long as it is a monovalent organic group having 1 to 10 carbon atoms, and from the viewpoint of heat resistance, an alkyl group having 1 to 5 carbon atoms is preferable, and a methyl group, an ethyl group or a propyl group is more preferable.

Rb is not limited as long as it is an organic group having 1 to 20 carbon atoms, and from the viewpoint of resolution, an aromatic group having 6 to 20 carbon atoms, or a monovalent organic group derived from a heterocyclic compound having 5 to 20 carbon atoms is preferable.

Rc is not limited as long as it is an organic group having 1 to 10 carbon atoms. Of these, from the viewpoint of resolution, a monovalent organic group having a saturated alicyclic structure having 3 to 10 carbon atoms is more preferable.

Rd is not limited as long as it is an organic group having 1 to 10 carbon atoms. Of these, from the viewpoint of resolution, an organic group having 1 to 3 carbon atoms is preferable, and a methyl group, an ethyl group or a propyl group is more preferable.

In the general formula (B1), Re is not limited as long as it is a monovalent organic group having 1 to 20 carbon atoms. Of these, from the viewpoint of chemical resistance, a saturated hydrocarbon group is preferably included.

Rf is not limited as long as it is an organic group having 1 to 10 carbon atoms. Of these, from the viewpoint of resolution, an organic group having 1 to 3 carbon atoms is preferable, and a methyl group, an ethyl group or a propyl group is more preferable.

In the negative photosensitive resin composition according to the present embodiment, when the photopolymerization initiator (B) has the above structure (B) or (B1), the adhesion between the cured relief pattern (polyimide resin) and the mold resin is improved. The reason is not clear, but the present inventors consider as follows.

Namely, an epoxy resin or the like is generally used as the mold resin, and the epoxy moiety of the epoxy resin remains in the form of a ring-opened hydroxyl group. The polyimide precursor (A) according to the present embodiment has two or more oxygen atoms or sulfur atoms, and when including the photopolymerization initiator having the above structure (B), the nitrogen and sulfur atoms remaining after the generation of radicals of the photopolymerization initiator improve the adhesion between the hydroxyl group remaining in the mold resin and the polyimide resin.

(C) Solvent

The solvent (C) according to the present embodiment is not limited as long as it is a solvent which can uniformly dissolve or disperse the polyimide precursor (A) and the photopolymerization initiator (B) according to the present embodiment. Examples of such a solvent include γ-butyrolactone, dimethyl sulfoxide, tetrahydrofurfuryl alcohol, ethyl acetoacetate, dimethyl succinate, dimethyl malonate, N,N-dimethylacetoacetamide, ε-caprolactone, 1,3-dimethyl-2-imidazolidinone, 3-methoxy-N,N-dimethylpropanamide, 3-butoxy-N,N-dimethylpropanamide, N,N-dimethylformamide, N-methyl-2-pyrrolidone, N-ethyl-2-pyrrolidone, and N,N-dimethylacetamide.

Of these, from the viewpoint of low dielectric constant, the solvent is preferably at least one selected from the group consisting of γ-butyrolactone, dimethyl sulfoxide, tetrahydrofurfuryl alcohol, ethyl acetoacetate, dimethyl succinate, dimethyl malonate, N,N-dimethylacetoacetamide, ε-caprolactone, 1,3-dimethyl-2-imidazolidinone, 3-methoxy-N,N-dimethylpropanamide, and 3-butoxy-N,N-dimethylpropanamide, and particularly preferably γ-butyrolactone or dimethyl sulfoxide. These solvents may be used alone, or a mixture of two or more thereof may be used.

The solvent can be used in an amount within a range of, for example, 30 to 1,500 parts by mass, preferably 100 to 1,000 parts by mass, based on 100 parts by mass of the polyimide precursor (A) depending on the desired coating film thickness and viscosity of the photosensitive resin composition. When the solvent contains an alcohol having no olefin-based double bond, the content of the alcohol having no olefin-based double bond in the total solvent is preferably 5 to 50% by mass, and more preferably 10 to 30% by mass. When the content of the alcohol having no olefin-based double bond is 5% by mass or more, the storage stability of the photosensitive resin composition becomes satisfactory, and when the content is 50% by mass or less, the solubility of the polyimide precursor (A) becomes satisfactory.

[(D) Polymerization Inhibitor]

In the present embodiment, it is preferable to add a polymerization inhibitor. By adding the polymerization inhibitor, the negative photosensitive resin composition can obtain satisfactory resolution regardless of the underlying substrate, particularly.

Examples of the polymerization inhibitor according to the present embodiment include compounds having an aromatic hydroxyl group, nitroso compounds, N-oxide compounds, quinone compounds, N-oxyl compounds, and phenothiazine compounds.

Examples of the compound having an aromatic hydroxyl group include 4-methoxyphenol, 2,6-di-tert-butyl-4-methylphenol, pentaerythritoltetrakis[3-(3,5-di-tert-butyl-4-hydroxyphenyl)propionate], thiodiethylenebis[3-(3,5-di-tert-butyl-4-hydroxyphenyl)propionate], octadecyl-3-(3,5-di-tert-butyl-4-hydroxyphenyl)propionate, N,N'-hexane-1,6-diylbis[3-(3,5-di-tert-butyl-4-hydroxyphenyl)propionamide], 3,3',3'',5,5',5''-hexa-tert-butyl-a,a',a''-(mesitylene-2,4,6-triyl)tri-p-cresol, 4,6-bis(octylthiomethyl)-o-cresol, ethylenebis(oxyethylene)bis[3-(5-tert-butyl-4-hydroxy-m-tolyl)propionate], hexamethylenebis[3-(3,5-di-tert-butyl-4-hydroxyphenyl)propionate, 1,3,5-tris(3,5-di-tert-butyl-4-hydroxybenzyl)-1,3,5-triazine-2,4,6(1H,3H,5H)-trione, 2,6-di-tert-butyl-4-(4,6-bis(octylthio)-1,3,5-triazin-2-ylamino)phenol, catechol, tert-butyl-catechol, 4,4',4''-(1-methylpropanyl-3-ylidene)tris(6-tert-butyl-m-cresol), 6,6'-di-tert-butyl-4,4'-butylidene-m-cresol, 3,9-bis[2-[3-(3-tert-butyl-4-hydroxy-5-methylphenyl)propionyloxy]-1,1-dimethylethyl]-2,4,8,10-tetraoxaspiro[5,5]undecane, hydroquinone, methylhydroquinone, t-butylhydroquinone, di-t-butyl-p-cresol, pyrogallol, 4,4-thiobis(3-methyl-6-t-butylphenol), 2,2'-methylenebis(4-methyl-6-t-butylphenol), phenol resins, and cresol resins.

Examples of the nitroso compound include nitrosobenzene, 2-nitrosotoluene, 1,2,4,5-tetramethyl-3-nitrosobenzene, 4-nitrosophenol, 1-nitroso-2-naphthol, 2-nitroso-1-naphthol, 4-nitroso-diphenylamine, 3,5-dibromo-4-nitrosobenzenesulfonic acid, N-nitrosopyrrolidine, N-t-butyl-N-nitrosoaniline, N-nitrosodimethylamine, N-nitrosodiethylamine, 1-nitrosopiperidine, 4-nitrosomorpholine, N-nitroso-N-methylbutylamine, N-nitroso-N-ethylurea, N-nitrosohexamethyleneimine, N-nitrosophenylhydroxyamine first cerium salt and N-nitrosophenylhydroxyamine aluminum salt, 2,4,6-tris-t-butyl-nitrosobenzene, and N-nitrosodiphenylamine.

Examples of the N-oxide compound include phenyl-t-butyl nitrone, 3,3,5,5-tetramethyl-1-pyrroline-N-oxide, 5,5-dimethyl-1-pyrroline-N-oxide, 4-methylmorpholine N-oxide, pyridine N-oxide, 4-nitropyridine N-oxide, 3-hydroxypyridine N-oxide, picolinic acid N-oxide, nicotinic acid N-oxide, and isonicotinic acid N-oxide.

Examples of the quinone compound include p-benzoquinone, p-xyloquinone, p-toluquinone, 2,6-dimethyl-1,4-benzoquinone, tetramethyl-1,4-benzoquinone, 2-tert-butyl-p-benzoquinone, 2,5-di-tert-butyl-1,4-benzoquinone, 2,6-di-tert-1,4-benzoquinone, thymoquinone, 2,5-di-tert-amylbenzoquinone, 2-bromo-1,4-benzoquinone, 2,5-dibromo-1,4-benzoquinone, 2,5-dichloro-1,4-benzoquinone, 2,6-dichloro-1,4-benzoquinone, 2-bromo-5-methyl-1,4-benzoquinone, tetrafluoro-1,4-benzoquinone, tetrabromo-1,4-benzoquinone, 2-chloro-5-methyl-1,4-benzoquinone, tetrachloro-1,4-benzoquinone, methoxy-1,4-benzoquinone, 2,5-dihydroxy-1,4-benzoquinone, 2,5-dimethoxy-1,4-benzoquinone, 2,6-dimethoxy-1,4-benzoquinone, 2,3-dimethoxy-5-methyl-1,4-benzoquinone, tetrahydroxy-1,4-benzoquinone, 2,5-diphenyl-1,4-benzoquinone, 1,4-naphthoquinone, 1,4-anthraquinone, 2-methyl-1,4-naphthoquinone, 5,8-dihydroxy-1,4-naphthoquinone, 2-hydroxy-1,4-naphthoquinone, 5-hydroxy-1,4-naphthoquinone, 5-hydroxy-2-methyl-1,4-naphthoquinone, 1-nitroanthraquinone, anthraquinone, 1-aminoanthraquinone, 1,2-benzoanthraquinone, 1,4-diaminoanthraquinone, 2,3-dimethylanthraquinone, 2-ethylanthraquinone, 2-methylanthraquinone, and 5,12-naphthacenequinone.

Examples of the N-oxyl compound include 2,2,6,6-tetramethylpiperidine 1-oxyl, 4-cyano-2,2,6,6-tetramethylpiperidine 1-oxyl, 4-amino-2,2,6,6-tetramethylpiperidine 1-oxyl, 4-carboxy-2,2,6,6-tetramethylpiperidine 1-oxyl, 4-methoxy-2,2,6,6-tetramethylpiperidine 1-oxyl, 4-hydroxy-2,2,6,6-tetramethylpiperidine 1-oxyl, 4-methacryloyloxy-2,2,6,6-tetramethylpiperidine 1-oxyl, piperidine 1-oxyl free radical, 4-oxo-2,2,6,6-tetramethylpiperidine 1-oxyl free radical, 4-acetamide-2,2,6,6-tetramethylpiperidine 1-oxyl free radical, 4-maleimide-2,2,6,6-tetramethylpiperidine 1-oxyl free radical, 4-phosphonoxy-2,2,6,6-tetramethylpiperidine 1-oxyl free radical, pyrrolidine 1-oxyl free radical compounds, and 3-carboxyproxyl free radical (3-carboxy-2,2,5,5-tetramethylpyrrolidine 1-oxyl free radical).

Examples of the phenothiazine compound include phenothiazine, 10-methylphenothiazine, 2-methylthiophenothiazine, 2-chlorophenothiazine, 2-ethylthiophenothiazine, 2-(trifluoromethyl)phenothiazine, and 2-methoxyphenothiazine.

From the viewpoints of developing residual film ratio and resolution, a compound having an aromatic hydroxyl group and a nitroso compound are preferable, and a compound having an aromatic hydroxyl group is particularly preferable.

As the compound having an aromatic hydroxyl group, 4-methoxyphenol and 2,6-di-tert-butyl-4-methylphenol are preferable, and 4-methoxyphenol is particularly preferable.

In the photosensitive resin composition of the present invention, the total content of the photopolymerization initiator (B) and the polymerization inhibitor (D) is preferably 0.1 to 20 parts by mass based on 100 parts by mass of the polyimide precursor component (A).

[(E) Other Components]

The negative photosensitive resin composition of the present invention may further include components other than the above components (A) to (D).

The negative photosensitive resin composition of the present invention is typically used as a liquid photosensitive resin composition formed into a varnish by dissolving the above respective components and an optionally used arbitrary component in a solvent (C). Therefore, examples of other components (E) include resins other than the photosensitive polyimide precursor (A), a sensitizer, a cross-linking agent, a monomer having a photopolymerizable unsaturated bond, an adhesion aid, an azole compound, and a hindered phenol compound.

Examples of the cross-linking agent include arbitrary compounds having a plurality of functional groups in the molecule. Examples of the functional group include an acrylic group, a methacrylic group, an epoxy group, a methylol group, an allyl group, a vinyl group, and a maleimide group.

The negative photosensitive resin composition according to the present embodiment may further include resin components other than the above polyimide precursor (A). Examples of the resin component which can be included include polyimide, polyoxazole, polyoxazole precursor, phenol resin, polyamide, epoxy resin, siloxane resin, and acrylic resin. The amount of these resin components to be mixed is preferably within a range of 0.01 to 20 parts by mass based on 100 parts by mass of the polyimide precursor (A).

A sensitizer can be optionally mixed in the negative photosensitive resin composition according to the present embodiment in order to improve the light sensitivity. Examples of the sensitizer include Michler's ketone, 4,4'-bis(diethylamino)benzophenone, 2,5-bis(4'-diethylaminobenzal)cyclopentane, 2,6-bis(4'-diethylaminobenzal)cyclohexanone, 2,6-bis(4'-diethylaminobenzal)-4-methylcyclohexanone, 4,4'-bis(dimethylamino)chalcone, 4,4'-bis(diethylamino)chalcone, p-dimethylaminocinnamylidene indanone, p-dimethylaminobenzylidene indanone, 2-(p-dimethylaminophenylbiphenylene)-benzothiazole, 2-(p-dimethylaminophenylvinylene)benzothiazole, 2-(p-dimethylaminophenylvinylene)isonaphthiazole, 1,3-bis(4'-dimethylaminobenzal)acetone, and 1,3-bis(4'-diethylaminobenzal) acetone, 3,3'-carbonyl-bis(7-diethylaminocumarin), 3-acetyl-7-dimethylaminocumarin, 3-ethoxycarbonyl-7-dimethylaminocumarin, 3-benzyloxycarbonyl-7-dimethylaminocumarin, 3-methoxycarbonyl-7-diethylaminocumarin, 3-ethoxycarbonyl-7-diethylaminocumarin, N-phenyl-N'-ethylethanolamine, N-phenyldiethanolamine, N-p-tolyldiethanolamine, N-phenylethanolamine, 4-morpholinobenzophenone, isoamyl dimethylaminobenzoate, isoamyl diethylaminobenzoate, 2-mercaptobenzimidazole, 1-phenyl-5-mercaptotetrazole, 2-mercaptobenzothiazole, 2-(p-dimethylaminostyryl)benzoxazole, 2-(p-dimethylaminostyryl)benzthiazole, 2-(p-dimethylaminostyryl)naphtho (1,2-d)thiazole, 2-(p-dimethylaminobenzoyl) styrene, diphenylacetamide, benzanilide, N-methylacetanilide, and 3',4'-dimethylacetanilide. These sensitizers can be used alone, or in combination of two to five thereof.

When the negative photosensitive resin composition includes a sensitizer for improving the light sensitivity, the mixing amount is preferably 0.1 to 25 parts by mass based on 100 parts by mass of the polyimide precursor (A).

In the negative photosensitive resin composition of the present invention, a monomer having a photopolymerizable unsaturated bond can be optionally mixed in order to improve the resolution of the relief pattern. Such a monomer is preferably a (meth)acrylic compound which undergoes a radical polymerization reaction with a photopolymerization initiator. Examples thereof include, but are not limited to, compounds, particularly mono- or di(meth)acrylates of ethylene glycol or polyethylene glycol, such as diethylene glycol dimethacrylate and tetraethylene glycol dimethacrylate;
mono- or di(meth)acrylates of propylene glycol or polypropylene glycol;
mono-, di- or tri(meth)acrylates of glycerol;
cyclohexane di(meth)acrylate;
diacrylate and dimethacrylate of 1,4-butanediol, di(meth) acrylate of 1,6-hexanediol;
di(meth)acrylate of neopentyl glycol;
mono- or di(meth)acrylates of bisphenol A;
benzene trimethacrylate;
isobornyl (meth)acrylate;
acrylamide and derivatives thereof;
methacrylamide and derivatives thereof;
trimethylolpropane tri(meth)acrylate;
di- or tri(meth)acrylates of glycerol;
di-, tri-, or tetra(meth)acrylates of pentaerythritol;
and ethylene oxide or propylene oxide adducts of these compounds.

When the monomer having a photopolymerizable unsaturated bond is included in order to improve the resolution of the relief pattern formed from the negative photosensitive resin composition according to the present embodiment, the mixing amount is preferably 0.01 to 50 parts by mass based on 100 parts by mass of the polyimide precursor (A).

In order to improve the adhesion between a film (photosensitive resin layer) formed from the negative photosensitive resin composition according to the present embodiment and the base material, an adhesion aid can be optionally mixed in the photosensitive resin composition. Examples of the adhesion aid include silane coupling agents such as γ-aminopropyldimethoxysilane, N-(β-aminoethyl)-γ-aminopropylmethyldimethoxysilane, γ-glycidoxypropylmethyldimethoxysilane, γ-mercaptopropylmethyldimethoxysilane, 3-methacryloxypropyldimethoxymethylsilane, 3-methacryloxypropyltrimethoxysilane, dimethoxymethyl-3-piperidinopropylsilane, diethoxy-3-glycidoxypropylmethylsilane, N-(3-diethoxymethylsilylpropyl)succinimide, N-[3-(triethoxysilyl)propyl]phthalamide acid, benzophenone-3,3'-bis(N-[3-triethoxysilyl]propylamide)-4,4'-dicarboxylic acid, benzene-1,4-bis(N-[3-triethoxysilyl]propylamide)-2,5-dicarboxylic acid, 3-(triethoxysilyl)propylsuccinic anhydride, N-phenylaminopropyltrimethoxysilane, and N-phenyl-3-aminopropyltrimethoxysilane; and aluminum-based adhesion aids such as aluminumtris(ethyl acetoacetate), aluminumtris(acetyl acetoacetate), and ethylacetoacetate aluminum diisopropyrate.

Of these adhesion aids, silane coupling agents are more preferably used in view of the adhesive strength. When the photosensitive resin composition includes the adhesion aid, the mixing amount is preferably within a range of 0.5 to 25 parts by mass based on 100 parts by mass of the polyimide precursor (A).

When the substrate to which the negative photosensitive resin composition according to the present embodiment is applied is, for example, a substrate made of copper or a copper alloy, an azole compound can be optionally mixed in order to suppress the discoloration of the copper surface. Examples of the azole compound include 1H-triazole, 5-methyl-1H-triazole, 5-ethyl-1H-triazole, 4,5-dimethyl-1H-triazole, 5-phenyl-1H-triazole, 4-t-butyl-5-phenyl-1H-triazole, 5-hydroxyphenyl-1H-triazole, phenyltriazole, p-ethoxyphenyltriazole, 5-phenyl-1-(2-dimethylaminoethyl)triazole, 5-benzyl-1H-triazole, hydroxyphenyltriazole, 1,5-dimethyltriazole, 4,5-diethyl-1H-triazole, 1H-benzotriazole, 2-(5-methyl-2-hydroxyphenyl)benzotriazole, 2-[2-hydroxy-3,5-bis(a,a-dimethylbenzyl)phenyl]-benzotriazole, 2-(3,5-di-t-butyl-2-hydroxyphenyl)benzotriazole, 2-(3-t-butyl-5-methyl-2-hydroxyphenyl)-benzotriazole, 2-(3,5-di-t-amyl-2-hydroxyphenyl)benzotriazole, 2-(2'-hydroxy-5'-t-octylphenyl)benzotriazole, hydroxyphenylbenzotriazole, tolyltriazole, 5-methyl-1H-benzotriazole, 4-methyl-1H-benzotriazole, 4-carboxy-1H-benzotriazole, 5-carboxy-1H-benzotriazole, 1H-tetrazole, 5-methyl-1H-tetrazole, 5-phenyl-1H-tetrazole, 5-amino-1H-tetrazole, and 1-methyl-1H-tetrazole. One or more selected from tolyltriazole, 5-methyl-1H-benzotriazole, and 4-methyl-1H-benzotriazole are particularly preferable. These azole compounds may be used alone, or a mixture of two or more thereof may be used.

When the negative photosensitive resin composition according to the present embodiment includes the azole compound, the mixing amount is preferably 0.1 to 20 parts by mass, and more preferably 0.5 to 5 parts by mass, based on 100 parts by mass of the polyimide precursor (A) from the viewpoint of light-sensitivity properties. When the amount of the azole compound (A) to be mixed is 0.1 parts by mass or more based on 100 parts by mass of the polyimide precursor (A), in the case of forming a film (photosensitive resin layer) made of the negative photosensitive resin composition according to the present embodiment on copper or a copper alloy, the discoloration of the surface of the copper or copper alloy is suppressed. When the amount is 10 parts by mass or less, excellent light sensitivity of the negative photosensitive resin composition is maintained.

In order to suppress the discoloration of the copper surface, a hindered phenol compound can be optionally mixed in place of the azole compound or together with the azole compound. Examples of the hindered phenol compound include, but are not limited to, 2,6-di-t-butyl-4-methylphenol, 2,5-di-t-butyl-hydroquinone, octadecyl-3-(3,5-di-t-butyl-4-hydroxyphenyl)propionate, isooctyl-3-(3,5-di-t-butyl-4-hydroxyphenyl)propionate, 4,4'-methylenebis(2,6-di-t-butylphenol), 4,4'-thio-bis(3-methyl-6-t-butylphenol), 4,4'-butylidene-bis(3-methyl-6-t-butylphenol), triethyleneglycol-bis[3-(3-t-butyl-5-methyl-4-hydroxyphenyl)propionate], 1,6-hexanediol-bis[3-(3,5-di-t-butyl-4-hydroxyphenyl)propionate], 2,2-thio-diethylenebis[3-(3,5-di-t-butyl-4-hydroxyphenyl)propionate], N,N'hexamethylenebis(3,5-di-t-butyl-4-hydroxy-hydrocinnamamide), 2,2'-methylene-bis(4-methyl-6-t-butylphenol), 2,2'-methylene-bis(4-ethyl-6-t-butylphenol), pentaerythrityl-tetrakis[3-(3,5-di-t-butyl-4-hydroxyphenyl)propionate], tris-(3,5-di-t-butyl-4-hydroxybenzyl)-isocyanurate, 1,3,5-trimethyl-2,4,6-tris(3,5-di-t-butyl-4-hydroxybenzyl)benzene, 1,3,5-tris(3-hydroxy-2,6-dimethyl-4-isopropylbenzyl)-1,3,5-triazine-2,4,6-(1H,3H,5H)-trione, 1,3,5-tris(4-t-butyl-3-hydroxy-2,6-dimethylbenzyl)-1,3,5-triazine-2,4,6-(1H,3H,5H)-trione, 1,3,5-tris(4-s-butyl-3-hydroxy-2,6-dimethylbenzyl)-1,3,5-triazine-2,4,6-(1H,3H,5H)-trione, 1,3,5-tris[4-(1-ethylpropyl)-3-hydroxy-2,6-dimethylbenzyl]-1,3,5-triazine-2,4,6-(1H,3H,5H)-trione, 1,3,5-tris[4-triethylmethyl-3-hydroxy-2,6-dimethylbenzyl]-1,3,5-triazine-2,4,6-(1H,3H,5H)-trione, 1,3,5-tris(3-hydroxy-2,6-dimethyl-4-phenylbenzyl)-1,3,5-triazine-2,4,6-(1H,3H,5H)-trione, 1,3,5-tris(4-t-butyl-3-hydroxy-2,5,6-trimethylbenzyl)-1,3,5-triazine-2,4,6-(1H,3H,5H)-trione, 1,3,5-tris(4-t-butyl-5-ethyl-3-hydroxy-2,6-dimethylbenzyl)-1,3,5-triazine-2,4,6-(1H,3H,5H)-trione, 1,3,5-tris(4-t-butyl-6-ethyl-3-hydroxy-2-methylbenzyl)-1,3,5-triazine-2,4,6-(1H,3H,5H)-trione, 1,3,5-tris(4-t-butyl-6-ethyl-3-hydroxy-2,5-dimethylbenzyl)-1,3,5-triazine-2,4,6-(1H,3H,5H)-trione, 1,3,5-tris(4-t-butyl-5,6-diethyl-3-hydroxy-2-methylbenzyl)-1,3,5-triazine-2,4,6-(1H,3H,5H)-trione, 1,3,5-tris(4-t-butyl-3-hydroxy-2-methylbenzyl)-1,3,5-triazine-2,4,6-(1H,3H,5H)-trione, 1,3,5-tris(4-t-butyl-3-hydroxy-2,5-dimethylbenzyl)-1,3,5-triazine-2,4,6-(1H,3H,5H)-trione, and 1,3,5-tris(4-t-butyl-5-ethyl-3-hydroxy-2-methylbenzyl)-1,3,5-triazine-2,4,6-(1H,3H,5H)-trione. Of these, 1,3,5-tris(4-t-butyl-3-hydroxy-2,6-dimethylbenzyl)-1,3,5-triazine-2,4,6-(1H,3H,5H)-trione or the like is particularly preferable.

The amount of the hindered phenol compound to be mixed is preferably 0.1 to 20 parts by mass, and more preferably 0.5 to 10 parts by mass, based on 100 parts by mass of the polyimide precursor (A) from the viewpoint of light-sensitivity properties. When the amount of the hindered phenol compound to be mixed is 0.1 parts by mass or more based on 100 parts by mass of the polyimide precursor (A), for example, in the case of forming the negative photosensitive resin composition of the present invention is formed on copper or a copper alloy, the discoloration and corrosion of the copper or copper alloy are prevented. When the amount is 20 parts by mass or less, excellent light sensitivity of the negative photosensitive resin composition is maintained.

In the negative photosensitive resin composition according to the present embodiment, the weight loss ratio of the cured film heat-cured at 230° C. for 2 hours is heated at 350° C. is preferably 0.5 to 3.0%. The weight loss ratio was measured by the method mentioned in the Examples mentioned later.

By setting the weight loss ratio at 0.5% or more, the sealing material deterioration test tends to become satisfactory. The weight loss ratio is preferably 0.6% or more, and more preferably 0.7% or more.

By setting the weight loss ratio at 3.0% or less, the adhesion of the sealing material tends to be satisfactory. The weight loss ratio is preferably 2.9% or less, and more preferably 2.8% or less.

In the negative photosensitive resin composition according to the present embodiment, the proportion derived from $R_1$ and $R_2$ in the general formula (A1) in the weight loss component when a cured film cured at 230° C. for 2 hours is heated at 350° C. is preferably 60 to 80%. By setting the proportion at 60% or more, the dielectric constant and the dielectric loss tangent of the cured film tend to be satisfactory. The proportion is more preferably 62% or more, and particularly preferably 65% or more. By setting the proportion at 80% or less, the developability tends to be satisfactory. The proportion is more preferably 78% or less, and particularly preferably 75% or less.

In the present embodiment, it is possible to provide a cured film which is obtained by curing a polyimide precursor represented by the following general formula (A1), wherein the weight loss ratio of the cured film when heated at 350° C. is 0.5 to 3.0%, and the proportion derived from $R_1$ and $R_2$ in the general formula (A1) in the weight loss component is 60 to 80%:

[Chemical Formula 71]

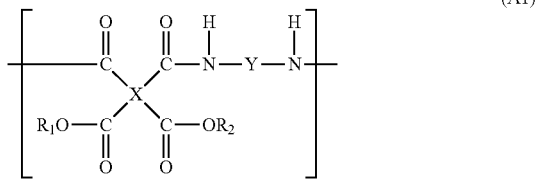

(A1)

wherein X is a tetravalent organic group, Y is a divalent organic group, and $R_1$ and $R_2$ are each independently a hydrogen atom, a monovalent organic group represented by the following general formula (R1):

[Chemical Formula 72]

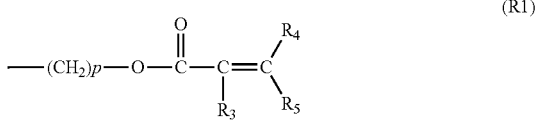

(R1)

{(where in the general formula (R1), $R_3$, $R_4$, and $R_5$ are each independently a hydrogen atom or an organic group having 1 to 3 carbon atoms, and p is an integer selected from 2 to 10), or a saturated aliphatic group having 1 to 4 carbon atoms, in which both $R_1$ and $R_2$ are not simultaneously hydrogen atoms}.

By setting the weight loss ratio at 0.5% or more, the sealing material deterioration test tends to become satisfactory. The weight loss ratio is preferably 0.6% or more, and more preferably 0.7% or more.

By setting the weight loss ratio at 3.0% or less, the sealing material adhesion tends to be satisfactory. The weight loss ratio is preferably 2.9% or less, and more preferably 2.8% or less.

The proportion derived from R1 and R2 in the general formula (A1) is preferably 60 to 80%. By setting the proportion at 60% or more, the dielectric constant and the dielectric loss tangent of the cured film tend to be satisfactory. The proportion is more preferably 62% or more, and particularly preferably 65% or more. By setting the proportion at 80% or less, the developability tends to be satisfactory. The proportion is more preferably 78% or less, and particularly preferably 75% or less.

(Absorption peak value near 1,380 $cm^{-1}$)/(absorption peak value near 1,500 $cm^{-1}$) of the cured film is preferably 0.3 to 0.54 in the IR spectrum of the cured film.

Of these, from the viewpoint of exhibiting a low dielectric constant, 0.54 or less is more preferable, and 0.5 or less is particularly preferable. From the viewpoint of developability, 0.3 or more is preferable, and 0.35 or more is more preferable.

The cured film preferably has a dielectric loss tangent at 10 GHz of 0.001 to 0.009. By setting within this range, signal delay or the like tend to decrease when a package such as AiP is formed.

In the present embodiment, it is possible to provide a cured film which is obtained by curing a polyimide precursor having a structure represented by the following general formula (A1), wherein the imide group concentration of a polyimide in the cured film is 12.0% to 25.0%, and the weight loss ratio when the cured film is heated at 350° C. is 0.5 to 3.0%:

[Chemical Formula 73]

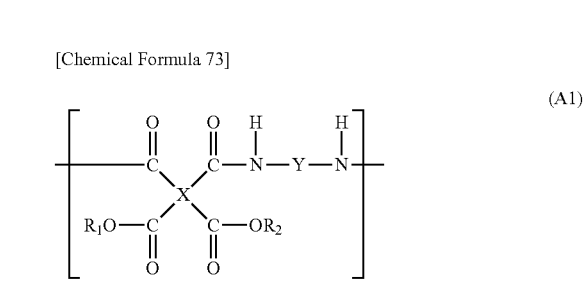

(A1)

wherein X is a tetravalent organic group, Y is a divalent organic group, and $R_1$ and $R_2$ are each independently a hydrogen atom, a monovalent organic group represented by the following general formula (R1):

[Chemical Formula 74]

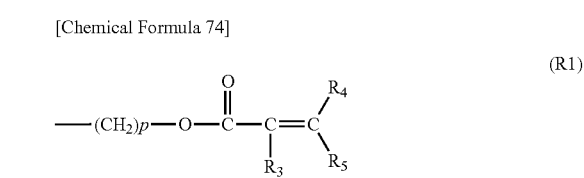

(R1)

{where in the general formula (R1), $R_3$, $R_4$, and $R_5$ are each independently a hydrogen atom or an organic group having 1 to 3 carbon atoms, and p is an integer selected from 2 to 10}, or a saturated aliphatic group having 1 to 4 carbon atoms, in which both $R_1$ and $R_2$ are not simultaneously hydrogen atoms.

Here, the imide group concentration means a ratio of the imide group per repeating unit of the polyimide cured film according to the present embodiment.

When the imide group concentration is 12% or more, the adhesion between the mold resin and the cured relief pattern tends to be satisfactory. The imide group concentration is more preferably 12.5% or more, and particularly preferably 13.5% or more. When the imide group concentration is 25.0% or less, the dielectric loss tangent of the obtained polyimide cured film tends to be satisfactory. The imide group concentration is more preferably 24.0% or less, still more preferably 23.0% or less, and particularly preferably 21.0% or less.

By setting the weight loss ratio at 0.5% or more, the sealing material deterioration test tends to become satisfactory. The weight loss ratio is preferably 0.6% or more, and more preferably 0.7% or more.

By setting the weight loss ratio at 3.0% or less, the sealing material adhesion tends to be satisfactory. The weight loss ratio is preferably 2.9% or less, and more preferably 2.8% or less.

(Absorption peak value near 1,380 $cm^{-1}$)/(absorption peak value near 1,500 $cm^{-1}$) of the cured film is preferably 0.3 to 0.54 in the IR spectrum of the cured film.

Of these, from the viewpoint of exhibiting a low dielectric loss tangent, 0.54 or less is more preferable, and 0.5 or less is particularly preferable. From the viewpoint of developability, 0.3 or more is preferable, and 0.35 or more is more preferable.

The cured film preferably has a dielectric loss tangent at 10 GHz of 0.001 to 0.009. By setting within this range, signal delay or the like tend to decrease when a package such as AiP is formed.

The ratio of the solid component other than the polyimide in the cured film of the cured film is preferably 30% or less. Examples of the solid component other than the polyimide include a cross-linkable monomer and a polymerized component of 2-hydroxyethyl methacrylate (HEMA). By setting within this range, a low dielectric loss tangent can be achieved. From the viewpoint of sealant adhesion, the ratio of the solid component other than the polyimide is more preferably 27% or less.

The amount of the compound having a hydroxyl group which has a molecular weight of 200 or less in the cured film of the cured film is preferably 1,000 ppm or less. Examples of the compound having a hydroxyl group which has a molecular weight of 200 or less include a monomer and a polymerized component of HEMA. By setting within this range, it is possible to reduce the polarity of the film, thus achieving a low dielectric loss tangent. From the viewpoint of further reducing the dielectric loss tangent, the ratio of the compound having a hydroxyl group which has a molecular weight of 200 or less is more preferably 500 ppm or less.

Such a method for producing a cured film of the present embodiment includes at least a coating film step of forming a composition containing a photosensitive polyimide precursor into a film, and a curing step of polyimidizing the film containing the polyimide precursor, the curing step including a heating step at 150 to 250° C., wherein
the imide group concentration of a polyimide in the cured film is 12.0% to 25.0%, and
the weight loss ratio when the cured film is heated at 350° C. is 0.5 to 3.0%.

By heating at a relatively low temperature of 150 to 250° C. in the heat curing step, warpage after heat curing is reduced, thus obtaining a highly reliable semiconductor device.

In the method for producing a cured film of the present embodiment, the ratio of the solid component other than the polyimide in the cured film is preferably 30% or less.

In the method for producing a cured film of the present embodiment, it is preferable that the component derived from the photosensitive group of the polyimide precursor in the cured film is 1,000 ppm or less. The component derived from the photosensitive group of the polyimide precursor is, for example, a compound having a hydroxyl group which has a molecular weight of 200 or less.

<Method for Producing Polyimide, and Polyimide>

The present invention also provides a method for producing a polyimide.

The method for producing a polyimide in the present invention includes curing the above-mentioned negative photosensitive resin composition.

The structure of the polyimide formed from the negative photosensitive resin composition (polyimide precursor composition) is represented by the following general formula (2):

[Chemical Formula 75]

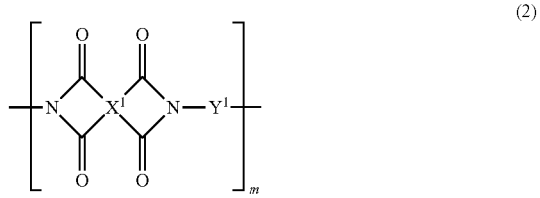

where in the general formula (2), $X^1$ and $Y^1$ are the same as X and Y in the general formula (A1).

Preferable X and Y in the general formula (A1) are also preferable in the polyimide of the general formula (2) for the same reason. The number of repeating units m is not particularly limited, but may be an integer of 2 to 150.

<Method for Producing Cured Relief Pattern>

The present invention also provide a method for producing a cured relief pattern.

The method for producing a cured relief pattern in the present invention comprises, for example, the following steps:

(1) an applying step of applying the above-mentioned negative photosensitive resin composition onto a substrate to form a photosensitive resin layer on the substrate, (2) an exposing step of exposing the photosensitive resin layer, (3) a developing step of developing the exposed photosensitive resin layer to form a relief pattern, and (4) a heating step of heat-treating the relief pattern to form a cured relief pattern, in the order mentioned above.

Hereinafter, typical embodiments of each step will be described.

(1) Applying Step

In this step, the negative photosensitive resin composition of the present invention is applied onto a substrate, and if necessary, dried thereafter to form a photosensitive resin layer.

It is possible to use, as the substrate, for example, a metal substrate made of silicon, aluminum, copper, or a copper alloy; a resin substrate made of epoxy, polyimide, or polybenzoxazole; a substrate in which a metal circuit is formed on the resin substrate;
a substrate in which a plurality of metals, or a metal and a resin are laminated in multiple layers.

It is possible to use, as the application method, methods conventionally used for the application of a photosensitive resin composition, for example, a method of application with a spin coater, a bar coater, a blade coater, a curtain coater, or a screen-printing machine, or a method of spray coating with a spray coater.

If necessary, the photosensitive resin composition film can be dried. It is possible to use, as the drying method, a method such as air drying, heat drying with an oven or a hot plate, or vacuum drying. It is desirable that the coating film is dried under conditions which do not cause imidization of the polyimide precursor (A) (polyamic acid ester) in the photosensitive resin composition. Specifically, when air drying or heat drying is performed, drying can be performed under the conditions at 20° C. to 140° C. for 1 minute to 1 hour. In this manner, the photosensitive resin layer can be formed on the substrate.

(2) Exposing Step

In this step, the photosensitive resin layer formed as mentioned above is exposed. It is possible to use, as the exposure device, exposure devices such as a contact aligner, a mirror projection, and a stepper. Exposure can be performed through a photomask or reticle having a pattern or directly. Light beam used for exposure is, for example, an ultraviolet light source.

After exposure, for the purpose of improving the light sensitivity, post-exposure baking (PEB) and/or pre-development baking according to a combination of an arbitrary temperature and time may be performed, if necessary. The range of baking conditions are preferably as follows: the temperature is 40° C. to 120° C. and the time is 10 seconds to 240 seconds, though the baking is not limited to these ranges as long as various properties of the photosensitive resin composition of the present invention are not inhibited.

(3) Developing Step

In this step, the unexposed portion of the exposed photosensitive resin layer is developed and removed. It is possible to use, as a developing method for developing a photosensitive resin layer after exposure (irradiation), any method selected from conventionally known methods of developing a photoresist. Examples thereof include a rotary spray method, a paddle method, and an immersion method accompanied by an ultrasonic treatment. After development, for the purpose of adjusting the shape of a relief pattern, post-development baking may be performed by a combination of an arbitrary temperature and time, if necessary. The temperature of the post-development baking can be, for example, 80 to 130° C., and the time can be, for example, 0.5 to 10 minutes.

The developer used for development is preferably a good solvent for a negative photosensitive resin composition, or a combination of a good solvent and a poor solvent. The good solvent is preferably N-methyl-2-pyrrolidone, N-cyclohexyl-2-pyrrolidone, N,N-dimethylacetamide, cyclopentanone, cyclohexanone, γ-butyrolactone, or a-acetyl-γ-butyrolactone. The poor solvent is preferably toluene, xylene, methanol, ethanol, isopropyl alcohol, ethyl lactate, propylene glycol methyl ether acetate, or water. When a good solvent and a poor solvent are used as a mixture, it is preferable to adjust the ratio of the poor solvent to the good solvent according to the solubility of the polymer in the negative photosensitive resin composition. Two or more solvents, for example, a plurality of solvents in combination may also be used.

(4) Heating Step

In this step, the relief pattern obtained by the above development is heated to dilute the photosensitive component, and the polyimide precursor (A) is imidized, thereby converting it into a cured relief pattern composed of the polyimide.

It is possible to select, as the method of heat-curing, various methods such as those using a hot plate, an oven, and a temperature raising oven capable of setting a temperature program. Heating may be performed, for example, at 160° C. to 400° C. for 30 minutes to 5 hours. Air may be used as an atmosphere gas during heat curing, and an inert gas such as nitrogen or argon may be used.

In this manner, the cured relief pattern can be produced.

<Semiconductor Device>

The present invention also provides a semiconductor device having a cured relief pattern obtained by the above-mentioned method for producing a cured relief pattern.

The semiconductor device can be a semiconductor device comprising a base material which is a semiconductor element, and a cured relief pattern formed on the base material by the above-mentioned method for producing a cured relief pattern.

The semiconductor device can be produced by a method in which a semiconductor element is used as a base material and the above-mentioned method for producing a cured relief pattern is included as a part of a step. The semiconductor device of the present invention can be produced by forming a cured relief pattern formed by the above-mentioned method for producing a cured relief pattern, for example, as a surface protective film, an interlayer insulating film, a rewiring insulating film, a protective film for a flip-chip device, or a protective film for a semiconductor device having a bump structure, and combining it with a known method for producing a semiconductor device.

In addition to application to the semiconductor device mentioned above, the negative photosensitive resin composition of the present invention is also useful in applications such as interlayer insulation of multilayer circuits, covercoating of flexible copper clad plates, solder resist films, and liquid crystal alignment films.

Mode for Carrying Out Second Invention

Hereinafter, the mode for carrying out the present invention (hereinafter abbreviated as "embodiments") will be described in detail. The present invention is not limited to the following embodiments, and various other changes and modifications can be made without departing from the spirit and scope of the invention.

In addition, throughout the present description, the structures represented by the same reference numerals in the general formula may be the same or different from each other when a plurality of structures are present in the molecule.

<Negative Photosensitive Resin Composition>

The negative photosensitive resin composition according to the present embodiment comprises the following components:

(A) a polyimide precursor;
(B) a photopolymerization initiator;
(C) a silane coupling agent having a specific structure; and
(D) a specific organic solvent.

From the viewpoint of obtaining high resolution, it is preferable that the negative photosensitive resin composition includes 100 parts by mass of the polyimide precursor (A), 0.1 to 20 parts by mass of the photopolymerization initiator (B) based on 100 parts by mass of the polyimide precursor (A), and 0.1 to 20 parts by mass of the silane coupling agent having a specific structure (C) based on 100 parts by mass of the polyimide precursor (A).

(A) Polyimide Precursor

The polyimide precursor (A) in the present embodiment is a resin component included in the negative photosensitive resin composition, and is converted into a polyimide by being subjected to a heat cyclization treatment.

The polyimide precursor is preferably a polyamide having a structure represented by the following general formula (2):

[Chemical Formula 76]

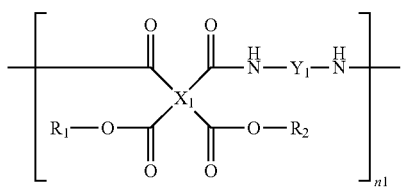

(2)

wherein $X_1$ is a tetravalent organic group, $Y_1$ is a divalent organic group, $n_1$ is an integer of 2 to 150, and $R_1$ and $R_2$ are each independently a hydrogen atom or a monovalent organic group.

At least one of $R_1$ and $R_2$ is preferably a monovalent organic group represented by the following general formula (3):

[Chemical Formula 77]

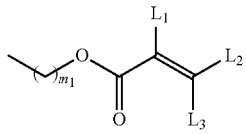

(3)

wherein $L_1$, $L_2$, and $L_3$ are each independently a hydrogen atom or an organic group having 1 to 3 carbon atoms, and $m_1$ is an integer of 2 to 10.

$n_1$ in the general formula (2) is not limited as long as it is an integer of 2 to 150, and is preferably an integer of 3 to 100, and more preferably an integer of 5 to 70, from the viewpoints of photosensitivity and mechanical properties of the negative photosensitive resin composition.

In the general formula (2), the tetravalent organic group represented by $X_1$ is preferably an organic group having 6 to 40 carbon atoms, and more preferably an aromatic group or an alicyclic aliphatic group in which a —$COOR_1$ group, a —$COOR_2$ group, and a —CONH— group are in the ortho-positions with each other, from the viewpoint of achieving both heat resistance and photosensitivity. Specific examples of the tetravalent organic group represented by $X_1$ include, but are not limited to, an organic group having 6 to 40 carbon atoms and groups having a structure represented by the following general formula (20):

[Chemical Formula 78]

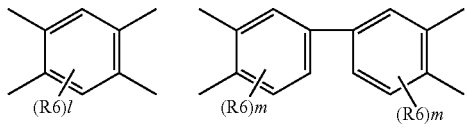

(20)

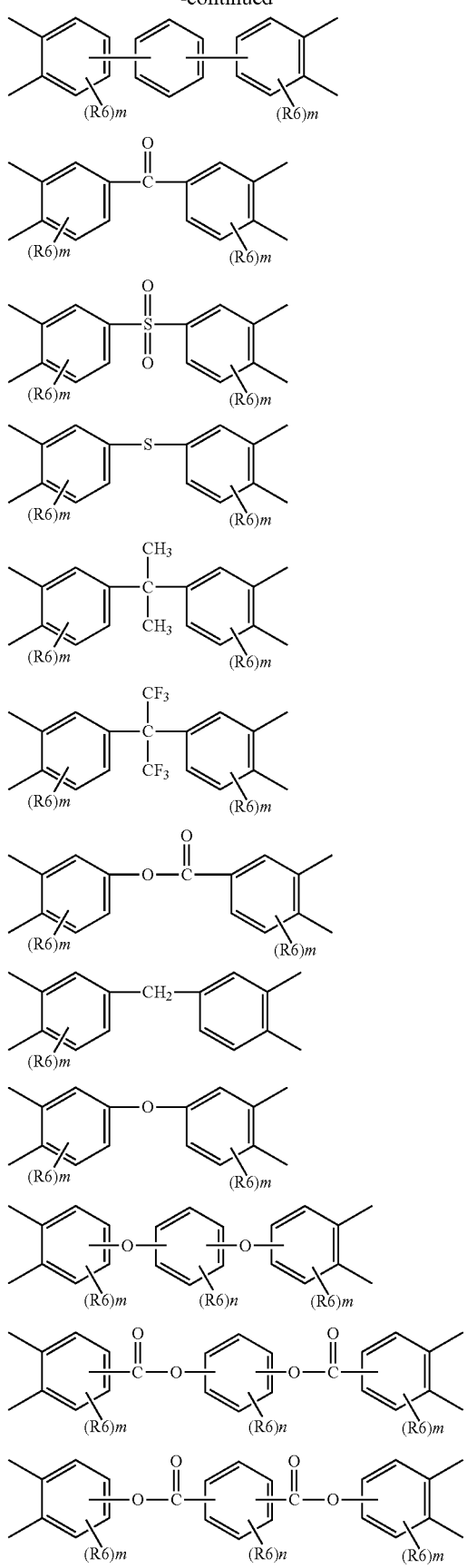

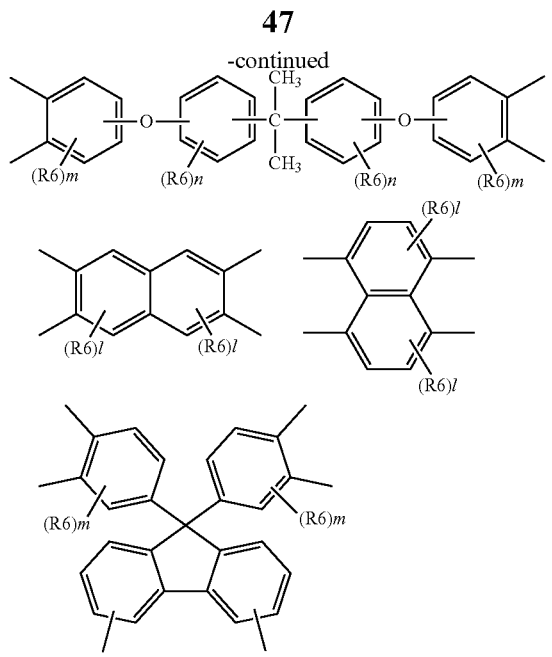

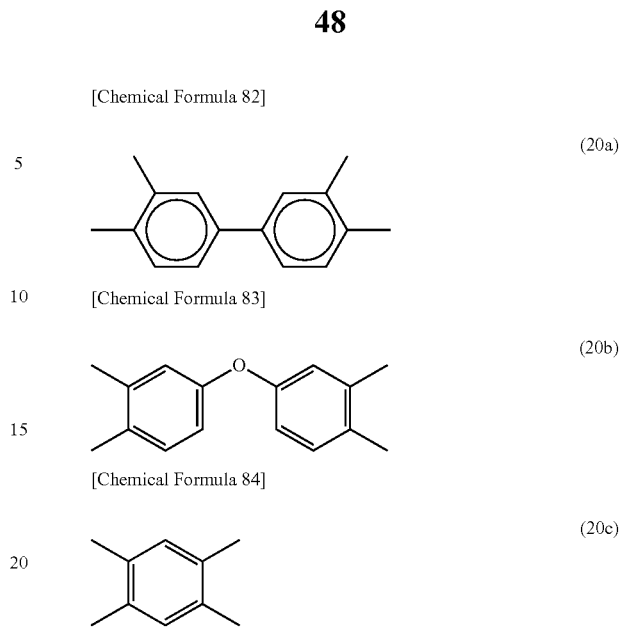

wherein $R_6$ is a monovalent group selected from the group consisting of a hydrogen atom, a fluorine atom, a hydrocarbon group having 1 to 10 carbon atoms, and a fluorine-containing hydrocarbon group having 1 to 10 carbon atoms, l is an integer selected from 0 to 2, m is an integer selected from 0 to 3, and n is an integer selected from 0 to 4. The structures of $X_1$ may be one or a combination of two or more thereof. The $X_1$ group having a structure represented by the above formula (20) is preferable from the viewpoint of achieving both heat resistance and photosensitivity.

Of the structures represented by the above formula (20), the $X_1$ group is preferably a structure represented by the following formula (20A), (20B), or (20C):

[Chemical Formula 79]

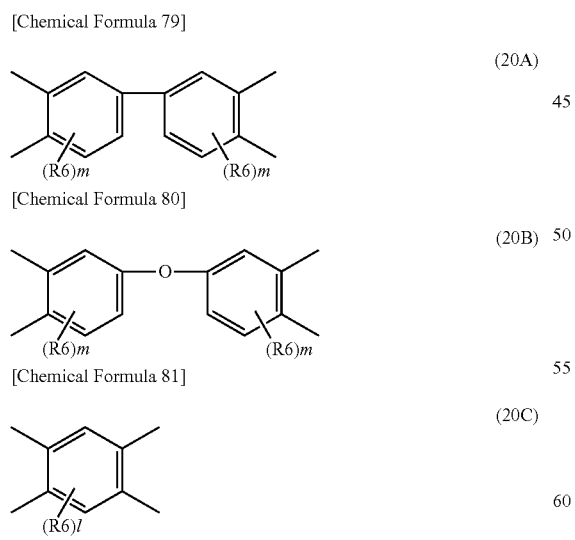

from the viewpoints of chemical resistance, resolution, and suppression of voids after a high temperature storage test, and more preferably a structure represented by the following formula (20a), (20b), or (20c):

[Chemical Formula 82]

(20a)

[Chemical Formula 83]

(20b)

[Chemical Formula 84]

(20c)

In the general formula (2), the divalent organic group represented by $Y_1$ is preferably an aromatic group having 6 to 40 carbon atoms from the viewpoint of achieving both heat resistance and photosensitivity, and examples thereof include, but are not limited to, structures represented by the following formula (21):

[Chemical Formula 85]

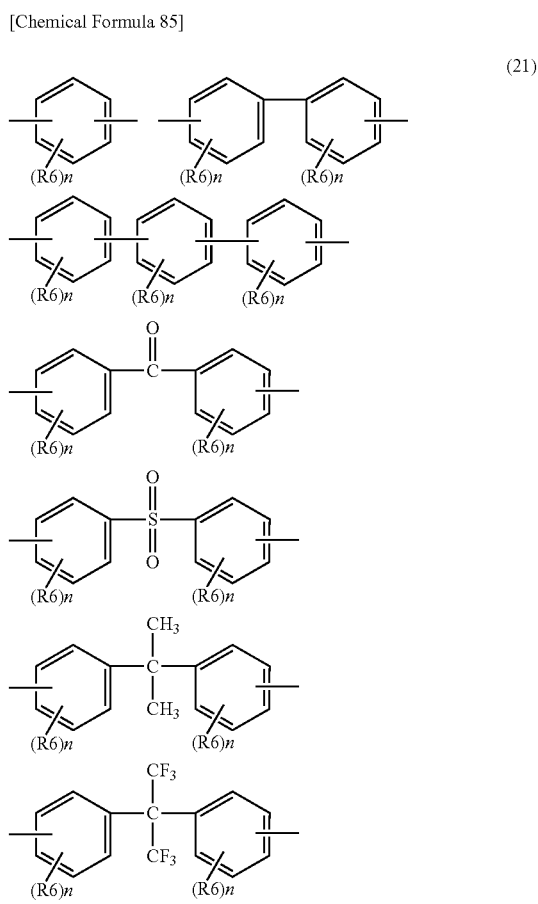

(21)

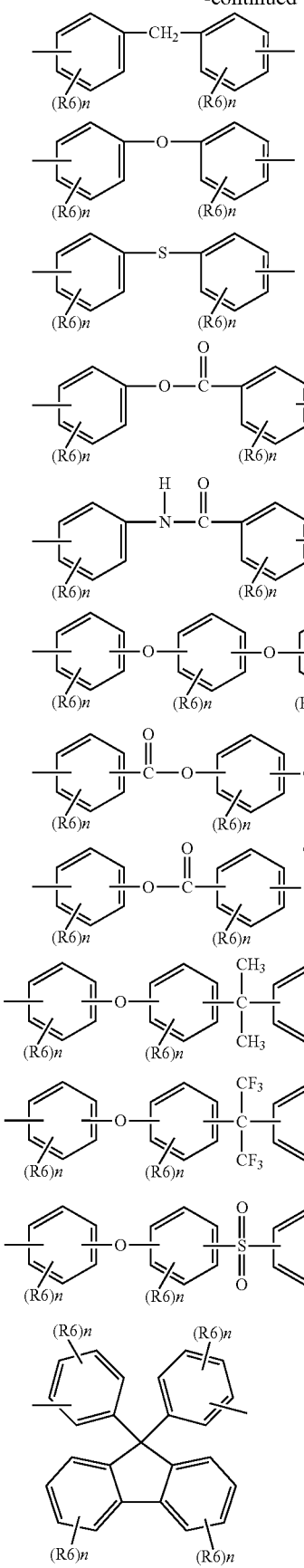

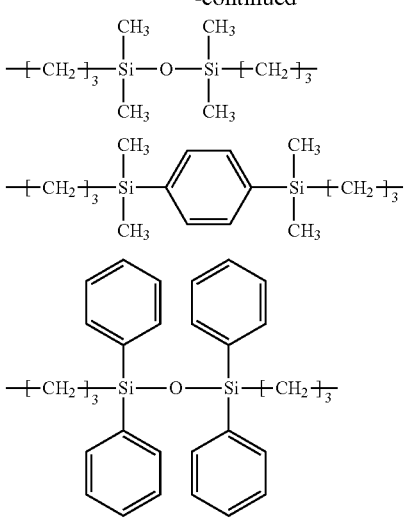

wherein $R_6$ is a monovalent group selected from the group consisting of a hydrogen atom, a fluorine atom, a hydrocarbon group having 1 to 10 carbon atoms, and a fluorine-containing hydrocarbon group having 1 to 10 carbon atoms, and n is an integer selected from 0 to 4. The structures of $Y_1$ may be one or a combination of two or more thereof. The $Y_1$ group having a structure represented by the formula (21) is preferable from the viewpoint of achieving both heat resistance and photosensitivity.

Of the structures represented by the formula (21), the $Y_1$ group is preferably a structure represented by the following formula (21A), (21B), or (21C):

[Chemical Formula 86]

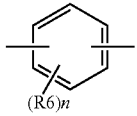

(21A)

[Chemical Formula 87]

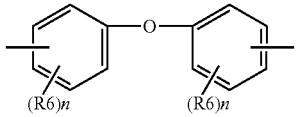

(21B)

[Chemical Formula 88]

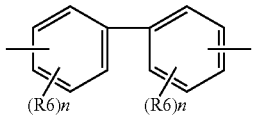

(21C)

from the viewpoints of chemical resistance, resolution, and suppression of voids after the high temperature storage test, and particularly preferably a structure represented by the following formula (21b) or (21c):

[Chemical Formula 89]

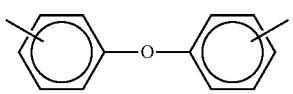
(21b)

[Chemical Formula 90]

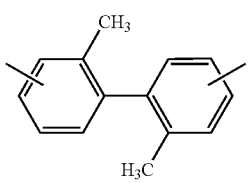
(21c)

$L_1$ in the general formula (3) is preferably a hydrogen atom or a methyl group, and $L_2$ and $L_3$ are preferably a hydrogen atom from the viewpoint of photosensitivity. $m_1$ is an integer of 2 or more and 10 or less, and preferably an integer of 2 or more and 4 or less from the viewpoint of photosensitivity.

In an embodiment, the polyimide precursor (A) is preferably a polyimide precursor including a structural unit represented by the following general formula (4):

[Chemical Formula 91]

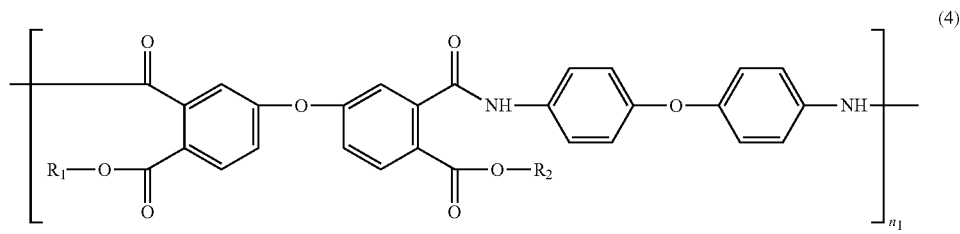
(4)

wherein $R_1$ and $R_2$ are each independently a hydrogen atom or a monovalent organic group, at least one of $R_1$ and $R_2$ is a monovalent organic group, and $n_1$ is an integer of 2 to 150.

In the general formula (4), at least one of $R_1$ and $R_2$ is more preferably a monovalent organic group represented by the general formula (3). When the polyimide precursor (A) includes a polyimide precursor represented by the general formula (4), particularly the effect of resolution becomes high.

In an embodiment, the polyimide precursor (A) is preferably a polyimide precursor including a structural unit represented by the following general formula (5):

[Chemical Formula 92]

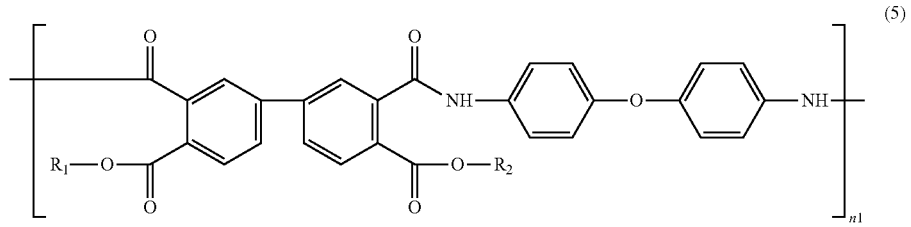
(5)

wherein $R_1$ and $R_2$ are each independently a hydrogen atom or a monovalent organic group, at least one of $R_1$ and $R_2$ is a monovalent organic group, and $n_1$ is an integer of 2 to 150.

In the general formula (5), at least one of $R_1$ and $R_2$ is more preferably a monovalent organic group represented by the general formula (3). When the polyimide precursor (A) includes a polyimide precursor represented by the general formula (5), in addition to a polyimide precursor represented by the general formula (4), the effect of resolution becomes higher.

It is particularly preferable from the viewpoints of chemical resistance, resolution, and suppression of voids after the high temperature storage evaluation that the polyimide precursor (A) simultaneously includes structural units represented by the general formulas (4) and (5) or a copolymer of structural units represented by the general formulas (4) and (5). When the polyimide precursor (A) is a copolymer of structural units represented by the general formulas (4) and (5), $R_1$, $R_2$, and $n_1$ in one of the formulas may be the same as or different from $R_1$, $R_2$, and $n_1$ of the other formula.

In an embodiment, the polyimide precursor (A) is preferably a polyimide precursor including a structural unit represented by the following general formula (6):

[Chemical Formula 93]

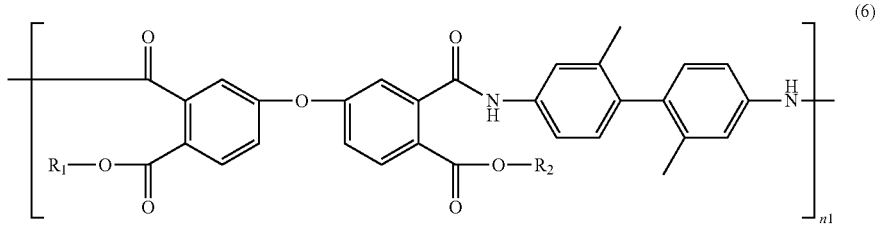

wherein $R_1$ and $R_2$ are each independently a hydrogen atom or a monovalent organic group, at least one of $R_1$ and $R_2$ is a monovalent organic group, and $n_1$ is an integer of 2 to 150.

In the general formula (6), at least one of $R_1$ and $R_2$ is more preferably a monovalent organic group represented by the general formula (3). When the polyimide precursor (A) includes a polyimide precursor represented by the general formula (6), particularly the effect of chemical resistance becomes high.

(A) Method for Preparing Polyimide Precursor

The polyimide precursor (A) is obtained by first reacting a tetracarboxylic dianhydride having a tetravalent organic group $X_1$ in the general formula (2) with alcohols having a photopolymerizable unsaturated double bond and optionally alcohols having no unsaturated double bond to prepare a partially esterified tetracarboxylic acid (hereinafter also referred to as acid/ester body), and then subjecting this to amide polycondensation with diamines having a divalent organic group $Y_1$ in the general formula (2).

(Preparation of Acid/Ester Body)

In the present embodiment, examples of the tetracarboxylic dianhydride having a tetravalent organic group $X_1$ which is preferably used for preparing the polyimide precursor (A) include, but are not limited to, tetracarboxylic dianhydrides shown in the above general formula (20), for example, pyromellitic anhydride, diphenyl ether-3,3',4,4'-tetracarboxylic dianhydride, benzophenone-3,3',4,4'-tetracarboxylic dianhydride, biphenyl-3,3',4,4'-tetracarboxylic dianhydride, diphenylsulfone-3,3',4,4'-tetracarboxylic dianhydride, diphenylmethane-3,3',4,4'-tetracarboxylic dianhydride, 2,2-bis(3,4-phthalic anhydride)propane, and 2,2-bis (3,4-phthalic anhydride)-1,1,1,3,3,3-hexafluoropropane, and preferably pyromellitic anhydride, diphenyl ether-3,3',4,4'-tetracarboxylic dianhydride, benzophenone-3,3',4,4'-tetracarboxylic dianhydride, and biphenyl-3,3',4,4'-tetracarboxylic dianhydride. These may be used alone, or a mixture of two or more thereof may be used.

In the present embodiment, examples of the alcohols having a photopolymerizable unsaturated double bond, which are preferably used for preparing the polyimide precursor (A), include 2-acryloyloxyethyl alcohol, 1-acryloyloxy-3-propyl alcohol, 2-acrylamideethyl alcohol, methylol vinyl ketone, 2-hydroxyethyl vinyl ketone, 2-hydroxy-3-methoxypropyl acrylate, 2-hydroxy-3-butoxypropyl acrylate, 2-hydroxy-3-phenoxypropyl acrylate, 2-hydroxy-3-butoxypropyl acrylate, 2-hydroxy-3-t-butoxypropyl acrylate, 2-hydroxy-3-cyclohexyloxypropyl acrylate, 2-methacryloyloxyethyl alcohol, 1-methacryloyloxy-3-propyl alcohol, 2-methacrylamide ethyl alcohol, methylol vinyl ketone, 2-hydroxyethyl vinyl ketone, 2-hydroxy-3-methoxypropyl methacrylate, 2-hydroxy-3-butoxypropyl methacrylate, 2-hydroxy-3-phenoxypropyl methacrylate, 2-hydroxy-3-butoxypropyl methacrylate, 2-hydroxy-3-t-butoxypropyl methacrylate, and 2-hydroxy-3-cyclohexyloxypropyl methacrylate.

It is also possible to use, as the alcohols having a photopolymerizable unsaturated double bond, for example, alcohols having no unsaturated double bond, such as methanol, ethanol, n-propanol, isopropanol, n-butanol, tert-butanol, 1-pentanol, 2-pentanol, 3-pentanol, neopentyl alcohol, 1-heptanol, 2-heptanol, 3-heptanol, 1-octanol, 2-octanol, 3-octanol, 1-nonanol, triethylene glycol monomethyl ether, triethylene glycol monoethyl ether, tetraethylene glycol monomethyl ether, tetraethylene glycol monoethyl ether, and benzyl alcohol after being partially mixed.

A non-photosensitive polyimide precursor prepared with only the alcohols having no unsaturated double bond may be used as the polyimide precursor after being mixed with a photosensitive polyimide precursor. From the viewpoint of resolution, the amount of the non-photosensitive polyimide precursor is preferably 200 parts by mass or less based on 100 parts by mass of the photosensitive polyimide precursor.

By stirring and dissolving the above-mentioned suitable tetracarboxylic dianhydride and alcohols in a solvent, which is mentioned later, at a temperature of 20 to 50° C. for 4 to 10 hours in the presence of a basic catalyst such as pyridine, followed by mixing, the esterification reaction of the acid anhydride proceeds, thus making it possible to obtain a desired acid/ester body.

(Preparation of Polyimide Precursor)

An appropriate dehydration-condensation agent, for example, dicyclohexylcarbodiimide, 1-ethoxycarbonyl-2- ethoxy-1,2-dihydroquinoline, 1,1-carbonyldioxy-di-1,2,3-benzotriazole, or N,N'-disuccinimidyl carbonate is mixed in the acid/ester body (typically in a solution state of being dissolved in the above reaction solvent) under ice cooling, thereby converting the acid/ester body into a polyacid anhydride. To this, those obtained by separately dissolving or dispersing diamines having a divalent organic group $Y_1$ to be preferably used in the present invention in a solvent are added dropwise, and then amide polycondensation of the mixture is performed, thus making it possible to obtain a target polyimide precursor. Alternatively, a target polyimide precursor can be obtained by reacting the acid/ester body with a diamine compound in the presence of a base such as pyridine after acid chloridization of an acid moiety using thionyl chloride.

Examples of the diamines having a divalent organic group $Y_1$ which are preferably used in the present embodiment include, but are not limited to, diamines having a structure represented by the above general formula (21), for example, p-phenylenediamine, m-phenylenediamine, 4,4-diaminodiphenyl ether, 3,4'-diaminodiphenyl ether, 3,3'-diaminodiphenyl ether, 4,4'-diaminodiphenyl sulfide, 3,4'-diaminodiphenyl sulfide, 3,3'-diaminodiphenyl sulfide, 4,4'-diaminodiphenylsulfone, 3,4'-diaminodiphenylsulfone, 3,3'-diaminodiphenylsulfone, 4,4'-diaminobiphenyl, 3,4'-diaminobiphenyl, 3,3'-diaminobiphenyl, 4,4'-diaminobenzophenone, 3,4'-diaminobenzophenone, 3,3'-diaminobenzophenone, 4,4'-diaminodiphenylmethane, 3,4'-diaminodiphenylmethane, 3,3'-diaminodiphenylmethane, 1,4-bis(4-aminophenoxy)benzene, 1,3-bis(4-aminophenoxy)benzene, 1,3-bis(3-aminophenoxy)benzene, bis[4-(4-aminophenoxy)phenyl]sulfone, bis[4-(3-aminophenoxy)phenyl]sulfone, 4,4-bis(4-aminophenoxy)biphenyl, 4,4-bis(3-aminophenoxy)biphenyl, bis[4-(4-aminophenoxy)phenyl]ether, bis[4-(3-aminophenoxy)phenyl]ether, 1,4-bis(4-aminophenyl)benzene, 1,3-bis(4-aminophenyl)benzene, 9,10-bis(4-aminophenyl)anthracene, 2,2-bis(4-aminophenyl)propane, 2,2-bis(4-aminophenyl)hexafluoropropane, 2,2-bis[4-(4-aminophenoxy)phenyl]propane, 2,2-bis[4-(4-aminophenoxy)phenyl]hexafluoropropane, 1,4-bis(3-aminopropyldimethylsilyl)benzene, ortho-tolidine sulfone, 9,9-bis(4-aminophenyl)fluorene, and those in which hydrogen atoms on the benzene ring are partially substituted with a methyl group, an ethyl group, a hydroxymethyl group, a hydroxyethyl group, a halogen atom or the like, for example, 3,3'-dimethyl-4,4'-diaminobiphenyl, 2,2'-dimethyl-4,4'-diaminobiphenyl, 3,3'-dimethyl-4,4'-diaminodiphenylmethane, 2,2'-dimethyl-4,4'-diaminodiphenylmethane, 3,3'-dimethoxy-4,4'-diaminobiphenyl, 3,3'-dichloro-4,4'-diaminobiphenyl, and mixtures thereof.

After completion of the amide polycondensation reaction, water absorption by-products of the dehydration-condensation agent coexisting in the reaction solution are optionally removed by filtration, and then a poor solvent such as water, an aliphatic lower alcohol, or a mixed solution thereof is charged into a solution containing a polymer component, thereby precipitating the polymer component and, after purifying the polymer by optionally repeating an operation such as redissolution or reprecipitation process, vacuum drying is performed to isolate the target polyimide precursor. To improve the degree of purification, a solution of this polymer may be passed through a column filled with anion and/or cation exchange resins swollen with an appropriate organic solvent to remove ionic impurities.

The molecular weight of the polyimide precursor (A) is preferably 8,000 to 150,000, and more preferably 9,000 to 50,000, when measured by polystyrene-equivalent weight-average molecular weight by gel permeation chromatography. When the weight-average molecular weight is 8,000 or more, the mechanical physical properties are satisfactory, and when the weight-average molecular weight is 150,000 or less, the dispersibility in a developer is satisfactory, and the resolution of a relief pattern thereof is satisfactory. Tetrahydrofuran and N-methyl-2-pyrrolidone are recommended as developing solvents for gel permeation chromatography. The weight-average molecular weight is also determined from a calibration curve obtained using standard monodisperse polystyrene. As the standard monodisperse polystyrene, it is recommended to select from the organic solvent-based standard sample STANDARD SM-105 manufactured by Showa Denko K.K.

(B) Photopolymerization Initiator

The photopolymerization initiator (B) to be used in the present embodiment will be described. The photopolymerization initiator is preferably a photoradical polymerization initiator, and examples thereof include, but are not limited to, benzophenone derivatives such as benzophenone, methyl o-benzoylbenzoate, 4-benzoyl-4'-methyl diphenyl ketone, dibenzyl ketone, and fluorenone; acetophenone derivatives such as 2,2'-diethoxyacetophenone, 2-hydroxy-2-methyl-propiophenone, and 1-hydroxycyclohexyl phenyl ketone; thioxantone derivatives such as thioxanthone, 2-methylthioxanthone, 2-isopropylthioxanthone, and diethylthioxanthone; benzyl derivatives such as benzyl, benzyl dimethyl ketal, and benzyl-β-methoxyethyl acetal; benzoin derivatives such as benzoin and benzoin methyl ether; oximes such as 1-phenyl-1,2-butandion-2-(o-methoxycarbonyl)oxime, 1-phenyl-1,2-propanedione-2-(o-methoxycarbonyl)oxime, 1-phenyl-1,2-propanedione-2-(o-ethoxycarbonyl)oxime, 1-phenyl-1,2-propanedione-2-(o-benzoyl)oxime, 1,3-diphenylpropanthrion-2-(o-ethoxycarbonyl)oxime, and 1-phenyl-3-ethoxypropanetrione-2-(o-benzoyl)oxime; N-arylglycines such as N-phenylglycine; peroxides such as benzoyl perchloride; aromatic biimidazoles; titanocenes; and photoacid generators such as α-(n-octanesulfonyloxyimino)-4-methoxybenzyl cyanide. Of these photopolymerization initiators, oximes are more preferable particularly from the viewpoint of light sensitivity.

The amount of the photopolymerization initiator (B) to be mixed is preferably 0.1 parts by mass or more and 20 parts by mass or less, and more preferably 1 part by mass or more and 8 parts by mass or less based on 100 parts by mass of the polyimide precursor (A). The mixing amount is preferably 0.1 parts by mass or more from the viewpoint of light sensitivity or patternability, and more preferably 20 parts by mass or less from the viewpoint of physical properties of the photosensitive resin layer after curing of the negative photosensitive resin composition.

(C) Silane Coupling Agent Having Specific Structure

The silane coupling agent having a specific structure (C) to be used in the present embodiment will be described.

The silane coupling agent having a specific structure (C) according to the present embodiment has a structure represented by the following general formula (1):

[Chemical Formula 94]

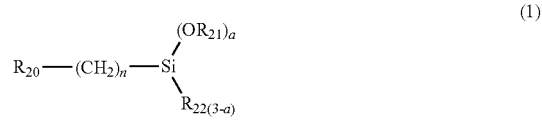

(1)

wherein a is an integer of 1 to 3, n is an integer of 1 to 6, $R_{21}$ is each independently an alkyl group having 1 to 4 carbon atoms, $R_{22}$ is a hydroxyl group or an alkyl group having 1 to 4 carbon atoms, and $R_{20}$ is at least one selected from the group consisting of an epoxy group, a phenylamino group, and a ureide group.

In the general formula (1), a is not limited as long as it is an integer of 1 to 3, and a is preferably 2 or 3, and more preferably 3, from the viewpoint of adhesion to the metal rewiring layer.

n is not limited as long as it is an integer of 1 to 6, and n is preferably 1 or more and 4 or less from the viewpoint of adhesion to the metal rewiring layer, and preferably 2 or more and 5 or less from the viewpoint of developability.

$R_{21}$ is not limited as long as it is an alkyl group having 1 to 4 carbon atoms. Examples thereof include a methyl group, an ethyl group, a propyl group, an isopropyl group, a butyl group, an isobutyl group, and a t-butyl group.

$R_{22}$ is not limited as long as it is a hydroxyl group or an alkyl group having 1 to 4 carbon atoms. Examples of the alkyl group having 1 to 4 carbon atoms include the same alkyl groups as for $R_{21}$.

$R_{20}$ is not limited as long as it is a substituent including an epoxy group, a phenylamino group, a ureide group, and an isocyanate group. Of these, at least one selected from the group consisting of a substituent including a phenylamino group and a substituent including a ureide group is preferable from the viewpoints of developability and adhesion of the metal rewiring layer, and a substituent including a phenylamino group is more preferable.

Examples of the silane coupling agent having an epoxy group include 2-(3,4-epoxycyclohexyl)ethyltrimethoxysilane, 3-glycidoxypropylmethyldimethoxysilane, 3-glycidoxypropyltrimethoxysilane, 3-glycidoxypropylmethyldiethoxysilane, and 3-glycidoxypropyltriethoxysilane.

Examples of the silane coupling agent having a phenylamino group include N-phenyl-3-aminopropyltrimethoxysilane.

Examples of the silane coupling agent having a ureido group include 3-ureidopropyltrialkoxysilane.

Examples of the silane coupling agent having an isocyanate group include 3-isocyanatopropyltriethoxysilane.

(D) Organic Solvent Having Specific Structure

The organic solvent according to the present embodiment is not limited as long as it includes at least one selected from the group consisting of γ-butyrolactone, dimethyl sulfoxide, tetrahydrofurfuryl alcohol, ethyl acetoacetate, dimethyl succinate, dimethyl malonate, and ε-caprolactone. By including the above organic solvent, the adhesion to the sealing material can be sufficiently exhibited. Of these, γ-butyrolactone, dimethyl sulfoxide, tetrahydrofurfuryl alcohol, ethyl acetoacetate, and ε-caprolactone are preferable from the viewpoint of solubility of the polyimide precursor (A), and it is more preferable to include at least two selected organic solvents from the above group from the viewpoint of suppressing copper surface voids.

It is not clear why the organic solvent having a specific structure according to the present embodiment has satisfactory adhesion to the sealing material, but the present inventors infer as follows.

There have hitherto been used, as an organic solvent for dissolving the photosensitive resin composition including a polyimide precursor, amide-based solvents such as N-methyl-2-pyrrolidone, N,N-dimethylacetamide, and N,N-dimethylformamide. Although these solvents have extremely high dissolving ability of the polyimide precursor, when the heat curing temperature required in recent years is low (for example, lower than 200° C.), a large amount of the solvent tends to remain in the film because of high affinity with the polyimide to be produced. Therefore, the performance deteriorates due to the interaction with the silane coupling agent having a specific structure (C). Meanwhile, by including the above solvent, even if the heat curing temperature is low, the solvent remaining on the film after heat curing can be sufficiently reduced, leading to satisfactory adhesion to the sealing material.

In the negative photosensitive resin composition of the present embodiment, the amount of the organic solvent to be used is preferably within a range of 100 to 1,000 parts by mass, more preferably 120 to 700 parts by mass, and still more preferably 125 to 500 parts by mass, based on 100 parts by mass of the polyimide precursor (A).

(E) Thermal Base Generator

The negative photosensitive resin composition of the present embodiment may further include components other than the above components (A) to (D). In particular, it is more preferable to include (E) a thermal base generator in order to cope with reduction of the heat curing temperature.

The base generator refers to a compound which generates a base when heated. By including the thermal base generator, the imidization of the photosensitive resin composition can be further promoted.

The type of the thermal base generator is not particularly limited, and examples thereof include an amine compound protected by a tert-butoxycarbonyl group and a thermal base generator disclosed in WO 2017/038598. However, the thermal base generator is not limited thereto, and other known thermal base generator can be used.

Examples of the amine compound protected by a tert-butoxycarbonyl group include, but are not limited to, ethanolamine, 3-amino-1-propanol, 1-amino-2-propanol, 2-amino-1-propanol, 4-amino-1-butanol, 2-amino-1-butanol, 1-amino-2-butanol, 3-amino-2,2-dimethyl-1-propanol, 4-amino-2-methyl-1-butanol, valinol, 3-amino-1,2-propanediol, 2-amino-1,3-propanediol, tyramine, norephedrine, 2-amino-1-phenyl-1,3-propanediol, 2-aminocyclohexanol, 4-aminocyclohexanol, 4-aminocyclohexaneethanol, 4-(2-aminoethyl)cyclohexanol, N-methylethanolamine, 3-(methylamino)-1-propanol, 3-(isopropylamino)propanol, N-cyclohexylethanolamine, α-[2-(methylamino)ethyl]benzyl alcohol, diethanolamine, diisopropanolamine, 3-pyrrolidinol, 2-pyrrolidinemethanol, 4-hydroxypiperidine, 3-hydroxypiperidine, 4-hydroxy-4-phenylpiperidine, 4-(3-hydroxyphenyl)piperidine, 4-piperidinemethanol, 3-piperidinemethanol, 2-piperidinemethanol, 4-piperidineethanol, 2-piperidineethanol, 2-(4-piperidyl)-2-propanol, 1,4-butanolbis(3-aminopropyl)ether, 1,2-bis(2-aminoethoxy)ethane, 2,2'-oxybis(ethylamine), 1,14-diamino-3,6,9,12-tetraoxatetradecane, 1-aza-15-crown 5-ether, diethylene glycol bis(3-aminopropyl)ether, 1,11-diamino-3,6,9-trioxaundecane, or compounds in which an amino group of amino acid and derivatives thereof is protected by a tert-butoxycarbonyl group.

The amount of the thermal base generator (E) to be mixed is preferably 0.1 parts by mass or more and 30 parts by mass or less, and more preferably 1 part by mass or more and 20 parts by mass or less, based on 100 parts by mass of the polyimide precursor (A). The mixing amount is preferably 0.1 parts by mass or more from the viewpoint of imidization promoting effect, and preferably 20 parts by mass or less from the viewpoint of physical properties of the photosensitive resin layer after curing of the negative photosensitive resin composition.

The negative photosensitive resin composition of the present embodiment may further include components other than the above components (A) to (E).

Examples of the components other than the components (A) to (E) include, but are not limited to, nitrogen-containing heterocyclic compounds, hindered phenol compounds, organotitanium compounds, sensitizers, photopolymerizable unsaturated monomers, and thermal polymerization inhibitors.

<Nitrogen-Containing Heterocyclic Compound>

When a cured film is formed on a substrate made of copper or a copper alloy using the negative photosensitive resin composition of the present embodiment, the photosensitive resin composition may optionally include a nitrogen-containing heterocyclic compound in order to suppress the discoloration on copper. Specific examples thereof include azole compounds and purine derivatives.

Examples of the azole compound include 1H-triazole, 5-methyl-1H-triazole, 5-ethyl-1H-triazole, 4,5-dimethyl-1H-triazole, 5-phenyl-1H-triazole, 4-t-butyl-5-phenyl-1H-triazole, 5-hydroxyphenyl-1H-triazole, phenyltriazole, p-ethoxyphenyltriazole, 5-phenyl-1-(2-dimethylaminoethyl) triazole, 5-benzyl-1H-triazole, hydroxyphenyltriazole, 1,5-dimethyltriazole, 4,5-diethyl-1H-triazole, 1H-benzotriazole, 2-(5-methyl-2-hydroxyphenyl)benzotriazole, 2-[2-hydroxy-3,5-bis(a,a-dimethylbenzyl)phenyl]-benzotriazole, 2-(3,5-di-t-butyl-2-hydroxyphenyl)benzotriazole, 2-(3-t-butyl-5-methyl-2-hydroxyphenyl)-benzotriazole, 2-(3,5-di-t-amyl-2-hydroxyphenyl)benzotriazole, 2-(2'-hydroxy-5'-t-octylphenyl)benzotriazole, hydroxyphenylbenzotriazole, tolyltriazole, 5-methyl-1H-benzotriazole, 4-methyl-1H-benzotriazole, 4-carboxy-1H-benzotriazole, 5-carboxy-1H-benzotriazole, 1H-tetrazole, 5-methyl-1H-tetrazole, 5-phenyl-1H-tetrazole, 5-amino-1H-tetrazole, and 1-methyl-1H-tetrazole.

Particularly preferably, tolyltriazole, 5-methyl-1H-benzotriazole, and 4-methyl-1H-benzotriazole are exemplified. These azole compounds may be used alone, or a mixture of two or more thereof may be used.

Specific examples of the purine derivative include purine, adenine, guanine, hypoxanthine, xanthine, theobromine, caffeine, uric acid, isoguanine, 2,6-diaminopurine, 9-methyladenine, 2-hydroxyadenine, 2-methyladenine, 1-methyladenine, N-methyladenine, N,N-dimethyladenine, 2-fluoroadenine, 9-(2-hydroxyethyl)adenine, guanineoxime, N-(2-hydroxyethyl)adenine, 8-aminoadenine, 6-amino-8-phenyl-9H-purine, 1-ethyladenine, 6-ethylaminopurine, 1-benzyladenine, N-methylguanine, 7-(2-hydroxyethyl)guanine, N-(3-chlorophenyl)guanine, N-(3-ethylphenyl)guanine, 2-azaadenine, 5-azaadenine, 8-azaadenine, 8-azaguanine, 8-azapurine, 8-azaxanthine, 8-azahypoxanthine, and derivatives thereof.

When the negative photosensitive resin composition includes the above-mentioned azole compound or purine derivative, the mixing amount is preferably 0.1 to 20 parts by mass, and more preferably 0.5 to 5 parts by mass, based on 100 parts by mass of the polyimide precursor (A) from the viewpoint of light-sensitivity properties. When the amount of the azole compound to be mixed is 0.1 parts by mass or more based on 100 parts by mass of the polyimide precursor (A), in the case of forming the negative photosensitive resin composition of the present embodiment on copper or a copper alloy, the discoloration of the surface of copper or copper alloy is suppressed. When the amount is 20 parts by mass or less, the light sensitivity is excellent.

<Hindered Phenol Compound>

The negative photosensitive resin composition may optionally include a hindered phenol compound in order to suppress the discoloration on the copper surface. Examples of the hindered phenol compound include, but are not limited to, 2,6-di-t-butyl-4-methylphenol, 2,5-di-t-butyl-hydroquinone, octadecyl-3-(3,5-di-t-butyl-4-hydroxyphenyl) propionate, isooctyl-3-(3,5-di-t-butyl-4-hydroxyphenyl)propionate, 4,4'-methylenebis(2,6-di-t-butylphenol), 4,4'-thio-bis(3-methyl-6-t-butylphenol), 4,4'-butylidene-bis(3-methyl-6-t-butylphenol), triethyleneglycol-bis[3-(3-t-butyl-5-methyl-4-hydroxyphenyl)propionate], 1,6-hexanediol-bis[3-(3,5-di-t-butyl-4-hydroxyphenyl)propionate], 2,2-thio-diethylenebis[3-(3,5-di-t-butyl-4-hydroxyphenyl) propionate], N,N'-hexamethylenebis(3,5-di-t-butyl-4-hydroxy-hydrocinnamamide), 2,2'-methylene-bis(4-methyl-6-t-butylphenol), 2,2'-methylene-bis(4-ethyl-6-t-butylphenol), pentaerythrityl-tetrakis[3-(3,5-di-t-butyl-4-hydroxyphenyl)propionate], tris-(3,5-di-t-butyl-4-hydroxybenzyl)-isocyanurate, 1,3,5-trimethyl-2,4,6-tris(3,5-di-t-butyl-4-hydroxybenzyl)benzene, 1,3,5-tris(3-hydroxy-2,6-dimethyl-4-isopropylbenzyl)-1,3,5-triazine-2,4,6-(1H,3H,5H)-trione, 1,3,5-tris(4-t-butyl-3-hydroxy-2,6-dimethylbenzyl)-1,3,5-triazine-2,4,6-(1H,3H,5H)-trione, 1,3,5-tris(4-s-butyl-3-hydroxy-2,6-dimethylbenzyl)-1,3,5-triazine-2,4,6-(1H,3H,5H)-trione, 1,3,5-tris[4-(1-ethylpropyl)-3-hydroxy-2,6-dimethylbenzyl]-1,3,5-triazine-2,4,6-(1H,3H,5H)-trione, 1,3,5-tris[4-triethylmethyl-3-hydroxy-2,6-dimethylbenzyl]-1,3,5-triazine-2,4,6-(1H,3H,5H)-trione, 1,3,5-tris(3-hydroxy-2,6-dimethyl-4-phenylbenzyl)-1,3,5-triazine-2,4,6-(1H,3H,5H)-trione, 1,3,5-tris(4-t-butyl-3-hydroxy-2,5,6-trimethylbenzyl)-1,3,5-triazine-2,4,6-(1H,3H,5H)-trione, 1,3,5-tris(4-t-butyl-5-ethyl-3-hydroxy-2,6-dimethylbenzyl)-1,3,5-triazine-2,4,6-(1H,3H,5H)-trione, 1,3,5-tris(4-t-butyl-6-ethyl-3-hydroxy-2-methylbenzyl)-1,3,5-triazine-2,4,6-(1H,3H,5H)-trione, 1,3,5-tris(4-t-butyl-6-ethyl-3-hydroxy-2,5-dimethylbenzyl)-1,3,5-triazine-2,4,6-(1H,3H,5H)-trione, 1,3,5-tris(4-t-butyl-5,6-diethyl-3-hydroxy-2-methylbenzyl)-1,3,5-triazine-2,4,6-(1H,3H,5H)-trione, 1,3,5-tris(4-t-butyl-3-hydroxy-2-methylbenzyl)-1,3,5-triazine-2,4,6-(1H,3H,5H)-trione, 1,3,5-tris(4-t-butyl-3-hydroxy-2,5-dimethylbenzyl)-1,3,5-triazine-2,4,6-(1H,3H,5H)-trione, and 1,3,5-tris(4-t-butyl-5-ethyl-3-hydroxy-2-methylbenzyl)-1,3,5-triazine-2,4,6-(1H,3H,5H)-trione. Of these, 1,3,5-tris(4-t-butyl-3-hydroxy-2,6-dimethylbenzyl)-1,3,5-triazine-2,4,6-(1H,3H,5H)-trione or the like is particularly preferable.

The amount of the hindered phenol compound to be mixed is preferably 0.1 to 20 parts by mass, and more preferably 0.5 to 10 parts by mass, based on 100 parts by mass of the polyimide precursor (A) from the viewpoint of light-sensitivity properties. When the mixing amount of the hindered phenol compound is 0.1 parts by mass or more based on 100 parts by mass of the polyimide precursor (A), in the case of forming the negative photosensitive resin composition of the present embodiment on, for example, copper or a copper alloy, the discoloration and corrosion of the copper or copper alloy are prevented. When the amount is 20 parts by mass or less, the light sensitivity is excellent.

<Organotitanium Compound>

The negative photosensitive resin composition of the present embodiment may include an organotitanium compound. By including the organotitanium compound, it is possible to form a photosensitive resin layer having excellent chemical resistance even when cured at low temperature.

Examples of the organotitanium compound which can be used include those in which an organic chemical is bonded to a titanium atom via a covalent bond or an ionic bond.

Specific examples of the organotitanium compound are shown in I) to VII) below:

I) Titanium chelate compounds: Of these, a titanium chelate having two or more alkoxy groups is more preferable since the storage stability of the negative photosensitive resin composition and a satisfactory pattern can be obtained. Specific examples are titanium bis(triethanolamine)diisopropoxide, titanium di(n-butoxide) bis(2,4-pentanedionate, titaniumdiisopropoxide bis(2,4-pentanedionate), titaniumdiisopropoxide bis(tetramethylheptanedionate), and titaniumdiisopropoxide bis(ethyl acetoacetate).

II) Tetraalkoxy titanium compounds: for example, titanium tetra(n-butoxide), titanium tetraethoxide, titanium tetra(2-ethylhexoide), titanium tetraisobutoxide, titanium tetraisopropoxide, titanium tetramethoxide, titanium tetramethoxypropoxide, titanium tetramethylphenoxide, titanium tetra(n-nonyloxide), titanium tetra(n-propoxide), titanium tetrastearoxide, and titanium tetrakis[bis{2,2-(allyloxymethyl)butoxide}].

III) Titanocene compounds: for example, pentamethylcyclopentadienyl titanium trimethoxide, bis(η5-2,4-cyclopentadien-1-yl)bis(2,6-difluorophenyl)titanium, and bis (η5-2,4-cyclopentadien-1-yl)bis(2,6-difluoro-3-(1H-pyrrol-1-yl) phenyl)titanium.

IV) Monoalkoxytitanium compounds: for example, titanium tris(dioctyl phosphate) isopropoxide and titanium tris (dodecylbenzene sulfonate)isopropoxide.

V) Titanium oxide compounds: for example, titanium oxide bis(pentanionate), titanium oxide bis(tetramethylheptandionate), and phthalocyanine titanium oxide.

VI) Titanium tetraacetylacetonate compounds: for example, titanium tetraacetylacetonate.

VII) Titanate coupling agents: for example, isopropyltridodecylbenzenesulfonyl titanate.

Of these, the organotitanium compound is preferably at least one compound selected from the group consisting of the above-mentioned I) titanium chelate compounds, II) tetraalkoxytitanium compounds, and III) titanocene compounds from the viewpoint of exhibiting more satisfactory chemical resistance, and particularly preferably titanium diisopropoxide bis(ethylacetoacetate), titanium tetra(n-butoxide), and bis(η5-2,4-cyclopentadien-1-yl)bis(2,6-difluoro-3-(1H-pyrrol-1-yl)phenyl)titanium.

When the organotitanium compound is mixed, the mixing amount is preferably 0.05 to 10 parts by mass, and more preferably 0.1 to 2 parts by mass, based on 100 parts by mass of the polyimide precursor (A). When the mixing amount is 0.05 parts by mass or more, satisfactory heat resistance and chemical resistance are exhibited. When the mixing amount is 10 parts by mass or less, the storage stability is excellent.

<Sensitizer>

The negative photosensitive resin composition of the present embodiment may optionally include a sensitizer in order to improve the light sensitivity. Examples of the sensitizer include Michler's ketone, 4,4'-bis(diethylamino) benzophenone, 2,5-bis(4'-diethylaminobenzal)cyclopentane, 2,6-bis(4'-diethylaminobenzal)cyclohexanone, 2,6-bis (4'-diethylaminobenzal)-4-methylcyclohexanone, 4,4'-bis (dimethylamino)chalcone, 4,4'-bis(diethylamino)chalcone, p-dimethylaminocinnamylidene indanone, p-dimethylaminobenzylidene indanone, 2-(p-dimethylaminophenylbiphenylene)-benzothiazole, 2-(p-dimethylaminophenylvinylene) benzothiazole, 2-(p-dimethylaminophenylvinylene) isonaphthiazole, 1,3-bis(4'-dimethylaminobenzal)acetone, 1,3-bis(4'-diethylaminobenzal)acetone, 3,3'-carbonyl-bis(7-diethylaminocumarin), 3-acetyl-7-dimethylaminocumarin, 3-ethoxycarbonyl-7-dimethylaminocumarin, 3-benzyloxycarbonyl-7-dimethylaminocumarin, 3-methoxycarbonyl-7-diethylaminocumarin, 3-ethoxycarbonyl-7-diethylaminocumarin, N-phenyl-N'-ethylethanolamine, N-phenyldiethanolamine, N-p-tolyldiethanolamine, N-phenylethanolamine, 4-morpholinobenzophenone, isoamyl dimethylaminobenzoate, isoamyl diethylaminobenzoate, 2-mercaptobenzimidazole, 1-phenyl-5-mercaptotetrazole, 2-mercaptobenzothiazole, 2-(p-dimethylaminostyryl)benzoxazole, 2-(p-dimethylaminostyryl)benzthiazole, 2-(p-dimethylaminostyryl)naphtho(1,2-d)thiazole, and 2-(p-dimethylaminobenzoyl)styrene. These sensitizers can be used alone, or in combination of two to five thereof.

When the negative photosensitive resin composition includes a sensitizer for improving the light sensitivity, the mixing amount is preferably 0.1 to 25 parts by mass based on 100 parts by mass of the polyimide precursor (A).

<Photopolymerizable Unsaturated Monomer>

The negative photosensitive resin composition may optionally include a monomer having a photopolymerizable unsaturated bond in order to improve the resolution of the relief pattern. Such a monomer is preferably a (meth)acrylic compound which undergoes a radical polymerization reaction with a photopolymerization initiator, and examples thereof include, but are not particularly limited to, mono- or diacrylates and methacrylates of ethylene glycol or polyethylene glycol, such as diethylene glycol dimethacrylate and tetraethylene glycol dimethacrylate; mono- or diacrylates and methacrylates of propylene glycol or polypropylene glycol; mono-, di-, or triacrylates and methacrylates of glycerol; cyclohexane diacrylate and dimethacrylate; diacrylate and dimethacrylate of 1,4-butanediol; diacrylate and dimethacrylate of 1,6-hexanediol; diacrylate and dimethacrylate of neopentyl glycol; mono- or diacrylates and methacrylates of bisphenol A; benzene trimethacrylate, isobornyl acrylate and methacrylate; acrylamide and derivatives thereof; methacrylamide and derivatives thereof; trimethylolpropane triacrylate and methacrylate; di- or triacrylates and methacrylates of glycerol; di-, tri-, or tetraacrylates and methacrylates of pentaerythritol; and ethylene oxide or propylene oxide adducts of these compounds.

When the photosensitive resin composition includes a photopolymerizable unsaturated monomer for improving the resolution of the relief pattern, the amount of the monomer having a photopolymerizable unsaturated bond to be mixed is preferably 1 to 50 parts by mass based on 100 parts by mass of the polyimide precursor (A).

<Thermal Polymerization Inhibitor>

The negative photosensitive resin composition of the present embodiment may optionally include a thermal polymerization inhibitor in order to improve the viscosity and the stability of the light sensitivity of the negative photosensitive resin composition during storage, particularly in a state of a solution containing a solvent. It is possible to use, as the thermal polymerization inhibitor, hydroquinone, N-nitrosodiphenylamine, p-tert-butyl catechol, phenothiazine, N-phenylnaphthylamine, ethylenediaminetetraacetic acid, 1,2-cyclohexanediaminetetraacetic acid, glycol etherdiaminetetraacetic acid, 2,6-di-tert-butyl-p-methylphenol, 5-nitroso-8-hydroxyquinoline, 1-nitroso-2-naphthol, 2-nitroso-1-naphthol, 2-nitroso-5-(N-ethyl-N-sulfopropylamino)phenol, N-nitroso-N-phenylhydroxylamine ammonium salts, and N-nitroso-N(1-naphthyl) hydroxylamine ammonium salts.

<Method for Producing Cured Relief Pattern, and Semiconductor Device>

The present invention provides a method for producing a cured relief pattern, which comprises (1) a step of applying the above-mentioned negative photosensitive resin composition of the present embodiment onto a substrate to form a photosensitive resin layer on the substrate, (2) a step of exposing the photosensitive resin layer, (3) a step of developing the exposed photosensitive resin layer to form a relief pattern, and (4) a step of heat-treating the relief pattern to form a cured relief pattern.

(1) Photosensitive Resin Layer Formation Step

In this step, the negative photosensitive resin composition of the present embodiment is applied onto a substrate, and if necessary, dried thereafter to form a photosensitive resin layer. It is possible to use, as the application method, methods conventionally used for the application of a photosensitive resin composition, for example, a method of application with a spin coater, a bar coater, a blade coater, a curtain coater, or a screen-printing machine, or a method of spray coating with a spray coater.

If necessary, the coating film containing the negative photosensitive resin composition can be dried. It is possible to use, as the drying method, a method such as air drying, heat drying with an oven or a hot plate, or vacuum drying. Specifically, when air drying or heat drying is performed, drying can be performed under the conditions at 20° C. to 140° C. for 1 minute to 1 hour. In this manner, the photosensitive resin layer (negative photosensitive resin layer) can be formed on the substrate.

(2) Exposing Step

In this step, the negative photosensitive resin layer formed as mentioned above is exposed by an ultraviolet light source or the like through a photomask or reticle having a pattern or directly, using exposure devices such as a contact aligner, a mirror projection, and a stepper.

Thereafter, for the purpose of improving the light sensitivity, post-exposure baking (PEB) and/or pre-development baking according to a combination of an arbitrary temperature and time may be performed, if necessary. The range of baking conditions are preferably as follows: the temperature is 40° C. to 120° C. and the time is 10 seconds to 240 seconds, though the baking is not limited to these ranges as long as various properties of the photosensitive resin composition of the present invention are not inhibited.

(3) Relief Pattern Formation Step

In this step, the unexposed portion of the exposed photosensitive resin layer is developed and removed. It is possible to use, as a developing method for developing a photosensitive resin layer after exposure (irradiation), any method selected from conventionally known methods of developing a photoresist, for example, a rotary spray method, a paddle method, and an immersion method accompanied by an ultrasonic treatment. After development, for the purpose of adjusting the shape of a relief pattern, post-development baking may be performed by a combination of an arbitrary temperature and time, if necessary.

The developer used for development is preferably, for example, a good solvent for a negative photosensitive resin composition, or a combination of a good solvent and a poor solvent. The good solvent is preferably, for example, N-methyl-2-pyrrolidone, N-cyclohexyl-2-pyrrolidone, N,N-dimethylacetamide, cyclopentanone, cyclohexanone, γ-butyrolactone, or α-acetyl-γ-butyrolactone. The poor solvent is preferably, for example, toluene, xylene, methanol, ethanol, isopropyl alcohol, ethyl lactate, propylene glycol methyl ether acetate, or water. When a good solvent and a poor solvent are used as a mixture, it is preferable to adjust the ratio of the poor solvent to the good solvent according to the solubility of the polymer in the negative photosensitive resin composition. Two or more solvents, for example, a plurality of solvents in combination may also be used.

(4) Cured Relief Pattern Formation Step

In this step, the relief pattern obtained by the above development is heated to dilute the photosensitive component, and the polyimide precursor (A) is imidized, thereby converting it into a cured relief pattern composed of polyimide. It is possible to select, as the method of heat-curing, various methods such as those using a hot plate, an oven, and a temperature raising oven capable of setting a temperature program. Heating may be performed, for example, at 170° C. to 400° C. for 30 minutes to 5 hours. Air may be used as an atmosphere gas during heat curing, and an inert gas such as nitrogen or argon may be used.

<Polyimide>

The structure of the polyimide contained in the cured relief pattern formed from the above polyimide precursor composition is represented by the following general formula (8).

[Chemical Formula 95]

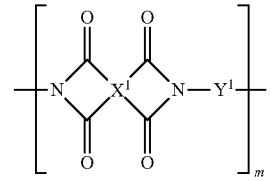

(8)

wherein $X^1$ and $Y^1$ are the same as $X_1$ and $Y_1$ in the general formula (2), and m is a positive integer.

Preferable $X_1$ and $Y_1$ in the general formula (2) are also preferable in the polyimide of the general formula (8) for the same reasons. The number of repeating units m of the general formula (8) may be a positive integer and is not particularly limited, and may be an integer of 2 to 150, or an integer of 3 to 140.

The above-described method for producing a polyimide, which includes a step of converting a negative photosensitive resin composition into a polyimide is also an aspect of the present invention.

<Semiconductor Device>

In the present embodiment, there is also provided a semiconductor device having a cured relief pattern obtained by the above-mentioned method for producing a cured relief pattern. Therefore, it is possible to provide a semiconductor device comprising a base material which is a semiconductor element, and a cured relief pattern of a polyimide formed on the base material by the above-mentioned method for producing a cured relief pattern. The present invention can also be applied to a method for producing a semiconductor device in which a semiconductor element is used as a base material and the above-mentioned method for producing a cured relief pattern is included as a part of a step. The semiconductor device of the present invention can be produced by forming a cured relief pattern formed by the above-mentioned method for producing a cured relief pattern as a surface protective film, an interlayer insulating film, a rewiring insulating film, a protective film for a flip-chip device, or a protective film for a semiconductor device having a bump structure, and combining it with a known method for producing a semiconductor device.

<Display Device>

In the present embodiment, there is provided a display device comprising a display element and a cured film provided on an upper portion of the display element, wherein the cured film is the cured relief pattern mentioned above. The cured relief pattern may be laminated in direct contact with the display element or may be laminated with another layer interposed therebetween. Examples of the cured film include surface protective films, insulating films, and flattening films for TFT liquid crystal display elements and color filter elements, protrusions for MVA type liquid crystal display devices, and partition walls for organic EL element cathodes.

In addition to application to a semiconductor device as mentioned above, the negative photosensitive resin composition of the present invention is also useful in applications such as interlayer insulation of multilayer circuits, cover-coating of flexible copper clad plates, solder resist films, and liquid crystal alignment films.

EXAMPLES

Examples of First Invention

The present invention will be specifically described by way of the following Examples, but the present invention is not limited thereto. In the Examples, Comparative Examples, and Production Examples, physical properties of the photosensitive resin composition were measured and evaluated in accordance with the following methods.

(1) Weight-Average Molecular Weight

The weight-average molecular weight (Mw) of each photosensitive resin was measured by the gel permeation chromatography method (standard polystyrene conversion). The column used for the measurement was a serially connected Shodex 805M/806M manufactured by Showa Denko K.K., the standard monodisperse polystyrene was Shodex STANDARD SM-105 manufactured by Showa Denko K.K., the developing solvent was N-methyl-2-pyrrolidone, and Shodex RI-930 manufactured by Showa Denko K.K. was used as the detector.

(2) Evaluation of Focus Margin

Ti having a thickness of 200 nm and Cu having a thickness of 400 nm were sputtered in this order onto a 6-inch silicon wafer (having a thickness of 625±25 μm, manufactured by Fujimi Electronics Industry Co., Ltd.) using a sputtering device (Model L-440S-FHL, manufactured by CANON ANELVA CORPORATION) to prepare a sputtered Cu wafer substrate.

A negative photosensitive resin composition was spin-coated on the sputtered Cu wafer substrate using a spin coating developer (Model D-Spin60A, manufactured by SOKUDO Co., Ltd.), and then heat-dried at 110° C. for 180 seconds to form a spin-coated film having a thickness of 10 μm±0.2 μm.

This spin-coated film was exposed by an equal-magnification projection exposure device Prisma GHI S/N 5503 (manufactured by Ultratech, Inc.) using a reticle with a test pattern having a circular pattern with a mask size of 15 μm in diameter. At this time, for each exposure dose, the focus was moved toward the bottom of the spin-coated film with reference to the surface of the spin-coated film by 2 μm for exposure.

Next, the coating film formed on the sputtered Cu wafer was spray-developed by a developing machine (Model D-SPIN636, manufactured by Dainippon Screen Mfg. Co., Ltd.) using cyclopentanone and then with propylene glycol methyl ether acetate to obtain a round concave relief pattern of a polyamic acid ester. The development time for spray development was defined as 1.4 times the minimum time for the resin composition in the unexposed portion to develop in the above 10 μm spin-coated film.

Whether or not the round concave relief pattern having a mask size of 15 μm obtained above can be opened is determined to pass a pattern which satisfies both of the following criteria (I) and (II), and the thickness of the focus margin which gives the pass pattern was shown in the results.

(I) Area of the pattern openings is equal to ½ or more of the opening area of the corresponding pattern mask.

(II) The pattern cross-section does not demonstrate tailing and there is no occurrence of undercutting, swelling, or bridging.

(3) Sealing Material Deterioration Test

As an epoxy-based sealing material, the product named R4000 series manufactured by Nagase ChemteX Corporation was prepared. Next, the sealing material was spin-coated onto an aluminum sputtered silicon wafer so as to have a thickness of about 150 μm and thermally cured at 130° C., thereby curing the epoxy-based sealing material. On the epoxy-based cured film, the negative photosensitive resin composition prepared in each of the Examples and Comparative Examples was applied so as to have a final film thickness of 10 μm. The entire surface of the applied photosensitive resin composition was exposed under exposure condition of 300 mJ/cm$^2$. Thereafter, the cured film was thermally cured at 230° C. for 2 hours to fabricate a cured film of a first layer having a thickness of 10 μm.

A negative photosensitive resin composition used for forming a cured film of the first layer was applied onto the cured film of the first layer, and the entire surface thereof was exposed under the same conditions as in the fabrication of the cured film of the first layer, followed by thermal curing to fabricate a cured film of a second layer having a thickness of 10 μm.

A cross-section of the test piece after formation of the second layer of the cured film was cut by an FIB device (JIB-4000, manufactured by JEOL Ltd.), and then the degree of deterioration was evaluated by confirming the presence or absence of voids in the epoxy portion. Those with no voids were rated "Good", while those with even one void were rated "Poor".

(4) Test of Adhesion with Sealing Material

A pin was placed on a sample fabricated in the sealing material deterioration test, and an adhesion test was performed using a pull tester (Model Sebastian 5, manufactured by Quad Group Inc.). Specifically, the adhesion between the epoxy-based sealing material and the cured relief pattern made of the photosensitive resin composition prepared in each of the Examples and Comparative Examples was measured and evaluated according to the following criteria.

Evaluation:

Adhesion strength of 70 MPa or more Adhesion strength A

Adhesion strength of 50 MPa or more to less than 70 MPa Adhesion strength B

Adhesion strength of 30 MPa or more to less than 50 MPa Adhesion strength C

Adhesion strength of less than 30 MPa Adhesion strength D (5) Measurement of Dielectric Constant and Dielectric Loss Tangent Aluminum (Al) having a thickness of 100 nm was sputtered onto a 6-inch silicon wafer (having a thickness of 625±25 µm, manufactured by Fujimi Electronics Industry Co., Ltd.) using a sputtering device (Model L-440S-FHL, manufactured by CANON ANELVA CORPORATION) to prepare a sputtered Al wafer substrate.

A negative photosensitive resin composition was spin-coated on the sputtered Al wafer substrate using a spin coating developer (Model D-Spin60A, manufactured by SOKUDO Co., Ltd.), and then heat-dried at 110° C. for 180 seconds to form a spin-coated film having a thickness of 10 µm±0.2 µm. Thereafter, the entire surface was exposed with ghi-line at an exposure dose of 600 mJ/cm² using an aligner (PLA-501F, manufactured by Canon Inc.) and then subjected to a heat-curing treatment under a nitrogen atmosphere at 230° C. for 2 hours using a vertical curing furnace (Model name VF-2000B, manufactured by Koyo Lindberg, Co.) to fabricate a cured film. This cured film was cut into a length of 80 mm and a width of 60 mm using a dicing saw (Model name DAD-2H/6T, manufactured by DISCO), immersed in an aqueous 10% hydrochloric acid solution and peeled off from the silicon wafer to obtain a film sample.

The relative permittivity and dielectric loss tangent at 10 GHz of the film sample were calculated by the resonator perturbation method. The details of the measurement method are as follows.

(Measurement Method)

Perturbation type split cylinder resonator method (Device Configuration)

Network analyzer: PNA Network analyzer E5224B (manufactured by Agilent Technologies)

Split cylinder resonator: CR-710 (manufactured by KANTO Electronic Application and Development Inc.)

Measurement frequency: About 10 GHz (6) IR Measurement

In the IR measurement, the film obtained in (5) above was measured by the ATR method within a range of 700 to 4,000 cm$^{-1}$ with 50 scans using Scientific Nicolet iN10. By determining an absorption peak value near 1,380 cm$^{-1}$ and an absorption peak value near 1,500 cm$^{-1}$, the value of (absorption peak value near 1,380 cm$^{-1}$)/(absorption peak value near 1,500 cm$^{-1}$) was calculated.

Each peak value was set as the largest peak within ±10 cm$^{-1}$ of 1,380 cm$^{-1}$ and 1,500 cm$^{-1}$.

(7) Measurement of Weight Loss Ratio

A photosensitive resin composition was rotatably coated onto a 6-inch silicon wafer so as to have a thickness of about 10 µm after curing, prebaked on a hot plate at 110° C. for 180 seconds and then heated under a nitrogen atmosphere at 230° C. for 2 hours using a temperature-increasing programmed curing furnace (Model VF-2000, manufactured by Koyo Lindberg, Co.) to obtain a cured polyimide coating film. The thickness was measured by a film thickness measuring device Lambda Ace (manufactured by Dainippon Screen Mfg. Co., Ltd.). When the polyimide coating film thus obtained is scraped off and the temperature is raised from room temperature at 10° C./min using a thermogravimetric measuring device (TGA-50, manufactured by Shimadzu Corporation), the weight loss ratio is calculated by the following formula, wherein the weight of the film when it reaches 230° C. is $W_{230}$ and the weight of the film when it reaches 350° C. is $W_{350}$.

Weight loss ratio (%)=$(W_{230}-W_{350})\times 100/W_{230}$ (8) Calculation of Proportion Derived from R1 and R2 in Weight Loss Component A photosensitive resin composition was rotatably coated onto a 6-inch silicon wafer so as to have a thickness of about 10 µm after curing, prebaked on a hot plate at 110° C. for 180 seconds and then heated under a nitrogen atmosphere at 230° C. for 2 hours using a temperature-increasing programmed curing furnace (Model VF-2000, manufactured by Koyo Lindberg, Co.) to obtain a cured polyimide coating film. The polyimide coating film thus obtained was taken out in a strip shape, and thermal desorption GC/MS measurement was performed.

The sum of the areas of all peaks in the heat-desorbed GC/MS chromatogram, excluding $CO_2$ and $H_2O$, was taken as 100%, and the proportion of the peak areas derived from R1 and R2 was calculated. The details of the measurement method are as follows.

(Pyrolysis)

Measuring device: FRONTIER LAB PY2020iD (manufactured by Frontier Laboratories Ltd.)

Thermal desorption condition: 350° C.×30 minutes (GC/MS)

Measurement device: Agilent 6890/JEOL AM-SUN

Column: DB-1 (0.25 mm i.d.×30 m)

Column temperature: 300° C.×12 minutes (temperature rise rate of 20° C./min)

Column flow rate: 1.0 mL/min

Injection port temperature: 300° C.

Interface temperature: 300° C.

Ionization method: Electron ionization method

Sample amount: About 0.1 mg (9) Calculation of Amount of Radicals Generated after Exposure of Initiator DMSO was dissolved in solvent so that the concentration of the initiator was 100 µM and 5,5-dimethyl-1-pyrroline-N-oxide (DMPO) as a spin trap agent was 100 mM. In a 2 mmΦ quartz sample tube, 50 µl of the solution was charged, and immediately after irradiation with UV, ESR measurement was performed under the following conditions. The following filter was used in the irradiation with the UV lamp. Details are shown below.

(ESR Measurement Conditions)

Device: E500, manufactured by Bruker Corporation

Microwave frequency: 9.87 GHz (X-band)

Microwave power: 10.0 mW

Central magnetic field: 3517 G

Sweep magnetic field range: 120 G

Modulation frequency: 100 kHz

Modulated magnetic field amplitude: 1.0 G

Measurement temperature: 25° C.

Sweep time: 30 s

Total number of times: 4 times (UV Exposure Conditions)

Equipment: L9566-01A, manufactured by Hamamatsu Photonics K.K.

Specification filter: A9616-05

Irradiation time: 1 s

Output irradiation intensity: 40%

Irradiation distance: 24 mm

Irradiation area: 0.4 cm²

<Production Example 1> (Synthesis of (A) Polyimide Precursor (Polymer A-1))

155.1 g of 4,4'-oxydiphthalic dianhydride (ODPA) was charged in a 2 L volume separable flask, 134.0 g of 2-hydroxyethyl methacrylate (HEMA) and 400 ml of γ-butyrolactone were added, and then 79.1 g of pyridine was added while stirring at room temperature to obtain a reaction mixture. After completion of heating due to the reaction, the reaction mixture was allowed to cool to room temperature and left to stand for 16 hours.

Next, under ice cooling, a solution of 206.3 g of dicyclohexylcarbodiimide (DCC) dissolved in 180 ml of γ-butyrolactone was added thereto over 40 minutes while stirring, followed by the addition of a suspension of 175.9 g of 2,2-bis{4-(4-aminophenoxy)phenyl}propane (BAPP) suspended in 350 ml of γ-butyrolactone over 60 minutes while stirring. After additional stirring for 2 hours at room temperature, 30 ml of ethyl alcohol was added thereto, and after stirring for 1 hour, 400 ml of γ-butyrolactone was the added. The precipitate formed in the reaction mixture was removed by filtration to obtain a reaction solution.

The reaction solution thus obtained was added to 3 liters of ethyl alcohol to produce a precipitate composed of a crude polymer. The crude polymer thus produced was collected by filtration and then dissolved in 1.5 liters of tetrahydrofuran to obtain a crude polymer solution. The crude polymer solution thus obtained was added dropwise to 28 liters of water to precipitate a polymer, and the precipitate thus obtained was collected by filtration, followed by vacuum drying to obtain a powdery polymer A-1.

The weight-average molecular weight (Mw) of this polymer A-1 was measured and found to be 22,000, and the imide group concentration was 19.4%.

<Production Example 2> (Synthesis of Polyimide Precursor (Polymer A-2))

The reaction was performed in the same manner as in the method mentioned in Production Example 1, except that 169.9 g of bis{4-(4-aminophenoxy)phenyl}ketone was used in place of 175.9 g of BAPP in Production Example 1, and a polymer A-2 was obtained thereby.

The weight-average molecular weight (Mw) of this polymer A-2 was measured and found to be 21,000, and the imide group concentration was 19.9%.

<Production Example 3> (Synthesis of Polyimide Precursor (Polymer A-3))

The reaction was performed in the same manner as in the method mentioned in Production Example 1, except that 260.2 g of 4,4'-(4,4'-isopropylidenediphenoxy) acid anhydride was used in place of 155.1 g of ODPA in Production Example 1, and a polymer A-3 was obtained thereby.

The weight-average molecular weight (Mw) of this polymer A-3 was measured and found to be 26,000, and the imide group concentration was 15.0%.

<Production Example 4> (Synthesis of Polyimide Precursor (Polymer A-4))

The reaction was performed in the same manner as in the method mentioned in Production Example 1, except that 260.2 g of 4,4'-(4,4'-isopropylidenediphenoxy) acid anhydride was used in place of 155.1 g of ODPA and 169.9 g of bis{4-(4-aminophenoxy)phenyl}ketone was used in place of 175.9 g of BAPP in Production Example 2, and a polymer A-4 was obtained thereby.

The weight-average molecular weight (Mw) of this polymer A-4 was measured and found to be 25,000, and the imide group concentration was 15.3%.

<Production Example 5> (Synthesis of Polyimide Precursor (Polymer A-5))

The reaction was performed in the same manner as in the method mentioned in Production Example 1, except that 77.6 g of ODPA and 130.1 g of 4,4'-(4,4'-isopropylidenediphenoxy) acid anhydride were used in place of 155.1 g of ODPA in Production Example 1, and a polymer A-5 was obtained thereby.

The weight-average molecular weight (Mw) of this polymer A-5 was measured and found to be 24,000, and the imide group concentration was 17.0%.

<Production Example 6> (Synthesis of Polyimide Precursor (Polymer A-6))

The reaction was performed in the same manner as in the method mentioned in Production Example 1, except that 73.6 g of BPDA and 130.1 g of 4,4'-(4,4'-isopropylidenediphenoxy) acid anhydride were used in place of 155.1 g of ODPA in Production Example 1, and a polymer A-6 was obtained thereby.

The weight-average molecular weight (Mw) of this polymer A-6 was measured and found to be 24,000, and the imide group concentration was 17.1%.

Production Example 7

The reaction was performed in the same manner as in the method mentioned in Production Example 1, except that 148.43 g of hydroxypropyl methacrylate was used in place of 134.0 g of HEMA in Production Example 1, and a polymer A-7 was obtained thereby.

The weight-average molecular weight (Mw) of this polymer A-7 was measured and found to be 24,000, and the imide group concentration was 19.4%.

Production Example 8

The reaction was performed in the same manner as in the method mentioned in Production Example 1, except that 162.86 g of hydroxybutyl methacrylate was used in place of 134.0 g of HEMA in Production Example 1, and a polymer A-7 was obtained thereby.

The weight-average molecular weight (Mw) of this polymer A-8 was measured and found to be 26,000, and the imide group concentration was 19.4%.

Production Example 9

The reaction was performed in the same manner as in the method mentioned in Production Example 1, except that 187.92 g of 2,2-bis[4-(4-aminophenoxy)-3-methylphenyl]propane was used in place of 175.9 g of BAPP in Production Example 1, a polymer A-9 was obtained.

The weight-average molecular weight (Mw) of this polymer A-9 was measured and found to be 22,000, and the imide group concentration was 18.7%.

Production Example 10

The reaction was performed in the same manner as in the method mentioned in Production Example 1, except that 185.32 g of bis{4-(4-aminophenoxy)phenyl}sulfone was used in place of 175.9 g of BAPP in Production Example 1, and a polymer A-10 was obtained thereby.

The weight-average molecular weight (Mw) of this polymer A-10 was measured and found to be 23,000, and the imide group concentration was 18.9%.

Production Example 11

The reaction was performed in the same manner as in the method mentioned in Production Example 1, except that 222.15 g of 2,2-bis{4-(4-aminophenoxy)phenyl}hexafluoropropane was used in place of 175.9 g of BAPP in Production Example 1, and a polymer A-11 was obtained thereby.

The weight-average molecular weight (Mw) of this polymer A-11 was measured and found to be 23,000, and the imide group concentration was 16.9%.

Production Example 12

The reaction was performed in the same manner as in the method mentioned in Production Example 1, except that 260.2 g of 4,4'-(4,4'-isopropylidenediphenoxy) acid anhydride was used in place of 155.1 g of ODPA and 143.29 g of 1,4-bis(4-aminophenoxy)-2,3,5-trimethylbenzene was used in place of 175.9 g of BAPP in Production Example 1, and a polymer A-12 was obtained thereby.

The weight-average molecular weight (Mw) of this polymer A-12 was measured and found to be 22,000, and the imide group concentration was 16.4%.

Production Example 13

The reaction was performed in the same manner as in the method mentioned in Production Example 1, except that 260.2 g of 4,4'-(4,4'-isopropylidenediphenoxy) acid anhydride was used in place of 155.1 g of ODPA and 173.34 g of 1,4-bis(4-aminophenoxy)-2,5-di-t-butylbenzene was used in place of 175.9 g of BAPP in Production Example 1, and a polymer A-13 was obtained thereby.

The weight-average molecular weight (Mw) of this polymer A-13 was measured and found to be 24,000, and the imide group concentration was 15.1%.

Production Example 14

The reaction was performed in the same manner as in the method mentioned in Production Example 1, except that 268.26 g of decanediolbis(trimellitic acid monoester acid anhydride) was used in place of 155.1 g of ODPA in Production Example 1, and a polymer A-14 was obtained thereby.

The weight-average molecular weight (Mw) of this polymer A-14 was measured and found to be 22,000, and the imide group concentration was 14.8%.

<Production Example 15> (Synthesis of Polyimide Precursor (Polymer A-15))

The reaction was performed in the same manner as in the method mentioned in Production Example 1, except that 239.2 g of 4,4'-bis(3,4-dicarboxyphenoxy)biphenyl acid dianhydride was used in place of 155.1 g of ODPA in Production Example 1, and a polymer A-15 was obtained thereby.

The weight-average molecular weight (Mw) of this polymer A-15 was measured and found to be 27,000, and the imide group concentration was 15.8%.

<Production Example 16> (Synthesis of Polyimide Precursor (Polymer A-16))

The reaction was performed in the same manner as in the method mentioned in Production Example 1, except that 147.1 g of BPDA was used in place of 155.1 g of ODPA in Production Example 1, and a polymer A-16 was obtained thereby.

The weight-average molecular weight (Mw) of this polymer A-16 was measured and found to be 23,000, and the imide group concentration was 19.9%.

<Production Example 17> (Synthesis of Polyimide Precursor (Polymer A-17))

The reaction was performed in the same manner as in the method mentioned in Production Example 1, except that 87.8 g of BAPP and 78.8 g of BAPB were used in place of 175.9 g of BAPP in Production Example 1, and a polymer A-17 was obtained thereby. The weight-average molecular weight (Mw) of this polymer A-17 was measured and found to be 24,000, and the imide group concentration was 20.0%.

<Production Example 18> (Synthesis of Polyimide Precursor (Polymer A-18))

The reaction was performed in the same manner as in the method mentioned in Production Example 1, except that 147.1 g of BPDA was used in place of 155.1 g of ODPA and 187.92 g of 2,2-bis[4-(4-aminophenoxy)-3-methylphenyl]propane was used in place of 175.9 g of BAPP in Production Example 1, and a polymer A-18 was obtained thereby.

The weight-average molecular weight (Mw) of this polymer A-18 was measured and found to be 25,000, and the imide group concentration was 19.1%.

Production Example 19

The reaction was performed in the same manner as in the method mentioned in Production Example 1, except that 85.8 g of diaminodiphenyl ether was used in place of 175.9 g of BAPP in Production Example 1, and a polymer A-19 was obtained thereby.

The weight-average molecular weight (Mw) of this polymer A-19 was measured and found to be 22,000, and the imide group concentration was 27.4%.

Photopolymerization initiator B1: 3-Cyclopentyl-1-[9-ethyl-6-(2-methylbenzoyl)-9H-carbazol-3-yl]propanone-1-(O-acetyloxime) (trade name: PBG-304, manufactured by CHANGZHOU TRONLY NEW ELECTRONIC MATERIALS CO., LTD.)

The amount of radicals generated was 27.9 µM.

Photopolymerization initiator B2: 1,2-Propanedione-3-cyclopentyl-1-[4-(phenylthio)phenyl]-2-(Obenzoyloxime) (trade name: PBG-305, manufactured by CHANGZHOU TRONLY NEW ELECTRONIC MATERIALS CO., LTD.) The amount of radicals generated was 8.0 µM.

Photopolymerization initiator B3: 1-[4-(Phenylthio)phenyl]-3-propane-1,2-dione-2-(0-acetyloxime) (trade name: PBG-3057, manufactured by CHANGZHOU TRONLY NEW ELECTRONIC MATERIALS CO., LTD.) The amount of radicals generated was 10.6 µM.

Photopolymerization initiator B4: 1-Phenyl-1,2-propane-dione-2-(O-ethoxycarbonyl)-oxime. The amount of radicals generated was 0.8 μM.

Solvent C1: γ-Butyrolactone
Solvent C2: Dimethyl sulfoxide (DMSO)
Solvent C3: N-methyl-2-pyrrolidone Other Components M4G: Tetraethylene glycol dimethacrylate Example 1

100 g of the polymer A-1 as the component (A) and 2 g of the photopolymerization initiator B1 as the component (B) were dissolved in a mixed solvent (weight ratio of 75:25) of γ-butyrolactone and DMSO, and then the amount of the solvent was adjusted so as to have the viscosity of about 35 poise to give a photosensitive resin composition solution.

This composition was evaluated by the method mentioned above. The evaluation results are shown in Table 2.

Examples 2 to 28, Comparative Example 2

Evaluation was performed in the same manner as in Example 1, except that the resin composition solution was prepared in the proportions shown in Table 1. The evaluation results are shown in Table 2.

TABLE 1

|  | Component (A) | | Component (B) | | Component (C) | | Component (C) | | Other comp- onents |
|---|---|---|---|---|---|---|---|---|---|
|  | Type | Addition amount | Type | Addition amount | Type | Addition amount | Type | Addition amount |  |
| Example 1 | A-1 | 100 g | B1 | 2 g | C1 | 225 g | C2 | 75 g | M4G: 2 g |
| Example 2 | A-1 | 100 g | B2 | 2 g | C1 | 225 g | C2 | 75 g |  |
| Example 3 | A-1 | 100 g | B3 | 2 g | C1 | 225 g | C2 | 75 g |  |
| Example 4 | A-2 | 100 g | B1 | 2 g | C1 | 225 g | C2 | 75 g |  |
| Example 5 | A-2 | 100 g | B2 | 2 g | C1 | 225 g | C2 | 75 g |  |
| Example 6 | A-3 | 100 g | B1 | 2 g | C1 | 225 g | C2 | 75 g |  |
| Example 7 | A-3 | 100 g | B2 | 2 g | C1 | 225 g | C2 | 75 g |  |
| Example 8 | A-3 | 100 g | B3 | 2 g | C1 | 225 g | C2 | 75 g |  |
| Example 9 | A-4 | 100 g | B1 | 2 g | C1 | 225 g | C2 | 75 g |  |
| Example 10 | A-4 | 100 g | B2 | 2 g | C1 | 225 g | C2 | 75 g |  |
| Example 11 | A-5 | 100 g | B1 | 2 g | C1 | 225 g | C2 | 75 g |  |
| Example 12 | A-5 | 100 g | B2 | 2 g | C1 | 225 g | C2 | 75 g |  |
| Example 13 | A-6 | 100 g | B1 | 2 g | C1 | 225 g | C2 | 75 g |  |
| Example 14 | A-6 | 100 g | B2 | 2 g | C1 | 225 g | C2 | 75 g |  |
| Example 15 | A-6 | 100 g | B3 | 2 g | C1 | 225 g | C2 | 75 g |  |
| Example 16 | A-7 | 100 g | B2 | 2 g | C1 | 225 g | C2 | 75 g |  |
| Example 17 | A-8 | 100 g | B2 | 2 g | C1 | 225 g | C2 | 75 g |  |
| Example 18 | A-9 | 100 g | B2 | 2 g | C1 | 225 g | C2 | 75 g |  |
| Example 19 | A-9 | 100 g | B3 | 2 g | C1 | 225 g | C2 | 75 g |  |
| Example 20 | A-10 | 100 g | B2 | 2 g | C1 | 225 g | C2 | 75 g |  |
| Example 21 | A-11 | 100 g | B2 | 2 g | C1 | 225 g | C2 | 75 g |  |
| Example 22 | A-12 | 100 g | B2 | 2 g | C1 | 225 g | C2 | 75 g |  |
| Example 23 | A-13 | 100 g | B2 | 2 g | C1 | 225 g | C2 | 75 g |  |
| Example 24 | A-14 | 100 g | B2 | 2 g | C1 | 225 g | C2 | 75 g |  |
| Example 25 | A-15 | 100 g | B2 | 2 g | C1 | 225 g | C2 | 75 g |  |
| Example 26 | A-16 | 100 g | B3 | 2 g | C1 | 225 g | C2 | 75 g |  |
| Example 27 | A-17 | 100 g | B3 | 2 g | C1 | 225 g | C2 | 75 g |  |
| Example 28 | A-18 | 100 g | B3 | 2 g | C1 | 225 g | C2 | 75 g |  |
| Example 29 | A-1 | 100 g | B1 | 2 g | C1 | 225 g | C2 | 75 g |  |
| Comparative Example 1 | A-1 | 100 g | B4 | 2 g | C3 | 300 g | — | — | M4G: 10 g |
| Comparative Example 2 | A-19 | 100 g | B4 | 2 g | C3 | 300 g | — | — |  |

TABLE 2

|  | 1,380 cm$^{-1}$/ 1,500 cm$^{-1}$ | Weight loss ratio (%) | Proportion derived from R1 and R2 (%) | Focus margin | Dielectric constant | Dielectric loss tangent | Sealing material deterior- ation test | Sealing material adhesion test |
|---|---|---|---|---|---|---|---|---|
| Example 1 | 0.524 | 1.9 | 73 | 8 μm | 3.06 | 0.0080 | Good | A |
| Example 2 | 0.524 | 1.9 | 73 | 10 μm | 3.06 | 0.0080 | Good | A |
| Example 3 | 0.524 | 1.9 | 73 | 10 μm | 3.06 | 0.0080 | Good | A |
| Example 4 | 0.531 | 1.9 | 74 | 6 μm | 3.1 | 0.0083 | Good | B |
| Example 5 | 0.531 | 1.9 | 74 | 8 μm | 3.1 | 0.0083 | Good | B |
| Example 6 | 0.456 | 1.6 | 60 | 8 μm | 2.96 | 0.0075 | Good | A |
| Example 7 | 0.456 | 1.6 | 60 | 10 μm | 2.96 | 0.0075 | Good | A |
| Example 8 | 0.456 | 1.6 | 60 | 10 μm | 2.96 | 0.0075 | Good | A |
| Example 9 | 0.46 | 1.6 | 61 | 6 μm | 3.01 | 0.0078 | Good | B |
| Example 10 | 0.46 | 1.6 | 61 | 8 μm | 3.01 | 0.0078 | Good | B |
| Example 11 | 0.492 | 1.7 | 66 | 8 μm | 2.98 | 0.0078 | Good | A |
| Example 12 | 0.492 | 1.7 | 66 | 10 μm | 2.98 | 0.0078 | Good | A |
| Example 13 | 0.506 | 1.7 | 66 | 6 μm | 2.98 | 0.0079 | Good | A |

TABLE 2-continued

|  | 1,380 cm⁻¹/ 1,500 cm⁻¹ | Weight loss ratio (%) | Proportion derived from R1 and R2 (%) | Focus margin | Dielectric constant | Dielectric loss tangent | Sealing material deterioration test | Sealing material adhesion test |
|---|---|---|---|---|---|---|---|---|
| Example 14 | 0.506 | 1.7 | 66 | 8 μm | 2.98 | 0.0079 | Good | A |
| Example 15 | 0.506 | 1.7 | 66 | 8 μm | 2.98 | 0.0079 | Good | A |
| Example 16 | 0.509 | 1.7 | 71 | 8 μm | 3.041 | 0.0072 | Good | A |
| Example 17 | 0.496 | 1.4 | 69 | 6 μm | 3.022 | 0.0064 | Good | A |
| Example 18 | 0.509 | 1.8 | 71 | 12 μm | 3.02 | 0.0060 | Good | A |
| Example 19 | 0.509 | 1.8 | 71 | 12 μm | 3.02 | 0.0060 | Good | A |
| Example 20 | 0.513 | 1.9 | 71 | 4 μm | 3.1 | 0.0083 | Good | B |
| Example 21 | 0.472 | 1.7 | 66 | 4 μm | 2.91 | 0.0076 | Good | B |
| Example 22 | 0.553 | 1.7 | 64 | 4 μm | 3.06 | 0.0090 | Good | C |
| Example 23 | 0.520 | 1.6 | 60 | 4 μm | 2.98 | 0.0068 | Good | C |
| Example 24 | 0.426 | 1.5 | 60 | 6 μm | 2.92 | 0.0068 | Good | B |
| Example 25 | 0.449 | 1.6 | 62 | 6 μm | 2.96 | 0.0075 | Good | B |
| Example 26 | 0.538 | 1.9 | 74 | 4 μm | 3.06 | 0.0080 | Good | A |
| Example 27 | 0.533 | 1.9 | 74 | 6 μm | 3.06 | 0.0080 | Good | A |
| Example 28 | 0.518 | 1.8 | 72 | 6 μm | 3.02 | 0.0060 | Good | A |
| Example 29 | 0.524 | 2.1 | 73 | 6 μm | 3.08 | 0.0082 | Good | C |
| Comparative Example 1 | 0.524 | 1.9 | 73 | 0 μm | 3.13 | 0.0092 | Poor | D |
| Comparative Example 2 | 0.65 | 3.8 | 40 | 2 μm | 3.2 | 0.02 | Good | C |

As is apparent from Table 2, the Examples exhibit large focus margin, satisfactory adhesion to the sealing material (mold resin), and low dielectric constant, while sufficient results could not be obtained in the Comparative Examples.

Using the photosensitive resin composition prepared in each of the Examples and Comparative Examples, an antenna-integrated module in which a fan-out wafer-level chip-sized package-type semiconductor device and an antenna were integrated was fabricated. The photosensitive resin composition prepared in each of the Examples and Comparative Examples was used as an interlayer insulating film of a semiconductor device. The photosensitive resin composition prepared in each of the Examples and Comparative Examples was also used as an insulating member between the antenna and the ground (reference potential). Since the thickness of this insulating member affects radiation efficiency of the antenna, the thickness is set so as to obtain maximum radiation efficiency.

The antenna-integrated module was designed to operate at 300 GHz.

The reflection properties (electrical properties) were evaluated, and those having a deviation of less than 5 GHz from 300 GHz of the antenna alone were rated "B", those having a deviation of 5 GHz or more and less than 10 GHz were rated "C", and those having a deviation of 10 GHz or more were rated "D".

Here, the reflection properties mean the ratio of the amount of power reflected by the antenna and returned to the input port to the input power to the input port which inputs power to the antenna.

As a result, all of Examples 1 to 29 were rated "B", Comparative Example 1 was rated "C", and Comparative Example 2 was rated "D".

While the embodiments of the present invention have been described, the present invention is not limited thereto, and various other changes and modifications can be made without departing from the spirit and scope of the invention.

Examples of Second Invention

The present embodiment will be specifically described by way of the following Examples, but the present invention is not limited thereto. In the Examples, Comparative Examples, and Production Examples, physical properties of the polymer or the negative photosensitive resin composition were measured and evaluated in accordance with the following methods.

<Measurement and Evaluation Methods>

(1) Weight-Average Molecular Weight

The weight-average molecular weight (Mw) of each resin was measured using the gel permeation chromatography method (standard polystyrene conversion) under the following conditions.

Pump: JASCO PU-980
Detector: JASCO RI-930
Column Oven: JASCO CO-965, 40° C.
Columns: two serially connected Shodex KD-806M manufactured by Showa Denko K.K., or serially connected Shodex 805M/806M manufactured by Showa Denko K.K.
Standard Monodisperse Polystyrene: Shodex STANDARD SM-105 manufactured by Showa Denko K.K.
Mobile Phase: 0.1 mol/L LiBr/N-methyl-2-pyrrolidone (NMP)
Flow rate: 1 mL/min (2) Fabrication of Cured Relief Pattern on Cu Ti having a thickness of 200 nm and Cu having a thickness of 400 nm were sputtered in this order onto a 6-inch silicon wafer (having a thickness of 625±25 μm, manufactured by Fujimi Electronics Industry Co., Ltd.) using a sputtering device (Model L-440S-FHL, manufactured by CANON ANELVA CORPORATION). Thereafter, a negative photosensitive resin composition prepared by a method mentioned later was spin-coated on this wafer using a coater developer (Model D-Spin60A, manufactured by SOKUDO Co., Ltd.), and prebaked on a hot plate at 110° C. for 180 seconds to form a coating film having a thickness of about 7 μm. This coating film was irradiated using a test patterned mask with an energy of 500 mJ/cm² by a Prisma GHI (manufactured by Ultratech, Inc.). The coating was then spray-developed with a coater developer (Model D-Spin60A, manufactured by SOKUDO Co., Ltd.) using cyclopentanone as a developer, and rinsed with propylene glycol methyl ether acetate to obtain a relief pattern on Cu.

The wafer with a relief pattern formed on Cu was subjected to a heat treatment for 2 hours at the curing temperature mentioned in Table 3 using a temperature-increasing programmed curing furnace (Model VF-2000, manufactured by Koyo Lindberg, Co.) under a nitrogen atmosphere to obtain a cured relief pattern made of a resin having a thickness of about 4 to 5 μm thick on Cu.

(3) Resolution Evaluation of Cured Relief Pattern on Cu

The cured relief pattern obtained by the above method was observed under an optical microscope to determine the minimum openings pattern size. At this time, if the area of the openings of the obtained pattern was ½ or more of the corresponding pattern mask opening area, it was considered to be resolved, and the length of the mask opening side corresponding to the one having the smallest area among the resolved openings was defined as the resolution.

Those having a resolution of less than 10 μm were rated "Excellent", those having a resolution of 10 μm to less than 14 μm were rated "Good", those having a resolution of 14 μm to less than 18 μm were rated "Fair", and those having a resolution of 18 μm or more were rated "Poor"

(4) High Temperature Storage Test of Cured Relief Pattern on Cu and Subsequent Cu Surface Void Area Evaluation The wafer with a relief pattern formed on Cu was heated in air at 150° C. for 168 hours using a temperature-increasing programmed curing furnace (Model VF-2000, manufactured by Koyo Lindberg Co., Ltd.). Subsequently, the entire resin layer on the Cu was removed by plasma etching using a plasma surface treatment device (Model EXAM, manufactured by Shinko Seiki Co., Ltd.). The etching conditions were as follows.
Output: 133 W
Type and Flow Rate of Gas: $O_2$: 40 mL/min+$CF_4$: 1 mL/min.
Gas Pressure: 50 Pa
Mode: Hard mode
Etching time: 1800 seconds The Cu surface obtained by fully removing the resin layer was observed using an FE-SEM (Model S-4800, manufactured by Hitachi High-Technologies, Ltd.), and the area of voids occupying the surface of the Cu layer was calculated using image analysis software (A-zo-kun, manufactured by Asahi Kasei Co.). When the total area of voids at the time of evaluation of the negative photosensitive resin composition described in Comparative Example 1 was 100%, those having a total area ratio of voids of less than 50% were rated "Excellent", those having a total area ratio of 50% to less than 75% were rated "Good", those having a total area ratio of 75% to less than 100% were rated "Fair", and those having a total area ratio of 100% or more were rated "Poor".

(5) Evaluation of Chemical Resistance of Cured Relief Pattern (Polyimide Coating)

The cured relief pattern formed on Cu was immersed for 5 minutes in a resist stripping solution {manufactured by ATMI Co., product name ST-44, main components: 2-(2-aminoethoxy)ethanol, 1-cyclohexyl-2-pyrrolidone} which had been heated to 50° C., washed with running water for 1 minute, and air-dried. Thereafter, the film surface was visually observed with an optical microscope, and the chemical resistance was evaluated in accordance with the presence or absence of damage due to the chemical solution, such as cracks, and/or the rate of change in the film thickness after the chemical solution process. As an evaluation criterion, those in which cracks or the like did not occur and the film thickness change rate was 10% or less based on the film thickness before the chemical immersion were rated "Excellent", those in which the film thickness change rate was more than 10% to 15% were rated "Good", those in which the film thickness change rate was more than 15% to 20% were defined as "Fair", and those in which cracks occurred or those in which the film thickness change rate was more than 20% were rated "Poor".

(6) Evaluation of Adhesion with Sealing Material

As an epoxy-based sealing material, the product named R4000 series manufactured by Nagase ChemteX Corporation was prepared. The sealing material was spin-coated onto an aluminum sputtered silicon wafer so as to have a thickness of about 150 microns, and heat-cured at 130° C., thereby curing the epoxy-based sealing material. On the above epoxy-based cured film, the photosensitive resin composition prepared in each of the Examples and the Comparative Examples was applied so as to have a final film thickness of 10 microns. The entire surface of the applied photosensitive resin composition was exposed under the exposure condition of 500 mJ/$cm^2$. Thereafter, the cured film was thermally cured at 180° C. for 2 hours to form a cured film of a first layer having a thickness of 10 microns.

A photosensitive resin composition used in forming a cured film of the first layer was applied onto the cured film of the first layer, and the entire surface thereof was exposed under the same conditions as in the fabrication of the cured film of the first layer, and then thermally cured to fabricate a cured film of a second layer having a thickness of 10 microns.

The epoxy resin was applied onto the photosensitive resin cured film of the sample and a pin was placed thereon, and then an adhesion test was performed using a pull tester (Model Sebastian 5, manufactured by Quad Group Co., Ltd.,). The evaluation was performed in accordance with the following criteria.
Evaluation:
Adhesion strength of 70 MPa or more Adhesion strength "Excellent"
Adhesion strength of 50 MPa to less than 70 MPa Adhesion strength "Good"
Adhesion strength of 30 MPa to less than 50 MPa Adhesion strength "Fair"
Adhesion strength of less than 30 MPa Adhesion strength "Poor"

Production Example 1: Synthesis of Polymer A-1 as (A) Polyimide Precursor 155.1 g of 4,4'-oxydiphthalic dianhydride (ODPA) was charged in a 2 L volume separable flask, and 131.2 g of 2-hydroxylethyl methacrylate (HEMA) and 400 mL of γ-butyrolactone were charged, and then 81.5 g of pyridine was added while stirring at room temperature to obtain a reaction mixture. After completion of heating due to the reaction, the reaction mixture was allowed to cool to room temperature and left to stand for 16 hours.

Next, under ice cooling, a solution of 206.3 g of dicyclohexylcarbodiimide (DCC) dissolved in 180 mL of γ-butyrolactone was added thereto over 40 minutes while stirring, followed by the addition of a suspension of 93.0 g of 4,4'-oxydianiline (ODA) suspended in 350 mL of γ-butyrolactone over 60 minutes while stirring. After additional stirring for 2 hours at room temperature, 30 mL of ethyl alcohol was added thereto, and after stirring for 1 hour, 400 mL of γ-butyrolactone was added. The precipitate formed in the reaction mixture was removed by filtration to obtain a reaction solution.

The reaction solution thus obtained was added to 3 L of ethyl alcohol to produce a precipitate composed of a crude polymer. The crude polymer thus produced was collected by filtration and then dissolved in 1.5 L of tetrahydrofuran to obtain a crude polymer solution. The crude polymer solution thus obtained was added dropwise to 28 L of water to precipitate a polymer, and the precipitate thus obtained was collected by filtration, followed by vacuum drying to obtain a powdery polymer (polymer A-1). When the molecular weight of the polymer (A-1) was measured by gel permeation chromatography (standard polystyrene conversion), the weight-average molecular weight (Mw) was 20,000.

Production Example 2: Synthesis of Polymer A-2 as (A) Polyimide Precursor

The reaction was performed in the same manner as in the method mentioned in Production Example 1, except that 147.1 g of 3,3',4,4'-biphenyltetracarboxylic dianhydride (BPDA) was used in place of 155.1 g of 4,4'-oxydiphthalic dianhydride (ODPA) of Production Example 1, and a polymer (A-2) was obtained. When the molecular weight of the polymer (A-2) was measured by gel permeation chromatography (standard polystyrene conversion), the weight-average molecular weight (Mw) was 22,000.

Production Example 3: Synthesis of Polymer A-3 as (A) Polyimide Precursor

The reaction was performed in the same manner as in the method mentioned in Production Example 1, except that 50.2 g of p-phenylenediamine was used in place of 93.0 g of 4,4'-oxydianiline (ODA) of Production Example 1, and a polymer (A-3) was obtained. When the molecular weight of the polymer (A-3) was measured by gel permeation chromatography (standard polystyrene conversion), the weight-average molecular weight (Mw) was 19,000.

Production Example 4: Synthesis of Polymer A-4 as (A) Polyimide Precursor

The reaction was performed in the same manner as in the method mentioned in Production Example 1, except that 4,4'-oxydiphthalic dianhydride of Production Example 1 was changed to fluorene acid dianhydride (229.2 g) and 4,4'-oxydianiline was changed to 2,2'-bis(trifluoromethyl) benzidine (TFMB) (148.5 g), and a polymer (A-4) was obtained. When the molecular weight of the polymer (A-4) was measured by gel permeation chromatography (standard polystyrene conversion), the weight-average molecular weight (Mw) was 12,000.

Production Example 5: Synthesis of Polymer A-5 as (A) Polyimide Precursor

The reaction was performed in the same manner as in the method mentioned in Production Example 1, except that 98.6 g of 2,2'-dimethylbiphenyl-4,4'-diamine (m-TB) was used in place of 93.0 g of 4,4'-oxydianiline (ODA) of Production Example 1, and a polymer (A-5) was obtained. When the molecular weight of the polymer (A-5) was measured by gel permeation chromatography (standard polystyrene conversion), the weight-average molecular weight (Mw) was 21,000.

Production Example 6: Synthesis of (E) Thermal Base Generator E-1

In a 1 L recovery flask, 100 g of diethylene glycol bis(3-aminopropyl)ether (manufactured by Tokyo Chemical Industry Co., Ltd.) and 100 g of ethanol were charged, followed by mixing and stirring with a stirrer to give a uniform solution, which was cooled to 5° C. or lower with ice water. To this, a solution prepared by dissolving 215 g of di-tert-butyl dicarbonate (manufactured by Tokyo Chemical Industry Co., Ltd.) in 120 g of ethanol was added dropwise using a dropping funnel. At this time, the solution was added dropwise while adjusting the dropping rate so that the reaction liquid temperature was maintained at 50° C. or lower. Two hours after completion of the dropwise addition, the reaction solution was concentrated under reduced pressure at 50° C. for 3 hours to obtain a target compound E-1.

Example 1

A negative photosensitive resin composition was prepared by the following method using the polymer A-1, and the composition thus prepared was evaluated. 100 g of the polymer A-1 as the polyimide precursor (A) and 3 g of 1-phenyl-1,2-propanedione-2-(O-ethoxycarbonyl)-oxime (corresponding to the photopolymerization initiator B-1) as the photopolymerization initiator (B) were dissolved in (C) KBM-403 (1.5 g) and 150 g of (D) an organic solvent γ-butyrolactone (hereinafter referred to as GBL). The viscosity of the solution thus obtained was adjusted to about 30 poise by further adding a small amount of GBL to obtain a negative photosensitive resin composition. The composition was evaluated according to the method mentioned above. The results are shown in Table 3.

Examples 2 to 13, Comparative Examples 1 to 3

The same negative photosensitive resin composition as in Example 1 was prepared, except that the components and compounding ratios were as shown in Table 3, and the same evaluation as in Example 1 was performed. The results are shown in Table 3. The compounds mentioned in Table 3 are as follows.
B-1: 1-Phenyl-1,2-propanedione-2-(O-ethoxycarbonyl)-oxime
C-1: 3-Glycidoxypropyltrimethoxysilane (KBM-403)
C-2: N-phenyl-3-aminopropyltrimethoxysilane (KBM-573)
C-3: 3-Ureidopropyltriethoxysilane (KBE-585)
C-4: 3-Isocyanatepropyltriethoxysilane (KBE-9007)
C-5: 3-Aminopropyltrimethoxysilane (KBM-903)
D-1: γ-Butyrolactone (hereinafter referred to as GBL)
D-2: Dimethyl sulfoxide (DMSO)
E-1: Compound represented in Production Example 5
E-2: 1-(Tert-butoxycarbonyl)-4-hydroxypiperidine (manufactured by Tokyo Chemical Industry Co., Ltd.)

| | | Example 1 | Example 2 | Example 3 | Example 4 | Example 5 | Example 6 | Example 7 | Example 8 | Example 9 | Example 10 | Example 11 | Example 12 | Example 13 | Comparative Example 1 | Comparative Example 2 | Comparative Example 3 |
|---|---|---|---|---|---|---|---|---|---|---|---|---|---|---|---|---|---|
| (A) Polyimide precursor | A-1 | 100 | 100 | 100 | 100 | | | | | 50 | 100 | 100 | 100 | 100 | 100 | 100 | |
| | A-2 | | | | | 100 | | | | 50 | | | | | | | |
| | A-3 | | | | | | 100 | | | | | | | | | | |
| | A-4 | | | | | | | 100 | | | | | | | | | |
| | A-5 | | | | | | | | 100 | | | | | | | | 100 |
| (B) Photopolymerization initiator | B-1 | 3 | 3 | 3 | 3 | 3 | 3 | 3 | 3 | 3 | 3 | 3 | 3 | 3 | 3 | 3 | 3 |
| (C) Silane coupling agent | C-1 | 1.5 | | | | | | | | | | | | | | | |
| | C-2 | | 1.5 | | | | | | | | | | | | | | |
| | C-3 | | | 1.5 | | | | | | | | | | | | | |
| | C-4 | | | 1.5 | | | | | | | | | | | | | |
| | C-5 | | | | | 1.5 | 1.5 | 1.5 | 1.5 | 1.5 | 1.5 | 1.5 | 1.5 | 1.5 | | | |
| (D) Organic solvent | D-1 | 150 | 150 | 150 | 150 | 150 | 150 | 150 | 150 | 150 | 150 | 150 | 120 | 150 | 150 | 150 | 150 |
| | D-2 | | | | | | | | | | | | 30 | | | | |
| (E) Thermal base generator | E-1 | | | | | | | | | | 1 | 20 | | | | | |
| | E-2 | | | | | | | | | | | | | | | | |
| Curing temperature (° C.) | | 180 | 180 | 180 | 180 | 180 | 180 | 180 | 180 | 180 | 180 | 180 | 180 | 180 | 180 | 180 | 180 |
| Resolution | | Good | Good | Fair | Fair | Fair | Good | Fair | Good | Excellent | Good | Good | Good | Good | Poor | Poor | Poor |
| Evaluation of copper voids | | Fair | Good | Good | Fair | Fair | Fair | Fair | Fair | Excellent | Good | Good | Good | Good | Poor | Poor | Poor |
| Evaluation of chemical resistance | | Fair | Good | Good | Fair | Fair | Fair | Fair | Good | Good | Excellent | Excellent | Good | Excellent | Poor | Poor | Poor |
| Evaluation of adhesion to sealing material | | Good | Good | Good | Good | Good | Good | Fair | Good | Good | Good | Good | Excellent | Good | Fair | Fair | Poor |

(Unit: g)

As is apparent from Table 3, in Examples 1 to 13 including the silane coupling agent (C) having a specific structure represented by the above general formula (1), higher chemical resistance and resolution were obtained as compared with Comparative Examples 1 to 3 in which no silane coupling agent (C) is included. After the high temperature storage test, the generation of voids could be suppressed at the interface of the Cu layer in contact with the resin layer, and the adhesion to the sealing material was also satisfactory.

INDUSTRIAL APPLICABILITY

Industrial Applicability of First Invention

The photosensitive resin composition of the present invention can be suitably used, for example, in the field of photosensitive materials and is useful for producing electrical and electronic materials of semiconductor devices and multilayer wiring substrates.

Industrial Applicability of Second Invention

By using the negative photosensitive resin composition according to the present invention, a cured relief pattern having high chemical resistance and resolution can be obtained, and void generation on the surface of Cu can be suppressed. The present invention can be suitably used, for example, in the field of photosensitive materials and is useful for producing electrical and electronic materials of semiconductor devices and multilayer wiring substrates.

The invention claimed is:

1. A negative photosensitive resin composition comprising (A) a polyimide precursor having an unsaturated double bond in the side chain and (B) a photopolymerization initiator having an oxime structure, wherein (a largest absorption peak value within a range of ±10 cm$^{-1}$ of 1,380 cm$^{-1}$)/(a largest absorption peak value within a range of ±10 cm$^{-1}$ of 1,500 cm$^{-1}$) of the IR spectrum when the (A) is heat-cured at 230° C. is 0.1 to 0.56, and the amount of radicals generated when a 100 μM dimethyl sulfoxide solution of the (B) is irradiated at 100 mJ/cm$^2$ is 3.0 to 30.0 μM, wherein a repeating unit of the (A) contains a structure that includes four aromatic groups, and further comprises a structure represented by general formula (A1):

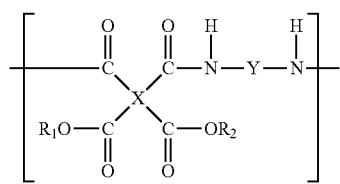

wherein X is a tetravalent organic group, Y is a divalent organic group, and $R_1$ and $R_2$ are each independently a hydrogen atom; a monovalent organic group represented by general formula (R1):

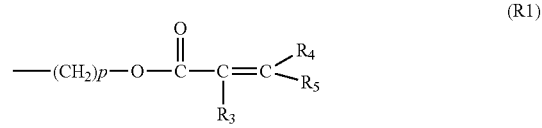

where in the general formula (R1), $R_3$, $R_4$, and $R_5$ are each independently a hydrogen atom or an organic group having 1 to 3 carbon atoms, and p is an integer selected from 2 to 10; or a saturated aliphatic group having 1 to 4 carbon atoms, in which both $R_1$ and $R_2$ are not simultaneously hydrogen atoms;

wherein a weight loss ratio of a cured film heat-cured at 230° C. for 2 hours when heated at 350° C. is 0.5 to 3.0%, and the proportion derived from R1 and R2 in the general formula (A1) in the weight loss component is 60 to 80%, wherein:

Y has a structure represented by the following general formula (Y1):

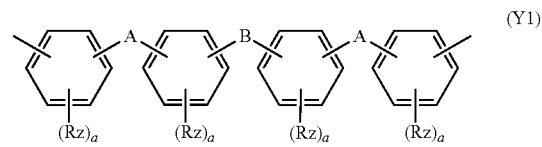

wherein Rz each independently represent a monovalent organic group having 1 to 10 carbon atoms which may have a halogen atom, a represents an integer of 0 to 4, A is each independently an oxygen atom or a sulfur atom, and B is at least one of the following four formulas:

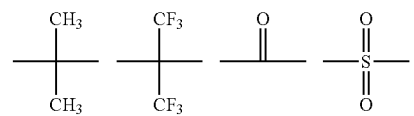

and/or

X in the general formula (A1) has a structure represented by the following general formula (X1):

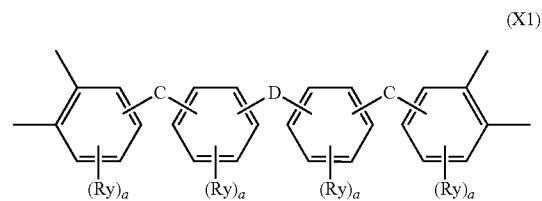

wherein Ry each independently represents a monovalent organic group having 1 to 10 carbon atoms which may have a halogen atom, a represents an integer of 0 to 4, C is at least one selected from the group consisting of a single bond, an ester bond, an oxygen atom, and a sulfur atom, and D is a single bond, or one in the following formula:

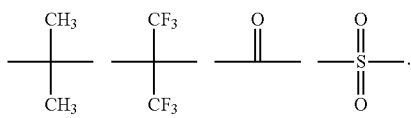

2. The negative photosensitive resin composition according to claim 1, wherein the (a largest absorption peak value within a range of ±10 cm$^{-1}$ of 1,380 cm$^{-1}$)/(a largest absorption peak value within a range of ±10 cm$^{-1}$ of 1,500 cm$^{-1}$) is 0.3 to 0.54.

3. The negative photosensitive resin composition according to claim 1, wherein the amount of radicals generated is 5.0 to 30.0 μM.

4. The negative photosensitive resin composition according to claim 1, wherein the amount of radicals generated is 8.0 to 30.0 μM.

5. The negative photosensitive resin composition according to claim 1, wherein the amount of radicals generated is 10.0 to 30.0 μM.

6. The negative photosensitive resin composition according to claim 1, further comprising (C) a solvent.

7. The negative photosensitive resin composition according to claim 1, wherein the weight-average molecular weight (Mw) of the (A) is 15,000 to 38,000.

8. The negative photosensitive resin composition according to claim 1, wherein, in the general formula (A1), Y is a structure represented by the following formula:

[Chemical Formula 5]

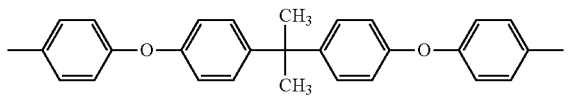

or the following formula:

[Chemical Formula 6]

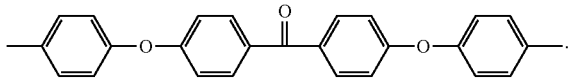

9. The negative photosensitive resin composition according to claim 1, wherein, in the general formula (X1), C is an oxygen atom or a sulfur atom, and D includes at least one in the following formula:

[Chemical Formula 9]

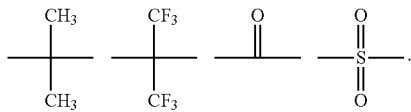

10. The negative photosensitive resin composition according to claim 1, wherein X is a structure represented by the following formula:

[Chemical Formula 10]

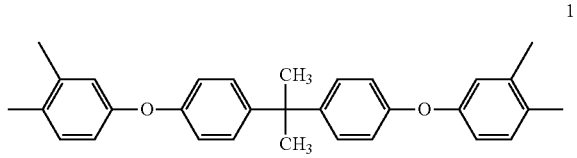

or the following formula:

[Chemical Formula 11]

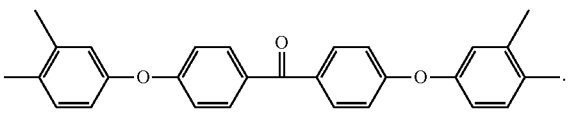

11. The negative photosensitive resin composition according to claim 1, wherein p in the general formula (R1) is 3 to 10.

12. A negative photosensitive resin composition comprising (A) a polyimide precursor having a structure represented by the following general formula (A1):

[Chemical Formula 12]

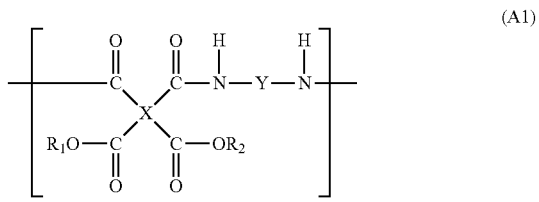

wherein X is a tetravalent organic group, Y is a divalent organic group, and R$_1$ and R$_2$ are each independently a hydrogen atom, a monovalent organic group represented by the following general formula (R1):

[Chemical Formula 13]

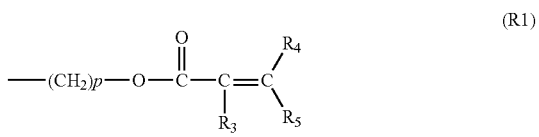

{(where in the general formula (R$_1$), R$_3$, R$_4$, and R$_5$ are each independently a hydrogen atom or an organic group having 1 to 3 carbon atoms, and p is an integer selected from 2 to 10), or a saturated aliphatic group having 1 to 4 carbon atoms, in which both R$_1$ and R$_2$ are not simultaneously hydrogen atoms}, and Y has a structure represented by the following general formula (Y1):

[Chemical Formula 14]

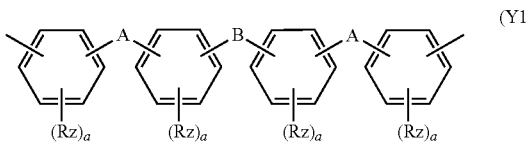

wherein Rz each independently represent a monovalent organic group having 1 to 10 carbon atoms which may have a halogen atom, a represents an integer of 0 to 4, A is an oxygen atom or a sulfur atom, and B is one in the following formula:

[Chemical Formula 15]

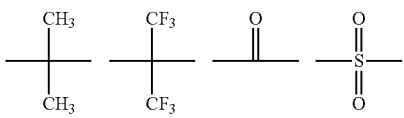

(B) a photopolymerization initiator having an oxime structure, and (C) a solvent, and X in the general formula (A1) has a structure represented by the following general formula (X1):

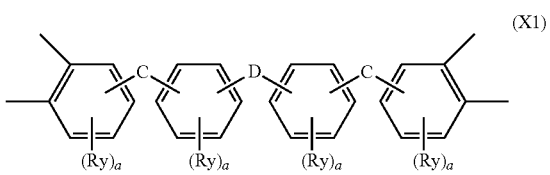

wherein Ry each independently represents a monovalent organic group having 1 to 10 carbon atoms which may have a halogen atom, a represents an integer of 0 to 4, C is at least one selected from the group consisting of a single bond, an ester bond, an oxygen atom, and a sulfur atom, and D is a single bond, or one in the following formula:

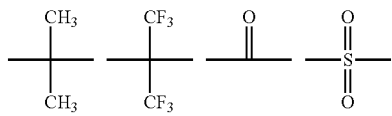

wherein a weight loss ratio of a cured film heat-cured at 230° C. for 2 hours when heated at 350° C. is 0.5 to 3.0%, and the proportion derived from R1 and R2 in the general formula (A1) in the weight loss component is 60 to 80%.

13. The negative photosensitive resin composition according to claim 12, wherein the weight-average molecular weight (Mw) of the (A) is 15,000 to 38,000.

14. The negative photosensitive resin composition according to claim 12, wherein, in the general formula (A1), Y is a structure represented by the following formula:

[Chemical Formula 16]

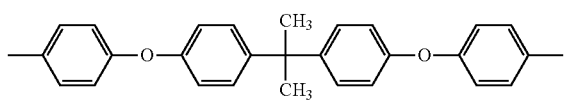

or the following formula:

[Chemical Formula 17]

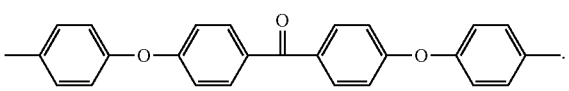

15. The negative photosensitive resin composition according to claim 12, wherein (a largest absorption peak value within a range of ±10 cm$^{-1}$ of 1,380 cm$^{-1}$)/(a largest absorption peak value within a range of ±10 cm$^{-1}$ of 1,500 cm$^{-1}$) of the IR spectrum when the (A) is heat-cured at 230° C. is 0.1 to 0.56, and the amount of radicals generated when a 100 μM dimethyl sulfoxide solution of the (B) is irradiated at 100 mJ/cm$^2$ is 3.0 to 30.0 μM.

16. A negative photosensitive resin composition comprising a polyimide precursor having a structure represented by the following general formula (A1):

[Chemical Formula 18]

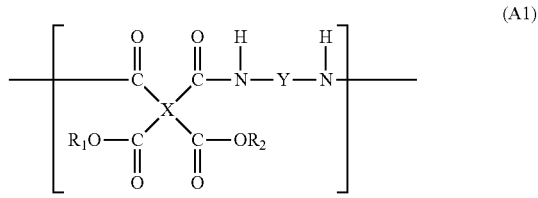

wherein X is a tetravalent organic group, Y is a divalent organic group, and R$_1$ and R$_2$ are each independently a hydrogen atom, a monovalent organic group represented by the following general formula (R1):

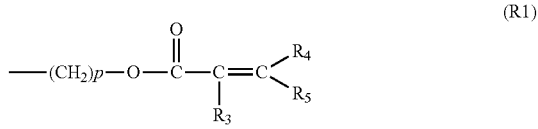

{(where in the general formula (R$_1$), R$_3$, R$_4$, and R$_5$ are each independently a hydrogen atom or an organic group having 1 to 3 carbon atoms, and p is an integer selected from 2 to 10), or a saturated aliphatic group having 1 to 4 carbon atoms, in which both R$_1$ and R$_2$ are not simultaneously hydrogen atoms}, and X has a structure represented by the following general formula (X1):

[Chemical Formula 20]

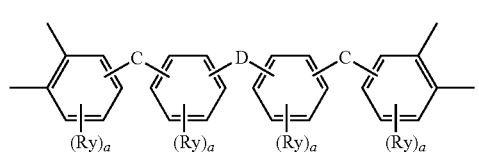

(X1)

wherein Ry each independently represent a monovalent organic group having 1 to 10 carbon atoms which may have a halogen atom, a represents an integer of 0 to 4, C is at least one selected from the group consisting of a single bond, an ester bond, an oxygen atom, and a sulfur atom, and D is a single bond, or one in the following formula:

[Chemical Formula 21]

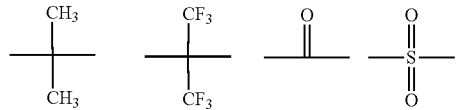

(B) a photopolymerization initiator having an oxime structure, and (C) a solvent, and Y has a structure represented by the following general formula (Y1):

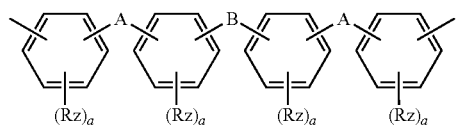

(Y1)

wherein Rz each independently represent a monovalent organic group having 1 to 10 carbon atoms which may have a halogen atom, a represents an integer of 0 to 4, A is each independently an oxygen atom or a sulfur atom, and B is at least one of the following four formulas:

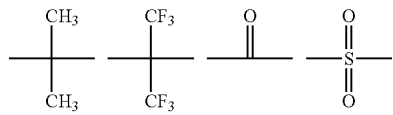

wherein a weight loss ratio of a cured film heat-cured at 230° C. for 2 hours when heated at 350° C. is 0.5 to 3.0%, and the proportion derived from R1 and R2 in the general formula (A1) in the weight loss component is 60 to 80%.

17. The negative photosensitive resin composition according to claim 16, wherein, in the general formula (X1), C is an oxygen atom or a sulfur atom, and D is one in the following formula:

[Chemical Formula 22]

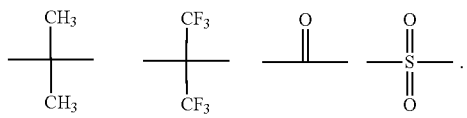

18. The negative photosensitive resin composition according to claim 16, wherein X is a structure represented by the following formula:

[Chemical Formula 23]

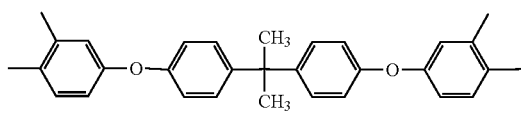

or the following formula:

[Chemical Formula 24]

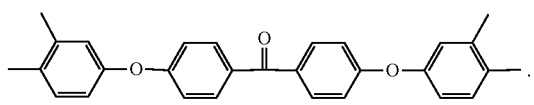

19. The negative photosensitive resin composition according to claim 16, wherein (a largest absorption peak value within a range of ±10 cm$^{-1}$ of 1,380 cm$^{-1}$)/(a largest absorption peak value within a range of ±10 cm$^{-1}$ of 1,500 cm$^{-1}$) of the IR spectrum when the (A) is heat-cured at 230° C. is 0.1 to 0.56, and the amount of radicals generated when a 100 μM dimethyl sulfoxide solution of the (B) is irradiated at 100 mJ/cm$^2$ is 3.0 to 30.0 μM.

20. The negative photosensitive resin composition according to claim 1, wherein the photopolymerization initiator having an oxime structure (B) has a structure represented by the following general formula (B):

[Chemical Formula 25]

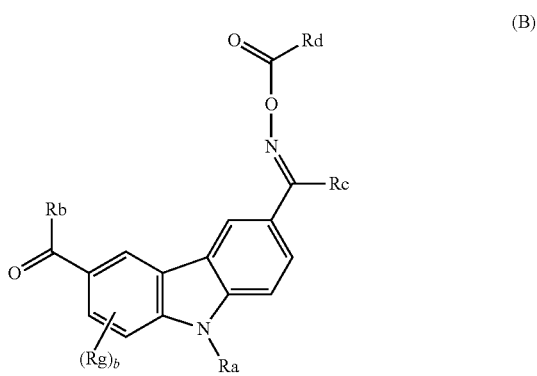

(B)

wherein Ra represents a monovalent organic group having 1 to 10 carbon atoms, Rb represents an organic group having 1 to 20 carbon atoms, Rc represents an organic group having 1 to 10 carbon atoms, Rd represents an organic group having 1 to 10 carbon atoms, b is an integer of 0 to 2, Rg represents an organic group having 1 to 4 carbon atoms, and a plurality of Rg may form a ring,
or the general formula (B1):

[Chemical Formula 26]

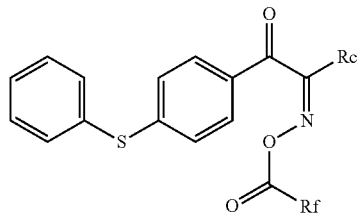
(B1)

wherein Re represents a monovalent organic group having 1 to 20 carbon atoms, and Rf represents an organic group having 1 to 10 carbon atoms.

21. The negative photosensitive resin composition according to claim 6, wherein the solvent (C) is at least one selected from the group consisting of y-butyrolactone, dimethyl sulfoxide, tetrahydrofurfuryl alcohol, ethyl acetoacetate, dimethyl succinate, dimethyl malonate, N,N-dimethylacetoacetamide, ¿-caprolactone, 1,3-dimethyl-2-imidazolidinone, 3-methoxy-N,N-dimethylpropanamide, and 3-butoxy-N,N-dimethylpropanamide.

22. The negative photosensitive resin composition according to claim 6, wherein the solvent (C) is at least two selected from the group consisting of y-butyrolactone, dimethyl sulfoxide, tetrahydrofurfuryl alcohol, ethyl acetoacetate, dimethyl succinate, dimethyl malonate, N,N-dimethylacetoacetamide, ¿-caprolactone, 1,3-dimethyl-2-imidazolidinone, 3-methoxy-N,N-dimethylpropanamide, and 3-butoxy-N,N-dimethylpropanamide.

23. The negative photosensitive resin composition according to claim 1, further comprising (D) a polymerization inhibitor.

24. A method for producing a polyimide, which comprises curing the negative photosensitive resin composition according to claim 1.

25. A method for producing a cured relief pattern, which comprises:
(1) applying the negative photosensitive resin composition according to claim 1 onto a substrate to form a photosensitive resin layer on the substrate,
(2) exposing the photosensitive resin layer,
(3) developing the exposed photosensitive resin layer to form a relief pattern, and
(4) heat-treating the relief pattern to form a cured relief pattern.

26. A semiconductor device comprising a cured relief pattern obtained by the method according to claim 25.

27. A cured film obtained by curing a polyimide precursor having a structure represented by the following general formula (A1):

[Chemical Formula 27]

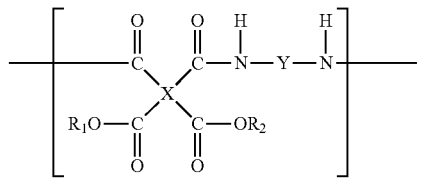
(A1)

wherein X is a tetravalent organic group, Y is a divalent organic group, and $R_1$ and $R_2$ are each independently a hydrogen atom, a monovalent organic group represented by the following general formula (R1):

[Chemical Formula 28]

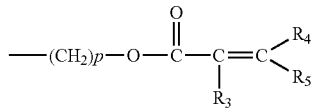
(R1)

{where in the general formula ($R_1$), $R_3$, $R_4$, and $R_5$ are each independently a hydrogen atom or an organic group having 1 to 3 carbon atoms, and p is an integer selected from 2 to 10}, or a saturated aliphatic group having 1 to 4 carbon atoms, in which both $R_1$ and $R_2$ are not simultaneously hydrogen atoms, wherein,
X and/or Y is a structure that includes four aromatic groups, wherein
the weight loss ratio of the cured film when heated at 350° C. is 0.5 to 3.0%, and the proportion derived from $R_1$ and $R_2$ in the general formula (A1) in the weight loss component is 60 to 80%,
wherein the weight loss ratio of the cured film heat-cured at 230° C. for 2 hours when heated at 350° C. is 0.5 to 3.0%, and the proportion derived from R1 and R2 in the general formula (A1) in the weight loss component is 60 to 80%, and
wherein:
Y has a structure represented by the following general formula (Y1):

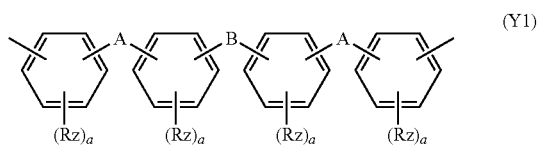
(Y1)

wherein Rz each independently represent a monovalent organic group having 1 to 10 carbon atoms which may have a halogen atom, a represents an integer of 0 to 4, A is each independently an oxygen atom or a sulfur atom, and B is at least one of the following four formulas:

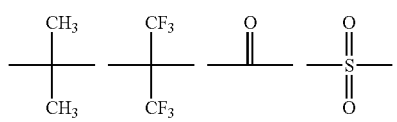

and/or

X in the general formula (A1) has a structure represented by the following general formula (X1):

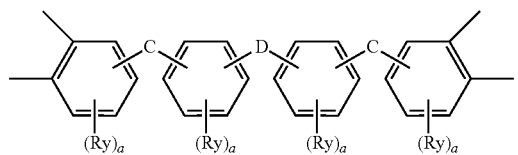

(X1)

wherein Ry each independently represents a monovalent organic group having 1 to 10 carbon atoms which may have a halogen atom, a represents an integer of 0 to 4, C is at least one selected from the group consisting of a single bond, an ester bond, an oxygen atom, and a sulfur atom, and D is a single bond, or one in the following formula:

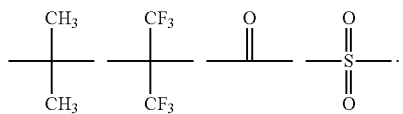

28. A cured film obtained by curing a polyimide precursor having a structure represented by the following general formula (A1);

[Chemical Formula 29]

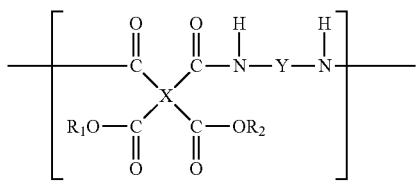

(A1)

wherein X is a tetravalent organic group, Y is a divalent organic group, and $R_1$ and $R_2$ are each independently a hydrogen atom, a monovalent organic group represented by the following general formula (R1):

[Chemical Formula 30]

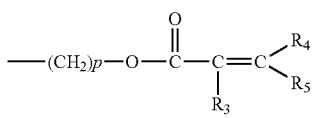

(R1)

{where in the general formula (R1), $R_3$, $R_4$, and $R_5$ are each independently a hydrogen atom or an organic group having 1 to 3 carbon atoms, and p is an integer selected from 2 to 10}, or a saturated aliphatic group having 1 to 4 carbon atoms, in which both $R_1$ and $R_2$ are not simultaneously hydrogen atoms, wherein, X and/or Y is a structure that includes four aromatic groups, wherein the imide group concentration of a polyimide in the cured film is 12.0% to 25.0%, and the weight loss ratio when the cured film is heated at 350° C. is 0.5 to 3.0%, and wherein:

Y has a structure represented by the following general formula (Y1):

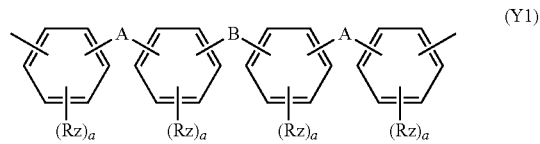

(Y1)

wherein Rz each independently represent a monovalent organic group having 1 to 10 carbon atoms which may have a halogen atom, a represents an integer of 0 to 4, A is each independently an oxygen atom or a sulfur atom, and B is at least one of the following four formulas:

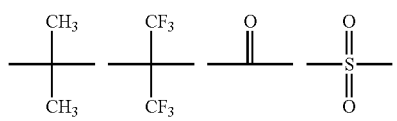

and/or

X in the general formula (A1) has a structure represented by the following general formula (X1):

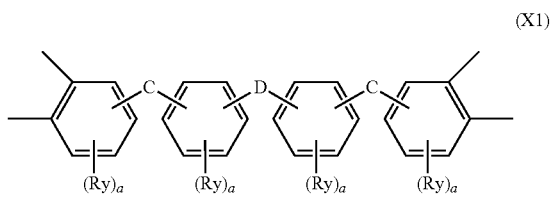

(X1)

wherein Ry each independently represents a monovalent organic group having 1 to 10 carbon atoms which may have a halogen atom, a represents an integer of 0 to 4, C is at least one selected from the group consisting of a single bond, an ester bond, an oxygen atom, and a sulfur atom, and D is a single bond, or one in the following formula:

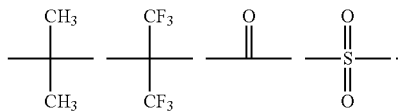

29. The cured film according to claim 27, wherein (a largest absorption peak value within a range of ±10 cm$^{-1}$ of 1,380 cm-1)/(a largest absorption peak value within a range of ±10 cm$^{-1}$ of 1,500 cm 1) of the IR spectrum is 0.3 to 0.54.

30. The cured film according to claim 27, wherein the dielectric loss tangent at 10 GHz is 0.001 to 0.009.

31. A method for producing a cured film obtained by curing a polyimide precursor having a structure represented by the following general formula (A1);

[Chemical Formula 31]

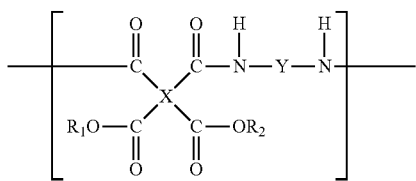
(A1)

wherein X is a tetravalent organic group, Y is a divalent organic group, and $R_1$ and $R_2$ are each independently a hydrogen atom, a monovalent organic group represented by the following general formula ($R_1$):

[Chemical Formula 32]

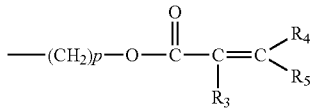
(R1)

{where in the general formula ($R_1$), $R_3$, $R_4$, and $R_5$ are each independently a hydrogen atom or an organic group having 1 to 3 carbon atoms, and p is an integer selected from 2 to 10}, or a saturated aliphatic group having 1 to 4 carbon atoms, in which both $R_1$ and $R_2$ are not simultaneously hydrogen atoms, wherein,
X and/or Y is a structure that includes four aromatic groups, wherein
the imide group concentration of a polyimide in the cured film is 12.0% to 25.0%, and the weight loss ratio when the cured film is heated at 350° C. is 0.5 to 3.0%, the method comprising:
at least forming a composition containing a photosensitive polyimide precursor into a film, and
curing by polyimidizing the film containing the polyimide precursor,
the curing including heating at 150 to 250° C.,
wherein the weight loss ratio of the cured film heat-cured at 230° C. for 2 hours when heated at 350° C. is 0.5 to 3.0%, and the proportion derived from R1 and R2 in the general formula (A1) in the weight loss component is 60 to 80%, and
wherein:
Y has a structure represented by the following general formula (Y1):

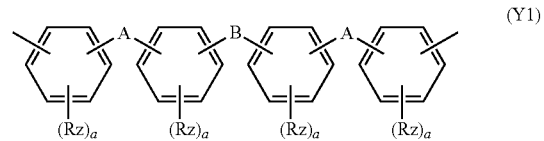
(Y1)

wherein Rz each independently represent a monovalent organic group having 1 to 10 carbon atoms which may have a halogen atom, a represents an integer of 0 to 4, A is each independently an oxygen atom or a sulfur atom, and B is at least one of the following four formulas:

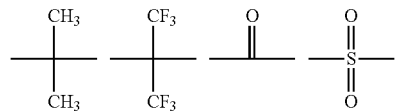

and/or
X in the general formula (A1) has a structure represented by the following general formula (X1):

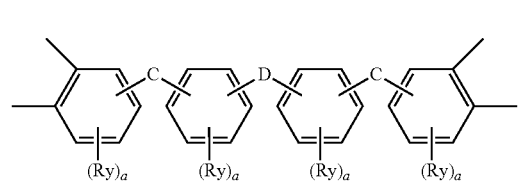
(X1)

wherein Ry each independently represents a monovalent organic group having 1 to 10 carbon atoms which may have a halogen atom, a represents an integer of 0 to 4, C is at least one selected from the group consisting of a single bond, an ester bond, an oxygen atom, and a sulfur atom, and D is a single bond, or one in the following formula:

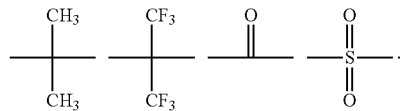

* * * * *

UNITED STATES PATENT AND TRADEMARK OFFICE
CERTIFICATE OF CORRECTION

PATENT NO. : 12,174,539 B2
APPLICATION NO. : 17/630387
DATED : December 24, 2024
INVENTOR(S) : T. Shimizu et al.

It is certified that error appears in the above-identified patent and that said Letters Patent is hereby corrected as shown below:

In the Claims

Column 88, Line 50 (Claim 16), please insert -- [Chemical Formula 19] --.
Column 91, Line 28 (Claim 21), please change "y-butyrolactone" to -- γ-butyrolactone --.
Column 91, Line 31 (Claim 21), please change "¿-caprolactone" to -- ε-caprolactone --.
Column 91, Line 37 (Claim 22), please change "y-butyrolactone" to -- γ-butyrolactone --.
Column 91, Line 40 (Claim 22), please change "¿-caprolactone" to -- ε-caprolactone --.
Column 94, Line 61 (Claim 29), please change "cm-1" to -- $cm^{-1}$ --.
Column 94, Line 62 (Claim 29), please change "cm 1" to -- $cm^{-1}$ --.

Signed and Sealed this
Fifteenth Day of April, 2025

Coke Morgan Stewart
*Acting Director of the United States Patent and Trademark Office*